(12) United States Patent
Nakanishi et al.

(10) Patent No.: US 6,627,497 B2
(45) Date of Patent: Sep. 30, 2003

(54) SEMICONDUCTOR INTEGRATED CIRCUIT DEVICE AND METHOD OF MANUFACTURING THE SAME

(75) Inventors: Naruhiko Nakanishi, Hachioji (JP); Nobuyoshi Kobayashi, Kawagoe (JP); Yuzuru Ohji, Hinodemachi (JP); Sinpei Iijima, Akishima (JP); Yasuhiro Sugawara, Akishima (JP); Misuzu Kanai, Machida (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/162,192

(22) Filed: Jun. 5, 2002

(65) Prior Publication Data
US 2002/0149044 A1 Oct. 17, 2002

Related U.S. Application Data

(62) Division of application No. 09/172,196, filed on Oct. 14, 1998.

(30) Foreign Application Priority Data

Oct. 14, 1997 (JP) .............................................. 9-280963

(51) Int. Cl.$^7$ ...................... H01L 21/8242; H01L 21/20
(52) U.S. Cl. ......................................... 438/253; 438/396
(58) Field of Search ............................... 257/295–310; 438/3, 239–254, 396–398

(56) References Cited

U.S. PATENT DOCUMENTS

| | | |
|---|---|---|
| 5,122,923 A | 6/1992 | Matsubara et al. |
| 5,504,041 A | 4/1996 | Summerfelt |
| 5,567,636 A | 10/1996 | Jones |
| 5,604,696 A | 2/1997 | Takaishi |
| 5,790,366 A | 8/1998 | Desu et al. |
| 5,837,593 A | 11/1998 | Park et al. |
| 6,004,839 A | 12/1999 | Hayashi et al. |
| 6,090,697 A | 7/2000 | Xing et al. |
| 6,200,847 B1 * | 3/2001 | Kishiro ........................ 438/240 |

OTHER PUBLICATIONS

Ta/sub2/O/sub5/ capacitors dielectric material for giga–bit DRAMs. Ohji, et al., Electron Devices Meeting, 1995 on pp. 111–1114, IEEE Catalog No. 95CH35810.

* cited by examiner

Primary Examiner—Cuong Quang Nguyen
(74) Attorney, Agent, or Firm—Antonelli, Terry, Stout & Kraus, LLP

(57) ABSTRACT

A semiconductor integrated circuit device including a memory cell comprising a memory cell selecting MISFET Qs formed on the main surface of a semiconductor substrate 1 and an information storage capacitor C that is connected in series to said memory cell selecting MISFET Qs, and that have a lower electrode 54, a capacitor insulator 58 and an upper electrode 59, wherein the lower electrode 54 is made of a conductive material containing ruthenium dioxide ($RuO_2$) as principle ingredient and the capacitor insulator 58 is made of crystalline tantalum pentoxide. Thus, the capacitance required for the memory cells of a 256 Mbits DRAM or those of a DRAM of a later generation can be secured.

30 Claims, 46 Drawing Sheets

Fig 38
(a)
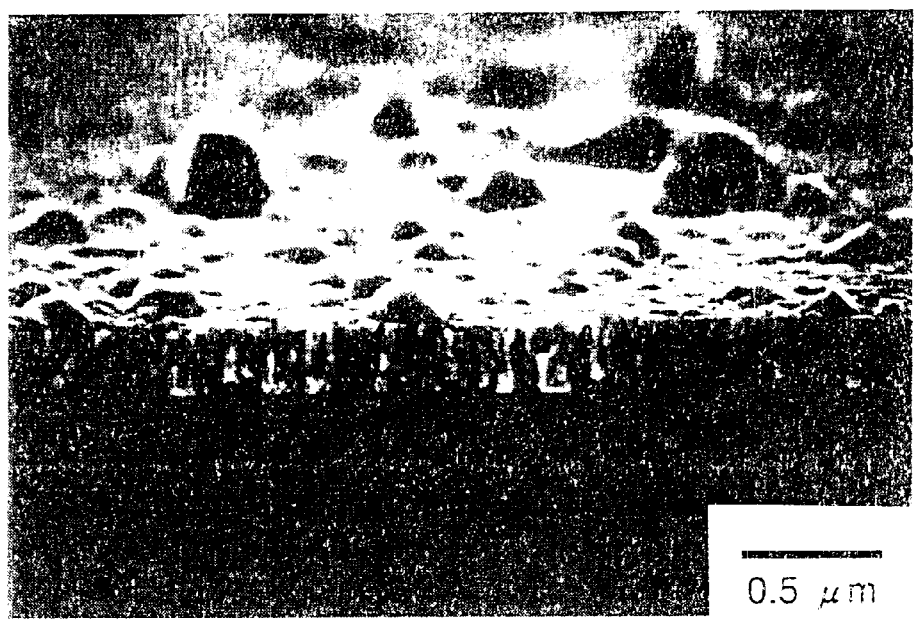
(b)
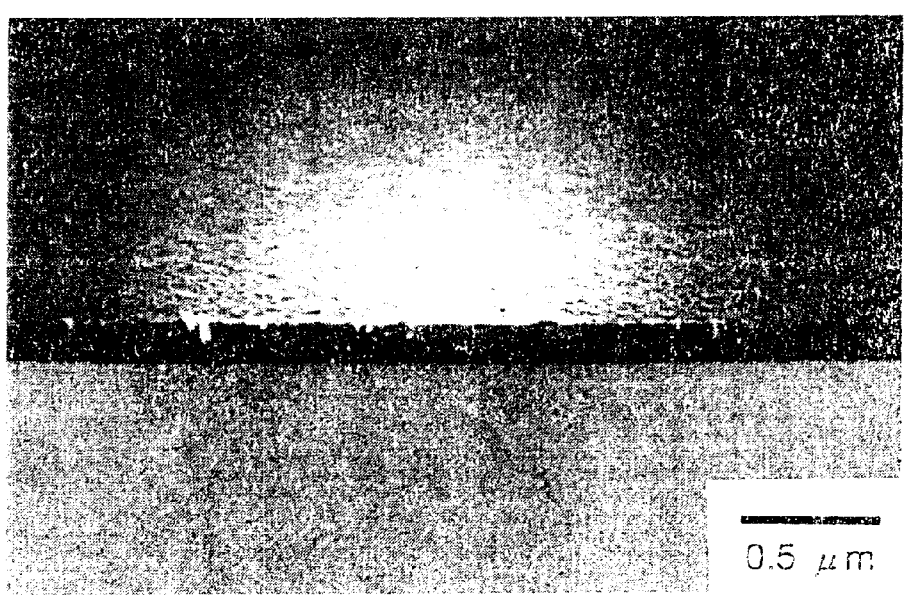

Carbon concentration in TaO film (%)

SEMICONDUCTOR INTEGRATED CIRCUIT DEVICE AND METHOD OF MANUFACTURING THE SAME

This application is a Divisional application Ser. No. 09/172,196, filed Oct. 14, 1998.

BACKGROUND OF THE INVENTION

1. Field of the Invention

This invention generally relates to a semiconductor integrated circuit device and a method of manufacturing the same and, more particularly, it relates to a technology that is effectively applicable to the manufacture of a semiconductor integrated circuit device in order to enhance the storage capacitance of DRAM (dynamic random access memory).

2. Description of the Prior Art

In a DRAM, the memory cells are disposed on the respective crossings of the word lines and the bit lines arranged in the form of matrix on the main surface of the semiconductor substrate, each memory cell comprising a MISFET (Metal Insulator Semiconductor Field Effect Transistor) to be used for selecting the memory cell and an information storage capacitor. The memory cell selecting MISFET is formed in an active region surrounded by a device isolation region and comprises as main components thereof a gate oxide film, a gate electrode integral with the corresponding word line and a pair of semiconductor regions constituting a source and a drain. The corresponding bit line is located above the memory cell selecting MISFET and electrically connected to either the source or the drain shared by the memory cell selecting MISFET and another memory cell selecting MISFET located adjacent to it. The information storage capacitor is also located above the memory cell selecting MISFET and electrically connected to the drain or the source not shared by the two MISFETs.

Japanese Patent Application Laid-Open No. 7-7084 discloses a DRAM having a so-called capacitor over bit line (COB) structure of arranging information storage capacitors above bit lines. In the disclosed DRAM, the lower electrodes (storage electrodes) of the information storage capacitors arranged above the bit lines are made to have a cylindrical profile to raise the surface area thereof in order to compensate the reduction in the stored electric charge (Cs) of the information storage capacitors given rise to by the extremely reduced size of the memory cells and the capacitor insulator and the upper electrode (plate electrode) of each memory cell is arranged above the information storage capacitor.

Japanese Patent Applications Laid-Open Nos. 64-42161 and 1-187847 disclose a technique of producing fine undulations on the surface of the lower electrodes of the information storage capacitors to raise the surface area thereof and secure the necessary storage capacitance by using poly-crystalline silicon for the lower electrodes and utilizing the phenomenon that the growth of granular poly-crystalline silicon depends on the surface condition of the under-layer in the initial stages of forming the poly-crystalline silicon by means of chemical vapor deposition (hereinafter referred to as CVD) or that the difference of the etching rate between boundary and bulk of the poly-crystalline silicon.

Finally, Japanese Patent Application Laid-Open No. 8-167702 discloses a technique of securing the necessary storage capacitance of an information storage capacitor comprising a first electrode (lower electrode) having a fin structure, a second electrode (upper electrode) and a dielectric material formed between the first and second electrodes by forming the first electrode from a material containing ruthenium oxide and the dielectric material from a material containing tantalum pentoxide so that the storage capacitance of the capacitor may be secured by the high dielectric constant of the material containing tantalum pentoxide.

SUMMARY OF THE INVENTION

However, the demand for a higher degree of integration gives rise to an ever-increasing demand for memory cells occupying a smaller area that cannot be met by the technique of raising the surface area of the lower electrode of each information storage capacitor by giving a cylindrical profile to it as proposed by Japanese Patent Application Laid-Open No. 7-7084 nor by forming fine undulations on the surface as proposed by Japanese Patent Applications Laid-Open Nos. 64-42161 and 1-187847. Thus, there is a demand for a technique of increasing the surface area of the lower electrode that cannot be met by simply providing it with a cylindrical profile because the height of the cylinder is limited by the mechanical strength required to the lower electrode and the stepped arrangement of the memory cell array region and the periphery circuit region due to the height of the lower electrodes nor by forming fine undulations on the surface of the lower electrode because they depend on the surface condition and the physical properties of the silicon of the device.

As for the technique of using a material having a high dielectric constant such as tantalum pentoxide for the capacitor insulator of the information storage capacitor disclosed by Japanese Patent Application Laid-Open No. 8-167702, the capacitor insulator is made of tantalum oxide film having a film thickness of 2.5 nm or more as expressed in terms of equivalent thickness of silicon oxide film. However, it is not possible for the technique to secure the capacitance required for the memory cells of a 256 Mbits DRAM or those of a DRAM of a later generation. Thus, there still remains the problem of securing a sufficient effective surface area if lower electrodes having a fin structure are used.

Additionally, if the capacitor insulator is made of tantalum oxide film, it is difficult to use silicon (poly-crystalline silicon film) for the lower electrode because, if silicon is exposed to an oxygen containing atmosphere during the process of forming tantalum oxide, a silicon oxide film having a low dielectric constant is formed along the interface of the lower electrode and the tantalum oxide film to increase the effective film thickness of the capacitor insulator and, therefore, decrease the effective dielectric constant of the capacitor insulator to reduce the stored electric charge. In view of this problem, Japanese Patent Application Laid-Open No. 8-167702 proposes the use of ruthenium oxide for the lower electrode as a material that can prevent the generation of a low dielectric constant layer.

However, if the typical process of depositing ruthenium by sputtering and subsequently oxidizing the deposited ruthenium layer is used to produce ruthenium oxide, undulations appear on the surface of the ruthenium oxide film to damage the reliability of the information storage capacitor.

In view of the above identified problems of the prior art, it is therefore an object of the present invention to provide a technology that can effectively secure a required storage capacitance for the information storage capacitors of the memory cells of a 256 Mbits DRAM or a DRAM of a later generation.

Another object of the present invention is to provide a technology that makes it possible to use tantalum oxide for the capacitor insulator of information storage capacitor without lowering the effective dielectric constant of the capacitor insulator and raising the film thickness of the insulator if thermally treated in an oxygen containing atmosphere.

Still another object of the present invention is to provide a technology of planarizing the surface of the lower electrode of information storage capacitor to improve the reliability of the information storage capacitor.

Still another object of the present invention is to provide a technology that makes it possible to simplify the profile of the lower electrode and the process of producing it.

A further object of the present invention is to provide a technology of improving the insulation effect of the capacitor insulator of information storage capacitor and reduce the leak current in order to improve the performance and the reliability of the information storage capacitor.

A further object of the present invention is to optimize the material of the upper electrode of information storage capacitor and provide a highly reliable information storage capacitor.

A still further object of the present invention is to raise the stored electric charge of the information storage capacitors of the memory cells of a DRAM and thereby raise the refresh margin of the DRAM in order to realize a semiconductor integrated circuit device adapted to a low supply voltage and a low power consumption rate.

The above objects and further object of the invention and the novel features of the present invention will become appear from the following description made by referring to the accompanying drawings.

Firstly, some aspects of the present invention will be briefly summarized.

According to an aspect of the invention, there is provided a semiconductor integrated circuit device including a memory cell comprising a memory cell selecting MISFET formed on the main surface of a semiconductor substrate and an information storage capacitor that is connected in series to said memory cell selecting MISFET and that have a lower electrode, a capacitor insulator and an upper electrode, wherein the lower electrode is made of a conductive material containing ruthenium dioxide ($RuO_2$) as principle ingredient and the capacitor insulator is made of crystallized tantalum pentoxide ($Ta_2O_5$).

With a semiconductor integrated circuit device having a configuration as described above, no film having a low dielectric constant such as silicon oxide will be produced along the interface of the lower electrode and the capacitor insulator if the latter is made of tantalum pentoxide that is prepared in an oxygen containing atmosphere because the lower electrode is made of a conductive material containing ruthenium dioxide as principal ingredient so that the capacitor insulator can show a high effective dielectric constant and be prevented from undesirably increasing its effective film thickness. It should be stressed here that no film having a low dielectric constant such as silicon oxide film will be produced along the interface of the lower electrode and the capacitor insulator if the tantalum pentoxide of the capacitor insulator is heat treated in an oxygen containing atmosphere in a manner as will be described hereinafter to enhance the extent of crystallization of the tantalum oxide. Since only ruthenium dioxide ($RuO_2$) is stable among the possible oxides of ruthenium, ruthenium dioxide ($RuO_2$) that is stable and electrically conductive is produced with any method of oxidizing ruthenium to provide an effect of broadening the process choice. For instance, if titanium nitride is used for the lower electrode, titanium oxide film is produced along the interface of the titanium nitride film and the tantalum oxide film to undesirably raise the effective film thickness of the capacitor insulator when the interfacial product is electrically nonconductive due to the stoichiometry of the product, although the produced titanium oxide may be electrically conductive and provide no problem depending on its stoichiometry. On the other hand, no such problem occurs when ruthenium oxide is used for the lower electrode according to the invention.

Additionally, the capacitor insulator of a semiconductor integrated circuit device according to the invention is made of crystalline tantalum pentoxide ($Ta_2O_5$) having a specific dielectric constant of 40 to 50 much higher than that of non-crystalline tantalum oxide (20 to 25) so that each information storage capacitor can show a storage capacitance far greater than its counterpart using a non-crystalline capacitor insulator if a same film thickness is used. Therefore, the lower electrode does not have to have a fin structure or cylindrical profile to secure a capacitance required to each information storage capacitor of a 256 Mbits DRAM or a 1 Gbits DRAM.

Preferably, in a semiconductor integrated circuit device according to the invention, the lower electrode has a surface roughness of 1 nm or less as expressed in terms of the center line average roughness (Ra).

With a semiconductor integrated circuit device comprising lower electrodes having a surface roughness of 1 nm or less as expressed in terms of the center line average roughness (Ra), each capacitor insulator can secure a sufficient level of planeness relative to the film thickness (5 to 15 nm). If the lower electrode has undulations of about Ra=20 nm on the surface, the capacitor insulator can show an undesirably concentrated electric field and/or areas having a thin film thickness to reduce the withstand voltage. However, with the above arrangement of the present invention, no such problem occurs with a semiconductor integrated circuit device according to the invention because the lower electrodes are secured to show a satisfactory level of planeness.

The capacitor insulator contains carbon atoms. This may be inevitable because the capacitor insulator made of tantalum oxide film is produced by CVD using organic tantalum gas. However, the carbon concentration should be held as low as possible to reduce the leak current.

In a semiconductor integrated circuit device according to the invention, the capacitor insulator may be a laminate of two or more than two crystallized tantalum pentoxide film layers. When crystallized, tantalum pentoxide film shows a poly-crystalline state and poly-crystalline thin film contains grain boundaries. Such grain boundaries of poly-crystalline thin film can reduce the withstand voltage typically of the film due to the segregated impurities and/or an imperfect crystal structure of the film. If, however, the capacitor insulator of a semiconductor integrated circuit device according to the invention is a laminate of two ore more than two crystalline tantalum pentoxide film layers, the leak current due to the grain boundaries of one of the layers can be interrupted by the remaining layer(s) to improve the withstand voltage.

In a semiconductor integrated circuit device according to the invention, preferably the capacitor insulator has a film thickness between 5 and 15 nm. Such a film thickness can secure a sufficient withstand voltage and, at the same time, a satisfactorily small equivalent thickness (the film thickness as expressed in terms of silicon oxide film).

In a semiconductor integrated circuit device according to the invention, preferably the upper electrode is made of single layer film or multilayer film of a material selected from titanium nitride (TiN), ruthenium (Ru), ruthenium dioxide ($RuO_2$), tungsten (W) and tungsten nitride (WN).

With a semiconductor integrated circuit device with such an arrangement, the upper electrodes can be optimized in terms of material to make the information storage capacitors show an improved reliability. More specifically, both ruthenium (Ru) and tungsten (W) are less apt to be oxidized than tantalum (Ta) so that if they are brought into direct contact with the tantalum oxide of the capacitor insulator, they would not draw oxygen from the tantalum oxide film to oxidize themselves. Thus, when the upper electrodes are made of either ruthenium or tungsten (or oxide or nitride of either of them), the stoichiometry of the tantalum oxide is secured for a prolonged period of time and the tantalum oxide remains thermally stable to consequently improve the reliability of the information storage capacitors.

On the other hand, the lower electrodes having a COB structure are formed three-dimensionally and hence it is desirable that the coat layer of the upper electrodes shows a good step coverage and a good step burial. Titanium nitride (TiN) shows a good step coverage and a good step burial because it can be formed by CVD using an inorganic or organic gas as raw material. Thus, upper electrodes showing a good step coverage and a good step burial can be formed by using titanium nitride (TiN) as raw material for it. Voids can be produced in the recesses that may be formed depending on the profile of the lower electrodes to consequently damage the reliability of the information storage capacitors if the upper electrodes have a coat showing a poor step coverage and a poor step burial. To the contrary, no such problem occurs when the upper electrodes are made of titanium nitride by CVD.

Then, the upper electrode may be a laminate of a tungsten film layer arranged in contact with the capacitor insulator and a titanium nitride film layer arranged in contact with the tungsten film layer. Such an arrangement provides the upper electrode with both the advantage of thermal stability and that of effectively preventing voids from appearing.

In a semiconductor integrated circuit device according to the invention and having the above described arrangement, preferably the plug for connecting one semiconductor region (e.g., source/drain region) of the memory cell selecting MISFET and the lower electrode is made of a conductive material containing ruthenium dioxide ($RuO_2$) as principal ingredient.

In a semiconductor integrated circuit device according to the invention and having the above described arrangement, still preferably a blocking film is arranged between a plug for connecting one semiconductor region (e.g., a source/drain region) of a memory cell selecting MISFET and a lower electrode, in order to suppress possible oxidation of said plug.

With such an arrangement, any possible production of an electrically non-conductive object typically made of silicon oxide can be effectively prevented from taking place in an area connecting the source/drain region of each memory cell selecting MISFET and the corresponding lower electrode as a result of the heat treatment for forming the capacitor insulator in an oxidizing atmosphere. More specifically, no silicon oxide film will be formed on the plugs because they are made of an electrically conductive material containing ruthenium dioxide ($RuO_2$) as principal ingredient. If, polycrystalline silicon is used for the plug, it will not be oxidized to produce silicon oxide film when a blocking film is arranged between each plug and the corresponding lower electrode to suppress possible oxidation of the plug. Thus, a reliable electric connection will be established between the source/drain region of each memory cell selecting MISFET and the corresponding lower electrode to improve the reliability of the semiconductor integrated circuit device.

The blocking film may typically be made of titanium nitride.

According to another aspect of the invention, there is provided a method of manufacturing a semiconductor integrated circuit device including a memory cell comprising a memory cell selecting MISFET formed on the main surface of a semiconductor substrate and an information storage capacitor that is connected in series to said memory cell selecting MISFET and that have a lower electrode, a capacitor insulator and an upper electrode, wherein said method comprises (a) a step of forming memory cell selecting MISFETs and bit lines, subsequently depositing ruthenium dioxide ($RuO_2$) on the interlayer insulator covering the bit lines and then patterning the ruthenium dioxide film layer to produce the lower electrodes and (b) a step of depositing non-crystalline tantalum oxide on the lower electrodes, subsequently crystallizing the tantalum oxide by heat treatment and forming the capacitor insulator from crystallized tantalum pentoxide ($Ta_2O_5$).

A semiconductor integrated circuit device having a configuration as described above can be successfully manufactured by means of such a manufacturing method. The entire process of manufacturing a semiconductor integrated circuit device according to the invention is rather simple because the lower electrodes have a simplified structure and are produced simply by patterning a ruthenium dioxide film layer in Step (a). Additionally, since the deposited non-crystalline tantalum oxide is crystallized by heat treatment in Step (b), the tantalum oxide film layer to be used for the capacitor insulator is made to show a raised dielectric constant to increase the storage capacitance of the information storage capacitors.

Preferably, the deposition of ruthenium dioxide is performed by sputtering, using ruthenium dioxide ($RuO_2$) as target material. Thus, since a coat is deposited by sputtering, using ruthenium dioxide ($RuO_2$) as starting material, a remarkably plane coat (Ra=less than 1 nm) can be realized to improve the reliability of the information storage capacitors of the DRAM with a manufacturing method according to the invention if compared with the surface roughness (Ra=about 20 nm) of a coat of ruthenium dioxide formed by a conventional method of depositing ruthenium (Ru) and subsequently oxidizing the deposited ruthenium.

Alternatively, the deposition of ruthenium dioxide is performed by reactive sputtering, using ruthenium (Ru) as target material and oxygen-containing gas. With such a technique of employing reactive etching, using ruthenium (Ru) as target material along with oxygen-containing gas, it is also possible to realize a remarkably plane coat (Ra=less than 1 nm) and improve the reliability of the information storage capacitors of the DRAM.

Still alternatively, the deposition of ruthenium dioxide is performed by CVD, using a source gas containing organic ruthenium gas and oxygen. With such a technique of depositing ruthenium dioxide by CVD in a single process using a source gas containing organic ruthenium gas and oxygen, it is also possible to realize a remarkably plane coat (Ra=less than 1 nm) and improve the reliability of the information storage capacitors of the DRAM. Examples of organic ruthenium gas that can be used for the purpose of the invention include trisdipivaloylmethanatoruthenium (Ru(($CH_3$)$_3$CCOCHCOC($CH_3$)$_3$)$_3$).

Still alternatively, the tantalum oxide is formed by thermal CVD, using a source gas containing pentaalkyltantalum $(Ta(C_nH_{2n+1})_5)$ and oxygen $(O_2)$ under low pressure at temperature below 50° C. With such a technique of employing thermal CVD, using a source gas containing pentaalkyltantalum $(Ta(C_nH_{2n+1})_5)$ and oxygen $(O_2)$ under low pressure at temperature below 500° C., it is possible to improve the step coverage of the capacitor insulator.

For the purpose of the invention, n is preferably 1 or 2 in order to advantageously reduce the carbon concentration contained in the produced tantalum oxide film.

For the purpose of the invention, the heat treatment of the tantalum oxide is performed in an oxidizing atmosphere at 750° C. for 10 minutes or at 800° C. for 3 minutes. If the heat treatment of the tantalum oxide is performed in an oxidizing atmosphere at 800° C. for 3 minutes, the nucleation density of the crystalline process can be raised to reduce the grain size of tantalum oxide crystals and produce a dense capacitor insulator or a coat having a highly uniform film thickness so that consequently the withstand voltage of the information storage capacitors of the DRAM can be significantly improved.

A method of manufacturing a semiconductor integrated circuit device according to the invention may further comprise a step of forming a single layer film or a multilayer film of a material selected from titanium nitride (TiN), ruthenium (Ru), ruthenium dioxide $(RuO_2)$, tungsten (W) and tungsten nitride (WN) by deposition and patterning the single layer film or the multilayer film to produce the upper electrodes.

With such a method, a semiconductor integrated circuit device comprising upper electrodes can be manufactured in a simplified manner.

The foregoing and other objects, advantages, manner of operation and novel features of the present invention will be understood from the following detailed description when read in connection with the accompanying drawings.

BRIEF DESCRIPTION OF THE DRAWINGS

FIG. 38 is photographic views of two specimens of ruthenium dioxide film obtained in an experiment conducted by the inventors of the present invention, showing the surface condition as observed through a scanning electronic microscope, of which FIG. 38(a) is a view of the surface of a ruthenium dioxide film obtained by depositing a metal ruthenium film layer and subsequently oxidizing the metal ruthenium and FIG. 38(b) is a view of the surface of a ruthenium dioxide film obtained by a manufacturing method according to the invention.

DESCRIPTION OF THE PREFERRED EMBODIMENTS

Now, the present invention will be described in greater detail by referring to the accompanying drawings that illustrate preferred embodiments of the invention. Throughout the drawings, those members that have same functional features are denoted by a same reference symbol and will not be described repeatedly.

1st Embodiment

Figure 1:
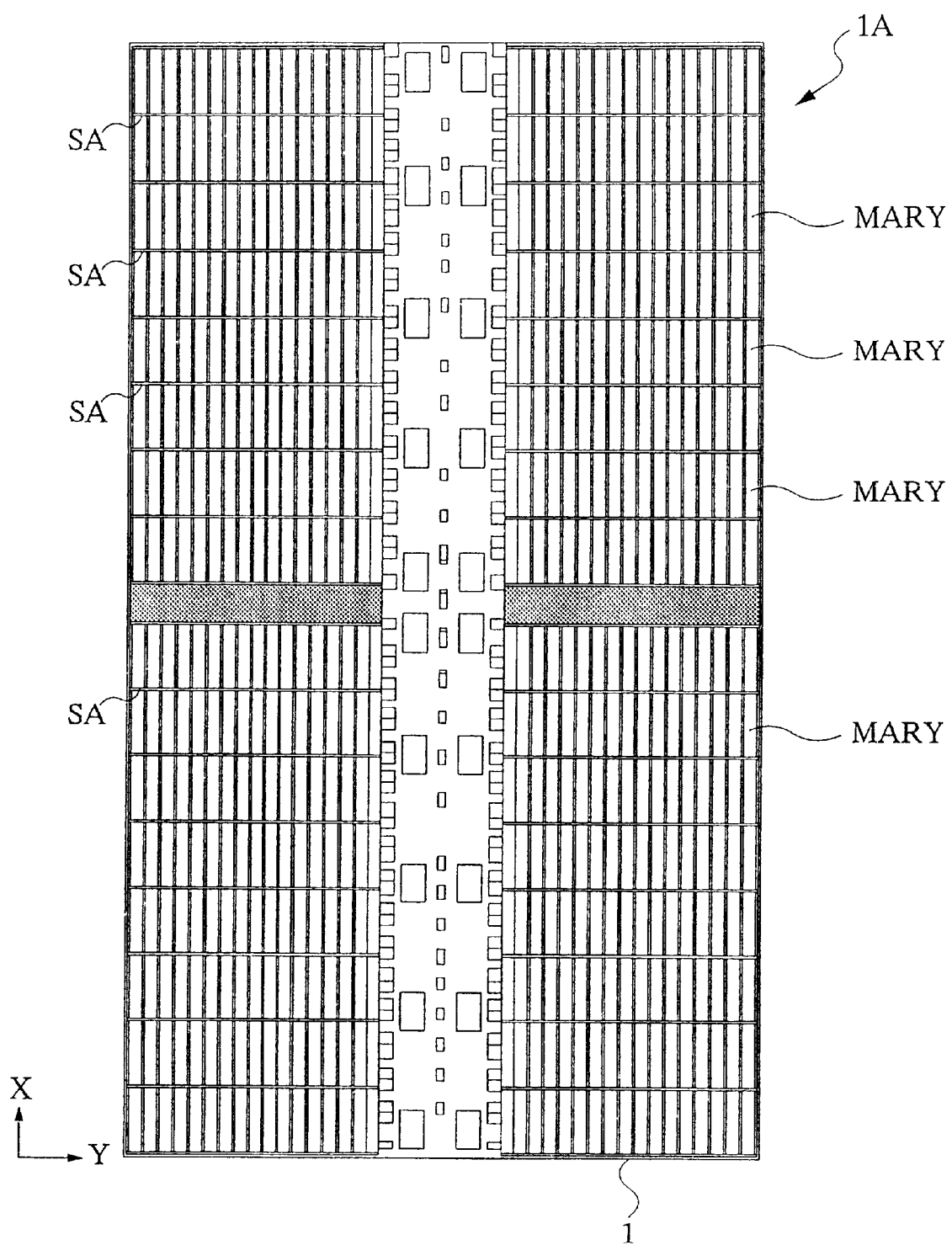
FIG. 1 is a schematic plan view of a semiconductor chip carrying an embodiment of DRAM according to the invention.

FIG. 1 is a schematic plan view of a semiconductor chip carrying an embodiment of DRAM according to the invention. As shown, a number of memory cell arrays MARY are arranged in the form of matrix along X-direction (running along the long side of the semiconductor chip 1A) and Y-direction (running along the short side of the semiconductor chip 1A) on the principal surface of the semiconductor 1A that is made of single crystal silicon. Sense amplifiers SA are arranged respectively between adjacent rows of memory cell arrays MARY running along the X-direction. Control circuits including word line drivers WD and a data line selection circuit, an input/output circuit and bonding pads are arranged at the center of the principal surface of the semiconductor chip 1A.

Figure 2:
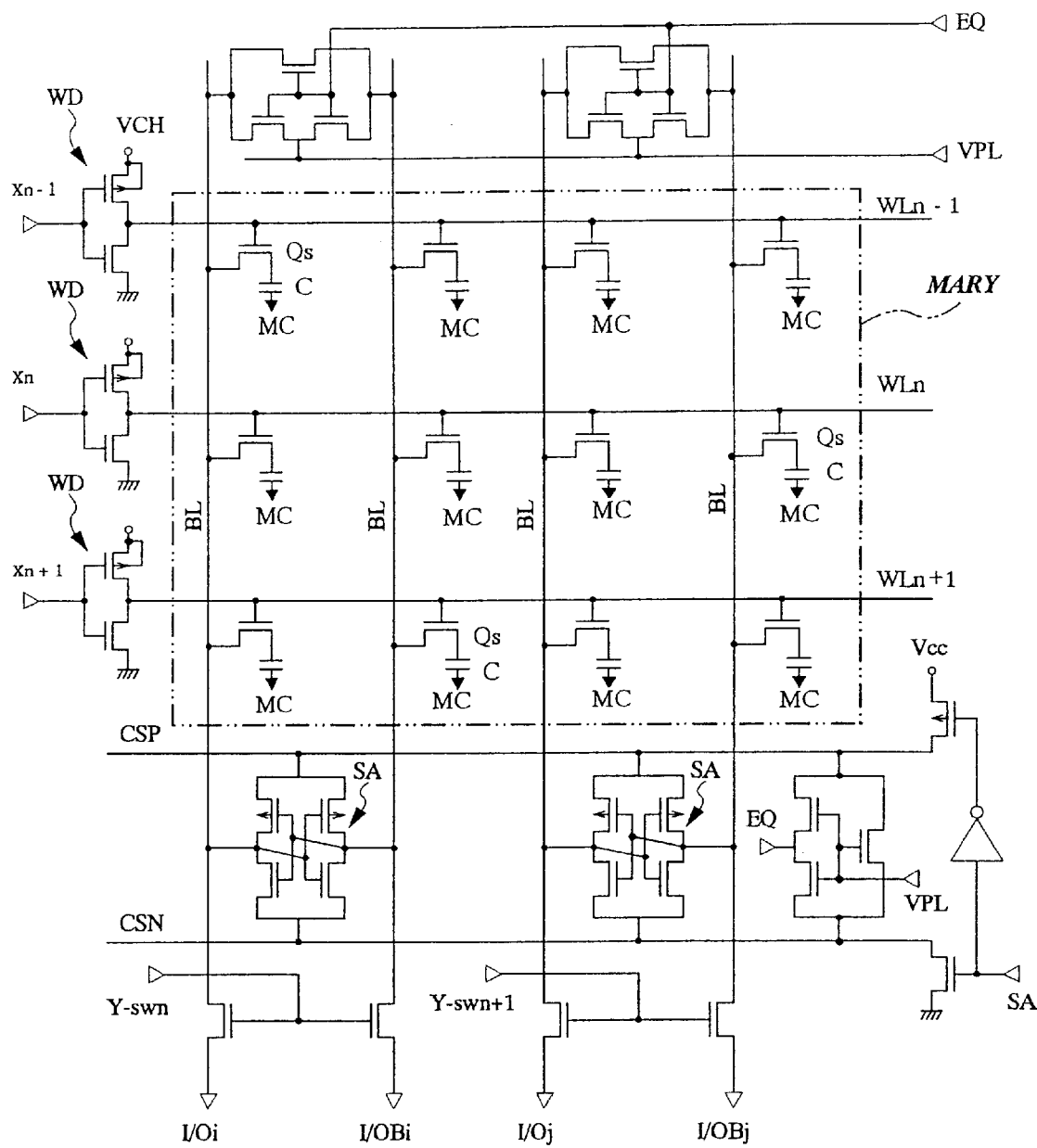
FIG. 2 is an equivalent circuit diagram of the embodiment of DRAM of FIG. 1.

FIG. 2 is an equivalent circuit diagram of the embodiment of FIG. 1. As shown, the memory cell arrays (MARY) of the DRAM comprise a plurality of word lines ($WL_{n-1}$, $WL_n$, $WL_{n+1}$, ...) and a plurality of bit lines BL arranged in the form of matrix as well as memory cells (MC) arranged at the respective intersections of the word lines and the bit lines. Each memory cell is adapted to store a 1-bit data and comprises a information storage capacitor C and a memory cell selecting MISFET Qs connected to it in series. Either the source or the drain of each memory cell selecting MISFET is electrically connected to the corresponding information storage capacitor C and the drain or the source, whichever appropriate of the memory cell selecting MISFET is electrically connected to the corresponding bit line BL. Each word line WL is connected at an end thereof with a word line driver WD, whereas each bit line BL is connected at an end thereof with a sense amplifier SA.

Now, the method of manufacturing the embodiment of DRAM will be described by referring to FIGS. 3 through 37 showing it in different manufacturing steps. Note that FIGS. 3 through 37 also illustrate a mode of carrying out a method of manufacturing a DRAM according to the invention in different manufacturing steps.

Figure 3:
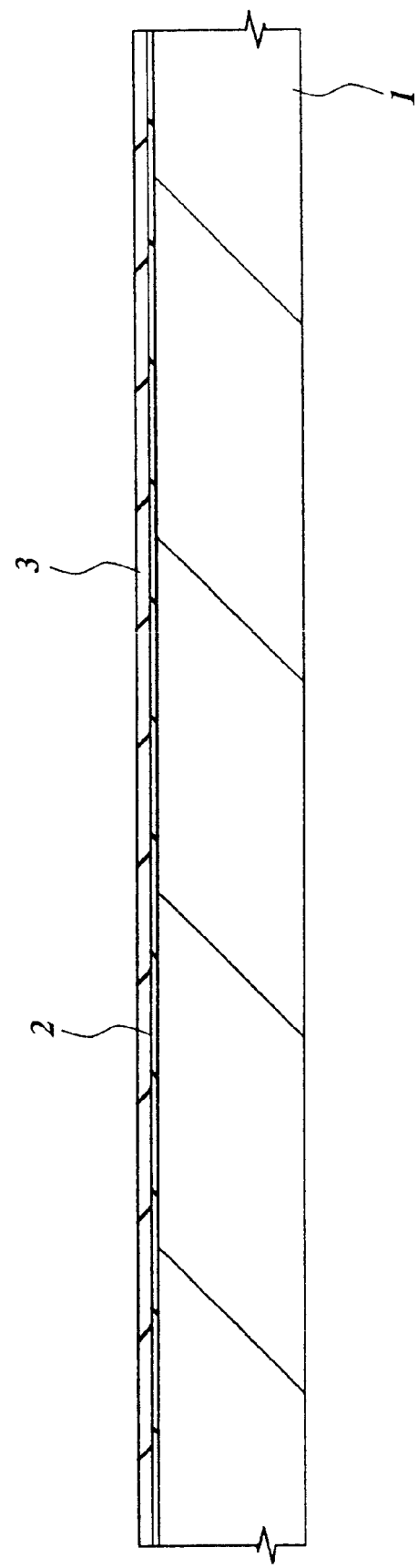
FIG. 3 is a schematic cross sectional view of the embodiment of DRAM of FIG. 1 in a step of manufacturing it.

Firstly, referring to FIG. 3, a p-type semiconductor substrate 1 having a resistivity of about 10 Ωcm is subjected to a wet oxidation process at about 850° C. to form a thin silicon oxide film 2 on the surface to a film thickness of about 10 nm. Then, a silicon nitride film 3 is deposited on the silicon oxide film 2 by CVD (chemical vapor deposition) to a film thickness of about 140 nm. The silicon oxide film 2 is used to reduce the stress produced in the substrate when sintering the silicon oxide film buried in the inside of device isolation trenches in a subsequent step. Since the silicon nitride film 3 is hardly oxidizable, it will be used as mask for preventing the surface of the underlying substrate (in the active region) from oxidation.

Figure 4:
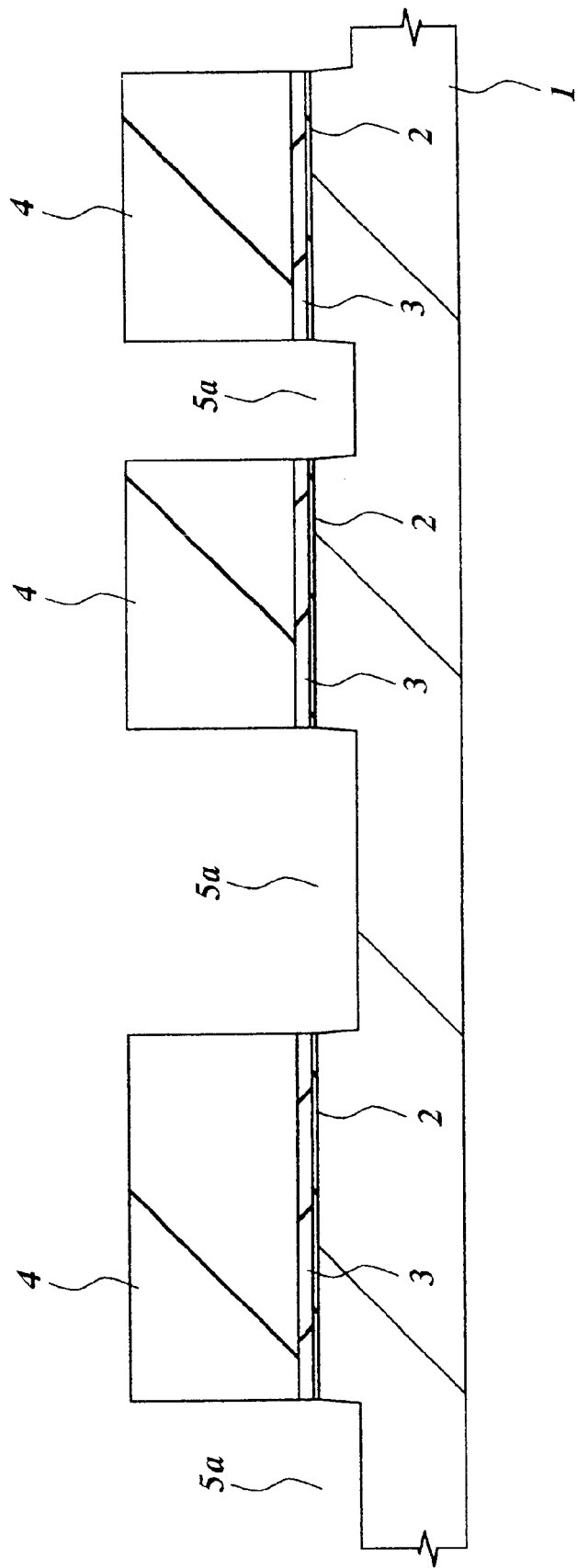
FIG. 4 is a schematic cross sectional view of the embodiment of DRAM of FIG. 1 in a subsequent step of manufacturing it.

Then, as shown in FIG. 4, trenches 5a are formed in the semiconductor substrate 1 to a depth of about 300 to 400 nm by dry etching the silicon nitride film 3, the silicon oxide film 2 and the semiconductor substrate 1, using the photoresist film 4 as mask. Alternatively, the trenches 5a may be formed by dry etching the silicon nitride film 3 firstly, using the photoresist film 4 as mask, removing then the photoresist film 4 and thereafter dry etching the silicon oxide film 2 and the semiconductor substrate 1, using the silicon nitride film 3 as mask.

Figure 5:
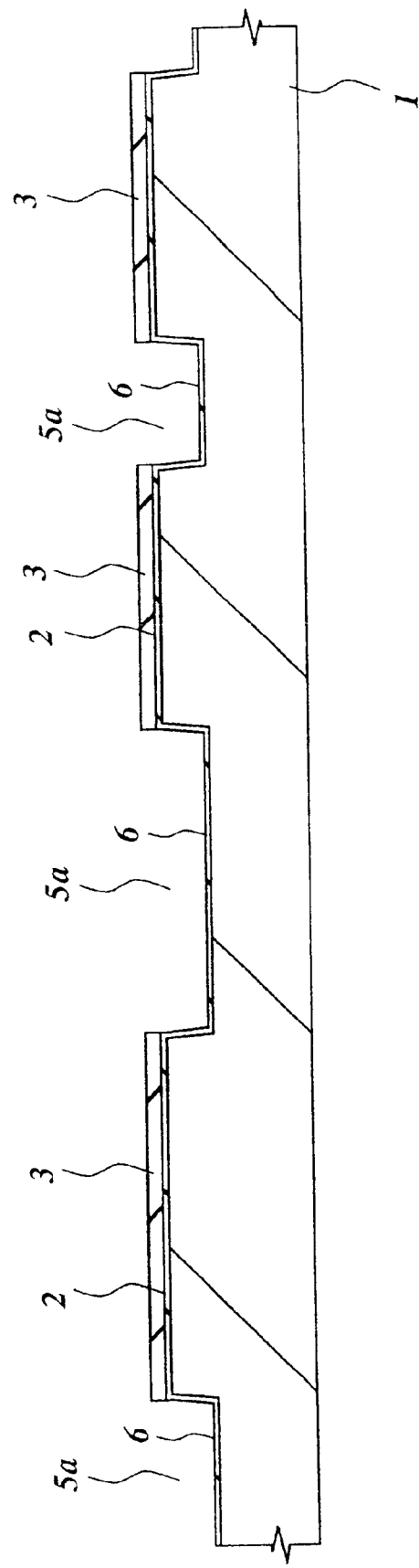
FIG. 5 is a schematic cross sectional view of the embodiment of DRAM of FIG. 1 in a still subsequent step of manufacturing it.

After removing the photoresist film 4, the semiconductor substrate 1 is subjected another wet oxidation process at about 850 to 900° C. to form a thin silicon oxide film 6 to a film thickness of about 10 nm on the inner wall of the trenches 5a as shown in FIG. 5 in order to remove the damage layer produced on the inner wall of the trenches 5a by the above etching process.

Figure 6:
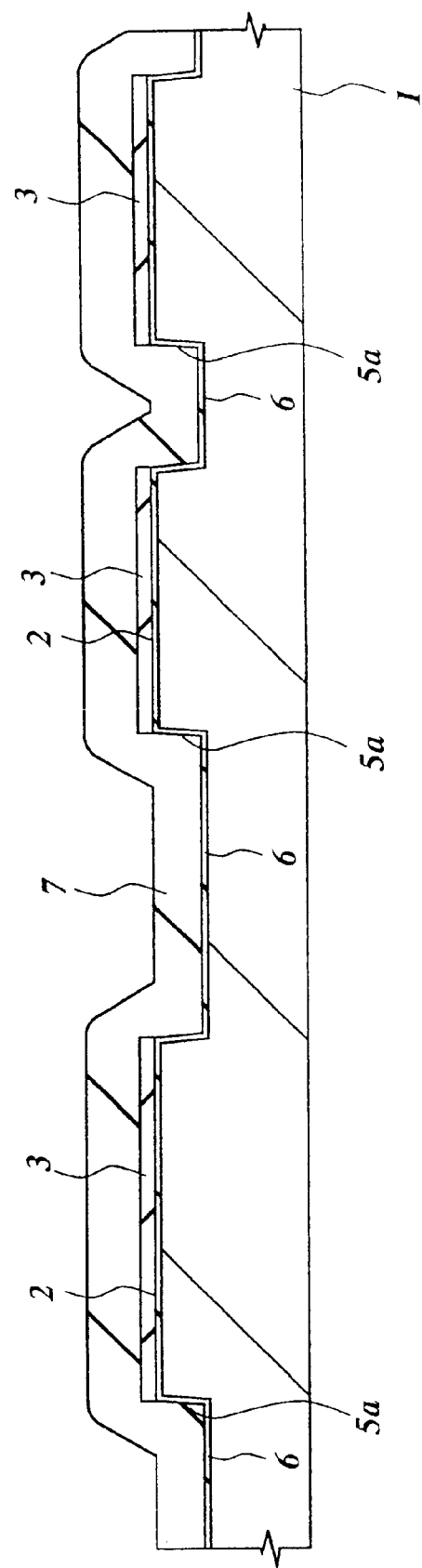
FIG. 6 is a schematic cross sectional view of the embodiment of DRAM of FIG. 1 in a still subsequent step of manufacturing it.

Then, as shown in FIG. 6, another silicon oxide film 7 is formed on the semiconductor substrate 1 by deposition to a film thickness between 300 and 400 nm and, subsequently, the semiconductor substrate 1 is subjected to another dry oxidation process at about 1000° C. to improve the quality of the silicon oxide film 7 buried in the trenches 5a by sintering it. For example, the silicon oxide film 7 can be deposited by plasma CVD, using a source gas of ozone ($O_3$) and tetraethoxysilane (TEOS).

Figure 7:
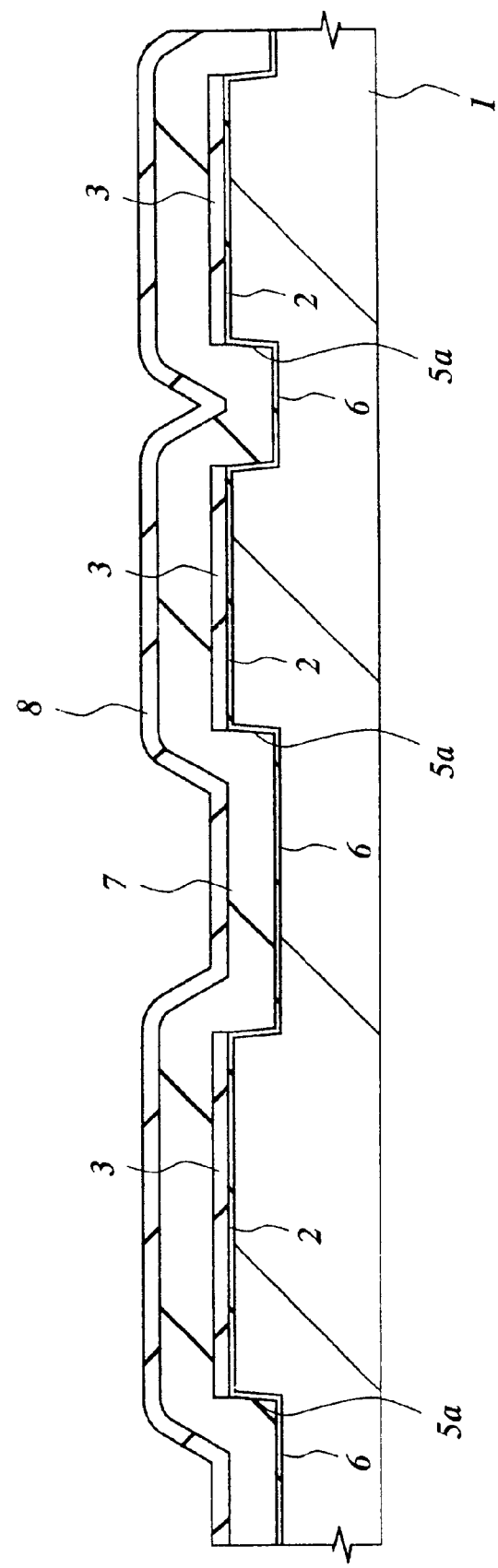
FIG. 7 is a schematic cross sectional view of the embodiment of DRAM of FIG. 1 in a still subsequent step of manufacturing it.
Figure 8:
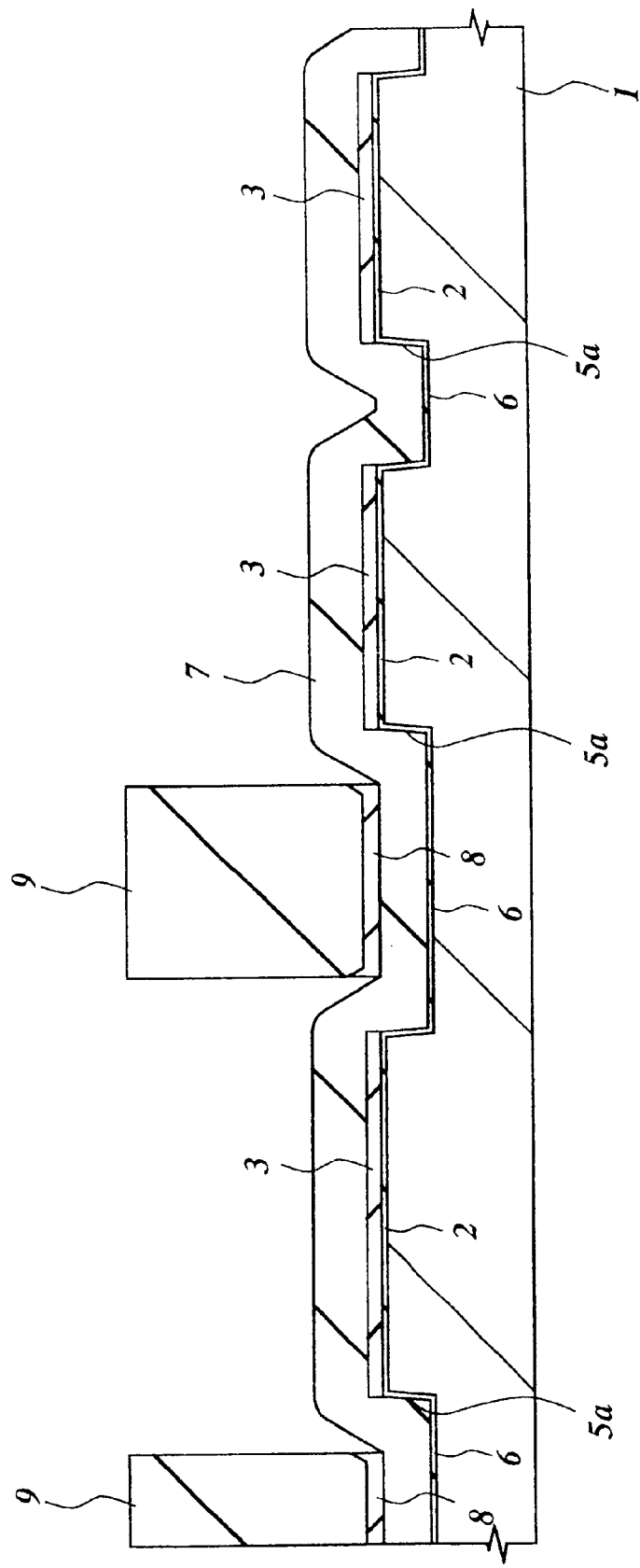
FIG. 8 is a schematic cross sectional view of the embodiment of DRAM of FIG. 1 in a still subsequent step of manufacturing it.

Then, referring to FIG. 7, a silicon nitride film 8 is deposited on the silicon oxide film 7 to a film thickness of about 140 nm by CVD and subsequently, as shown in FIG. 8, the silicon nitride film 8 is dry-etched, using the photoresist film 9 as mask, in such a way that the silicon nitride film 8 is left only above the trenches 5a having a relatively large area such as those operating as boundary zones separating the memory cell arrays and the peripheral circuits. The silicon nitride film 8 left only above the trenches 5a is used to prevent a phenomenon (dishing) that the silicon oxide film 7 located inside the trenches 5a having a relatively large area is polished more extensively than the silicon oxide film 7 located inside the trenches 5a having a relatively small area when the silicon oxide film 7 is polished by CMP (Chemical Mechanical Polishing) for planarization.

Figure 9:
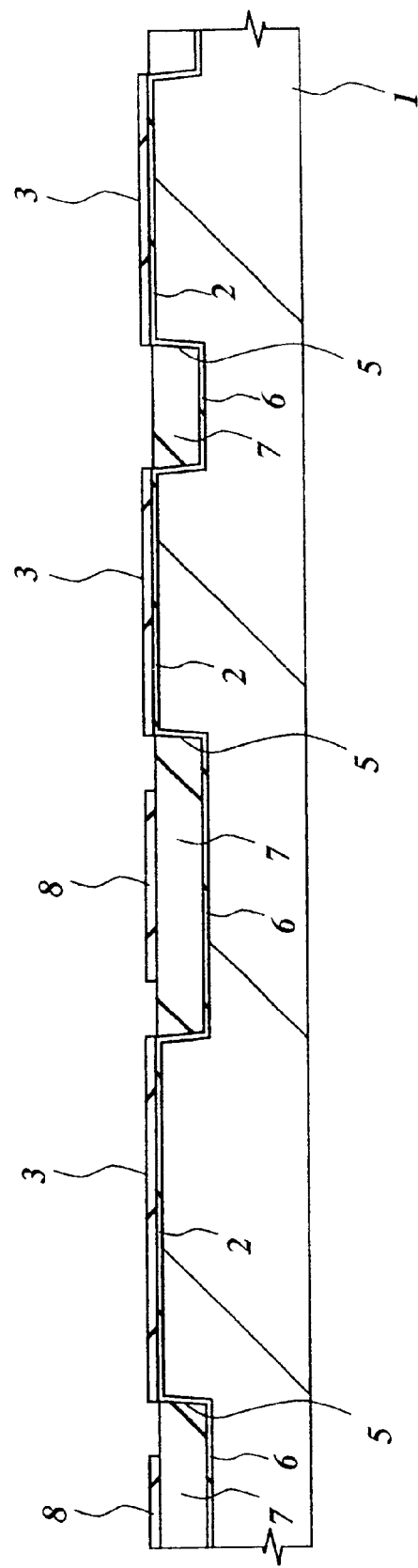
FIG. 9 is a schematic cross sectional view of the embodiment of DRAM of FIG. 1 in a still subsequent step of manufacturing it.

After removing the photoresist film 9, the silicon oxide, film 7 is polished by CMP using the silicon nitride films 3, 8 as stopper until the silicon oxide film 7 is left only in the trenches 5a as shown in FIG. 9 so that the latter may operate as device isolation trenches 5.

Figure 10:
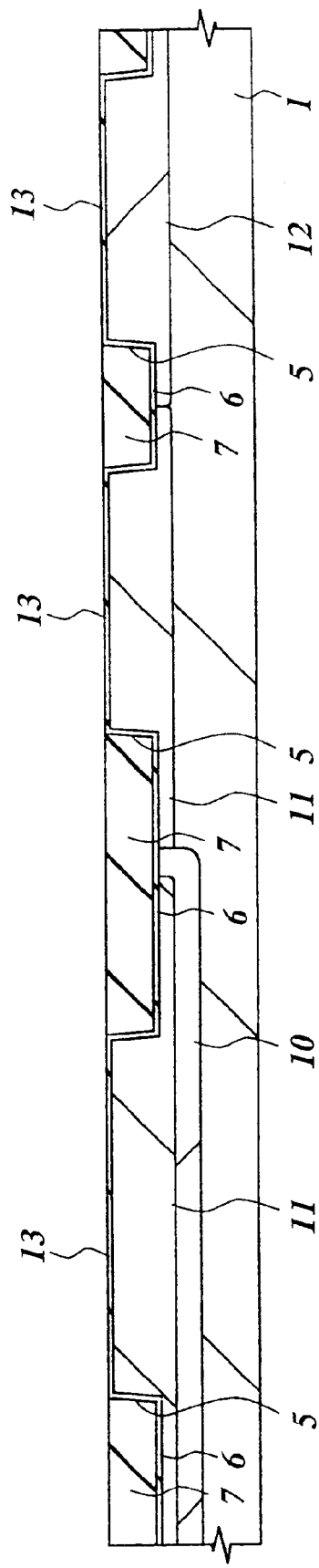
FIG. 10 is a schematic cross sectional view of the embodiment of DRAM of FIG. 1 in a still subsequent step of manufacturing it.

Subsequently, after removing the silicon nitride films 3, 8 by means of a wet etching process using hot phosphoric acid, ions of an n-type impurity substance such as phosphor are implanted into the regions of the semiconductor substrate 1 for arranging memory cell arrays in order to produce n-type semiconductor regions 10 there as shown in FIG. 10. Then, ions of a p-type impurity substance such as boron are implanted into the regions for forming the memory cell arrays and a part of the peripheral circuits (regions for forming n-channel type MISFETs) in order to produce p-type wells 11, whereas ions of an n-type impurity substance such as phosphor are implanted into another part of the peripheral circuits (regions for forming p-channel type MISFETs) in order to produce n-type wells 12. Succeeding the ion implanting operation, ions of an impurity substance for regulating the threshold voltage of the MISFETs such as $BF_2$ (boron fluoride) are implanted into both the p-type wells 11 and the n-type wells 12. The n-type semiconductor regions 10 are formed to prevent noises from entering the p-type wells 11 of the memory cell arrays typically from the input/output circuit by way of the semiconductor substrate 1.

Then, after removing the silicon oxide film 2 on the surface of each of the p-type wells 11 and the n-type wells 12 by means of an HF (hydrofluoric acid) type cleansing solution, the semiconductor substrate 1 is subjected to a wet oxidation process at about 850° C. to produce a clean gate oxide film 13 having a film thickness of about 7 nm on the surface of each of the p-type wells 11 and the n-type wells 12. Preferably but not limitatively, nitrogen may be segregated on the interface between the gate oxide film 13 and the semiconductor substrate 1 by heat treating the semiconductor substrate 1 in an NO (nitrogen oxide) atmosphere or in an $N_2O$ (nitrogen suboxide) atmosphere after forming the gate oxide film 13 (oxidation/nitriding treatment). When the gate oxide film 13 is thinned to about 7 nm, the strain generated on the interface between the gate oxide film 13 and the semiconductor substrate 1 due to the difference of thermal expansion coefficient becomes so significant as to trigger the generation of hot carriers. On the other hand, the strain is reduced by the nitrogen atoms segregated on the interface so that the above described oxidation/nitriding treatment process can improve the reliability of the very thin gate oxide film 13.

Figure 11:
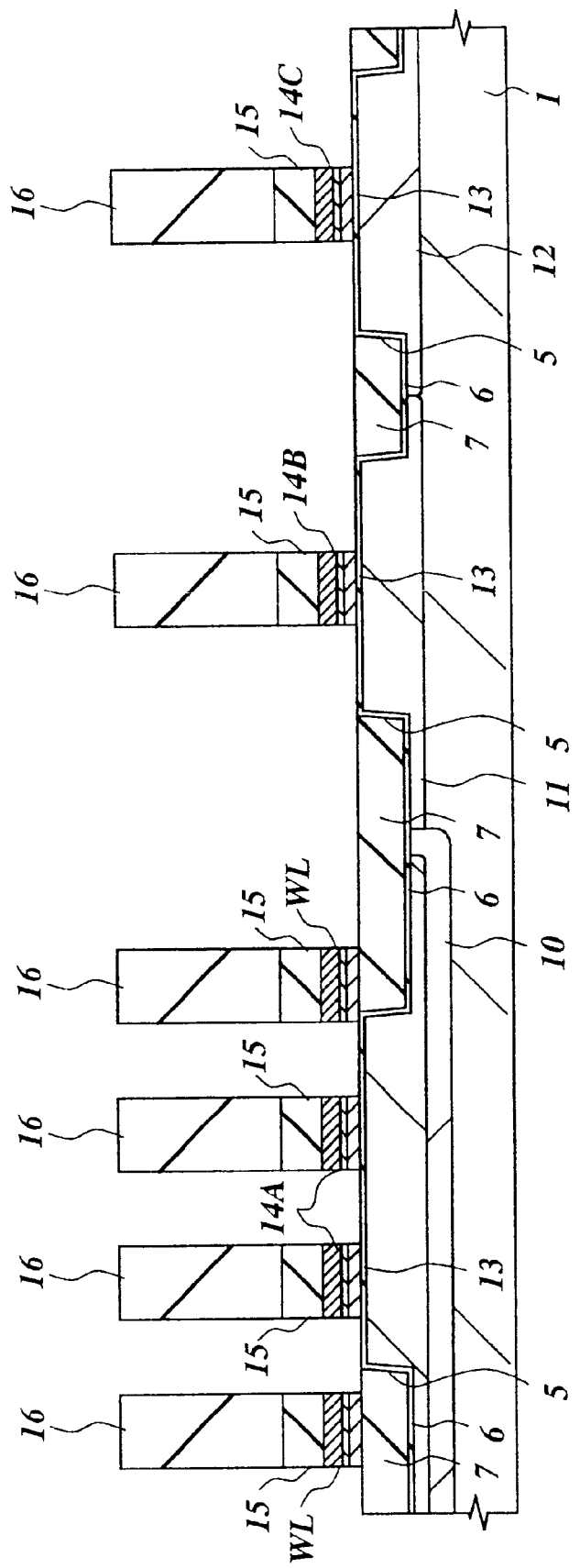
FIG. 11 is a schematic cross sectional view of the embodiment of DRAM of FIG. 1 in a still subsequent step of manufacturing it.

Then, as shown in FIG. 11, gate electrodes 14A, 14B and 14C are formed above the gate oxide film 13. The gate electrodes 14A operates as part of the memory cell selecting MISFETs and are used as word lines in regions other than the active region. The width of each gate electrode 14A (word line WL) is made equal to the smallest value (e.g., 0.24 $\mu$m) within an allowable range for holding the threshold voltage above a given level by suppressing the short channel effect of the memory cell selecting MISFET. The gap separating any two adjacently located gate electrodes 14A (word lines WL) is made equal to the smallest value (e.g., 0.22 $\mu$m) defined by the limit of resolution of the photolithography technique involved in the process. The gate electrodes 14B and 14C operate respectively as part of the n-channel MISFETs of the peripheral circuits and as part of the p-type MISFETs of the peripheral circuits.

The gate electrodes 14A (word lines WL), 14B and 14C are typically formed by depositing a poly-crystalline silicon film doped with an n-type impurity substance such as P (phosphor) above the semiconductor substrate 1 to a film thickness of about 70 nm by CVD, then depositing a WN (tungsten nitride) film and a W (tungsten) film on the silicon film to respective film thickness of about 50 nm and about 100 nm by sputtering, subsequently depositing a silicon nitride film 15 to a film thickness of about 150 nm by CVD and then patterning the films, using a photoresist film 16 as mask. The WN film operates as barrier layer for preventing the W film and the poly-crystalline silicon film from reacting with each other and preventing to produce an electrically highly resistive silicide layer (e.g., $WSi_x$) on the interface thereof in a subsequent high temperature heat treatment step. The WN layer may be replaced, for example, by a TiN (titanium nitride) film for the barrier layer.

If the gate electrodes 14A (word lines WL) are partly made of a low resistance metal (W), their sheet resistance can be reduced to about 2 to 2.5 $\Omega/\square$ to minimize the word line delay. Thus, the word line delay can be minimized without lining the gate electrodes 14 (word lines WL) with Al (aluminum) wires so that the number of wiring layers formed on the memory cells can be reduced by one.

Then, after removing the photoresist film 16, the residue left on the surface of the semiconductor substrate 1 including the dry etching residue and the photoresist residue is removed by means of etching solution typically containing fluoric acid. As a result of this wet etching operation, the gate oxide film 13 in the regions other than the regions under the gate electrodes 14A (word lines WL) and the gate electrodes 14B, 14C is scraped and, at the same time, the gate oxide film 13 under the gate lateral walls is anisotropically etched to produce undercuts and consequently reduce the withstand voltage of the gate oxide film 13. Therefore, the semiconductor substrate 1 is subsequently subjected to a wet oxidation process at about 900° C. to improve the quality of the scraped gate oxide film 13.

Figure 12:
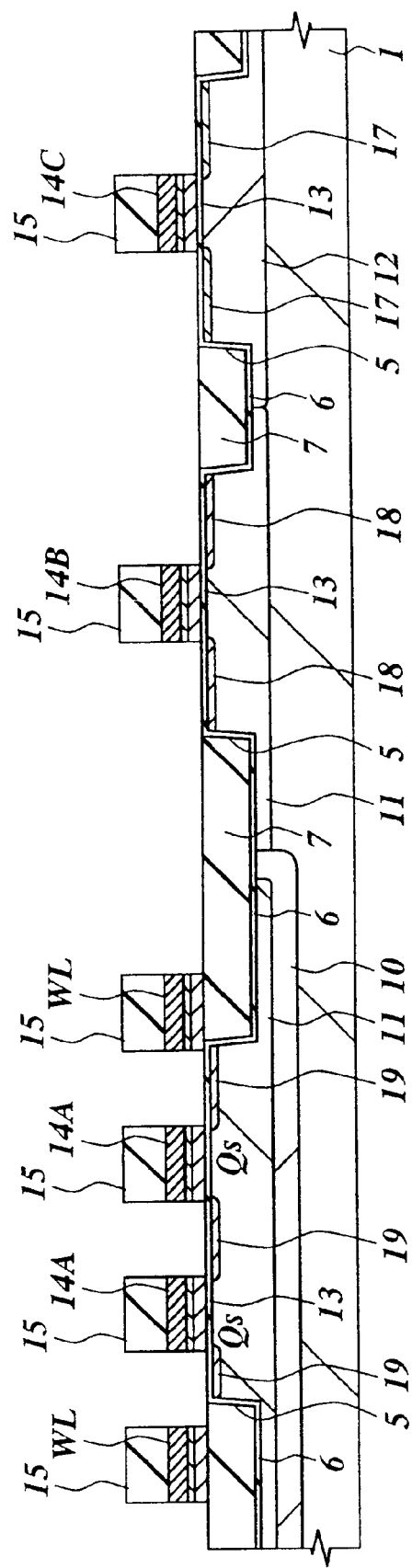
FIG. 12 is a schematic cross sectional view of the embodiment of DRAM of FIG. 1 in a still subsequent step of manufacturing it.

Thereafter, as shown in FIG. 12, ions of a p-type impurity substance such as B (boron) are implanted into the n-type wells 12 to produce a p-type semiconductor region 17 in the n-type wells 12 on the opposite sides of each gate electrode 14C. Additionally, ions of an n-type impurity substance such as P (phosphor) are implanted into the p-type wells 11 to produce an n⁻-type semiconductor region 18 in the p-type wells 11 on the opposite sides of each gate electrode 14B and also an n-type semiconductor region 19 in the p-type wells 11 on the opposite sides of each gate electrode 14A. Thus, memory cell selecting MISFETs Qs are formed on the respective memory cell arrays.

Figure 13:
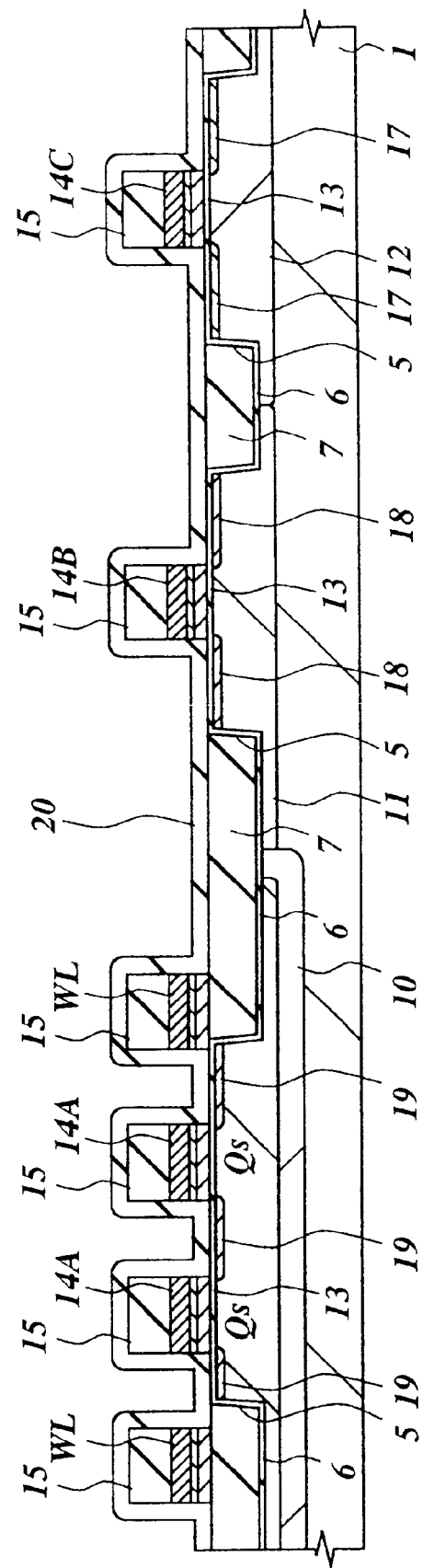
FIG. 13 is a schematic cross sectional view of the embodiment of DRAM of FIG. 1 in a still subsequent step of manufacturing it.
Figure 14:
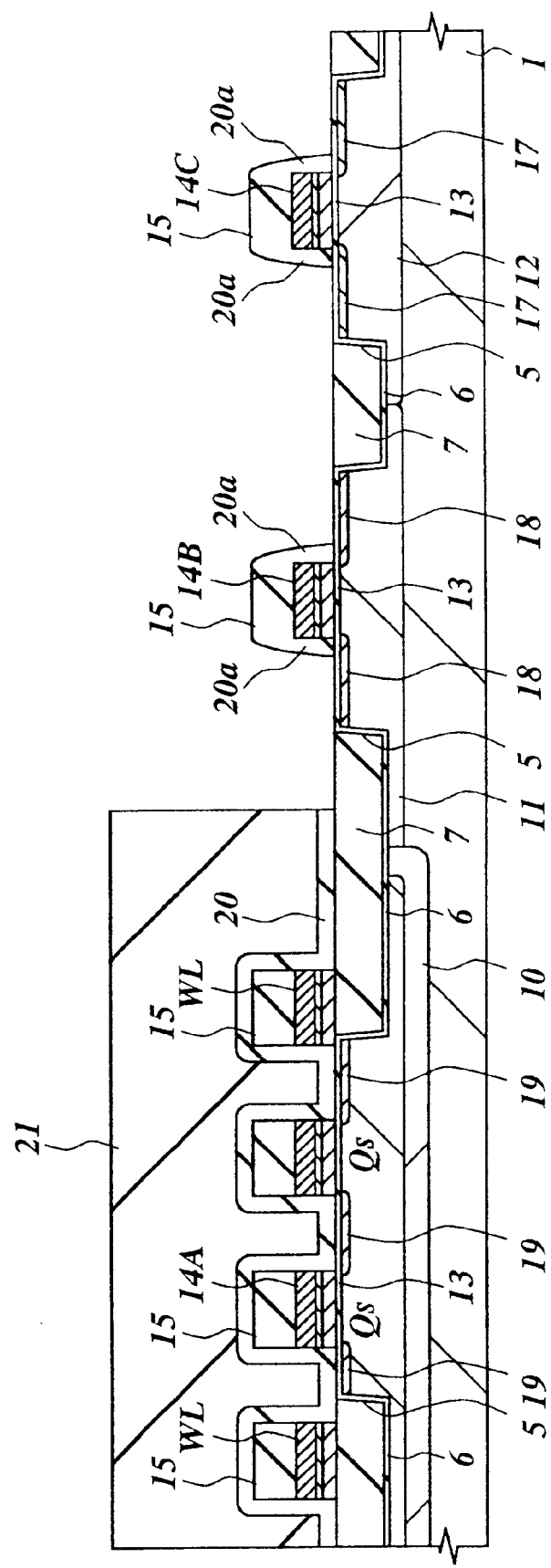
FIG. 14 is a schematic cross sectional view of the embodiment of DRAM of FIG. 1 in a still subsequent step of manufacturing it.

Then, after depositing a silicon nitride film 20 to a film thickness of about 50 to 100 nm on the semiconductor substrate 1 by CVD as shown in FIG. 13, the silicon nitride film 20 of the memory cell arrays are covered by a photoresist film 21 and the silicon nitride film 20 of the peripheral circuits are anisotropically etched to produce side wall spacers 20a for the lateral walls of the gate electrodes 14B, 14C. Note that this etching operation is conducted by using an etching gas selected to maximize the rate of etching the silicon nitride film 20 relative to the silicon oxide film in order to minimize the scrape of the gate oxide film 13 and the silicon oxide film 7 buried in the device isolation trenches 5. The overetching, if necessary, should be minimized to minimize the scrape of the silicon nitride film 15 on the gate electrodes 14B, 14C.

Figure 15:
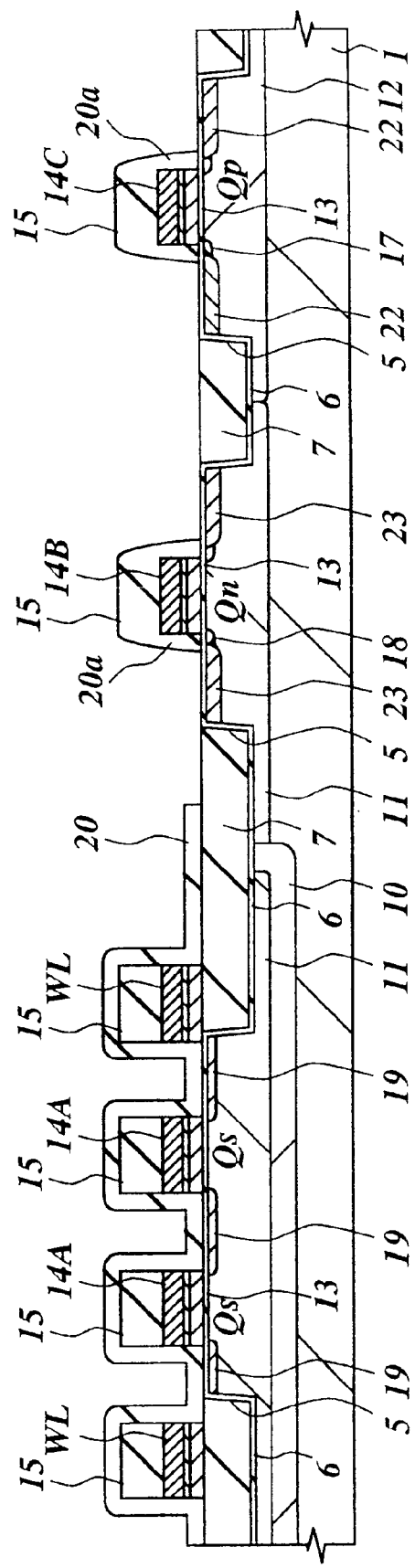
FIG. 15 is a schematic cross sectional view of the embodiment of DRAM of FIG. 1 in a still subsequent step of manufacturing it.

Subsequently, after removing the photoresist film 21, ions of a p-type impurity substance such as B (boron) are implanted into the n-type wells 12 of the peripheral circuit regions to produce a p⁺-type semiconductor region 22 (source/drain) for the p-channel type MISFETs and ions of n-type impurity substance such as As (arsenic) are implanted into the p-type wells 11 of the peripheral circuit regions to produce an n⁺-type semiconductor region 23 (source/drain) for the n-channel type MISFETs as shown in FIG. 15. Thus, p-channel type MISFETs Qp and n-channel type MISFETs Qn having a LDD (lightly doped drain) structure are formed in the peripheral circuit regions.

Figure 16:
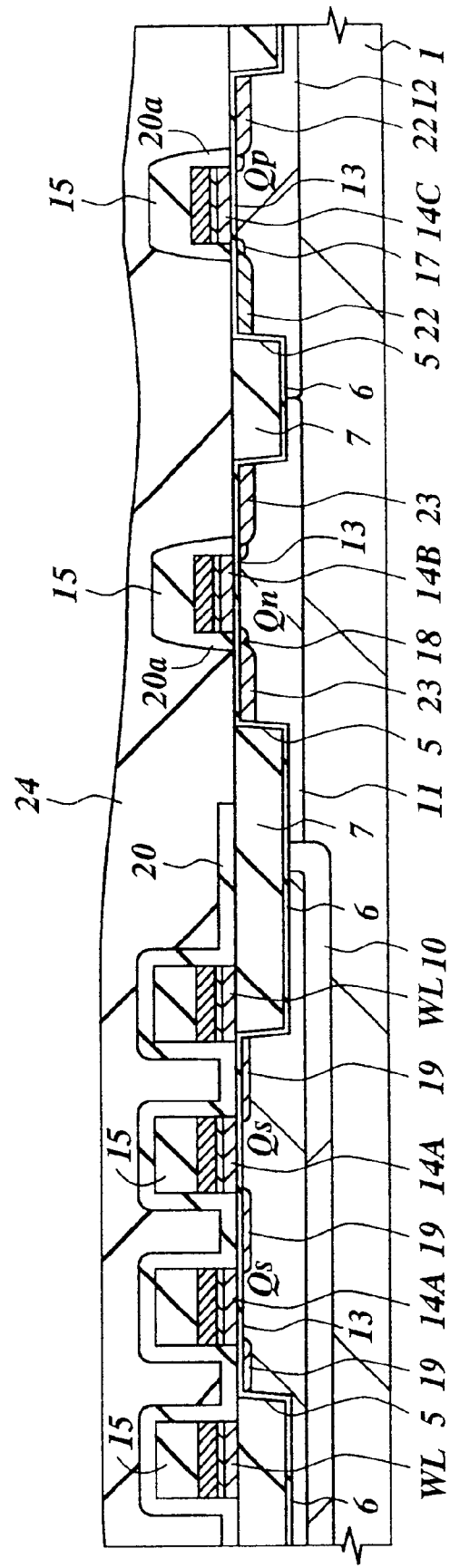
FIG. 16 is a schematic cross sectional view of the embodiment of DRAM of FIG. 1 in a still subsequent step of manufacturing it.

Then, as shown in FIG. 16, an SOG (spin on glass) film 24 is formed on the semiconductor substrate 1 to a film thickness of about 300 nm by spin coating and the semiconductor substrate 1 is heat treated at 800° C. for about 1 minutes to sinter the SOG film 24.

Figure 17:
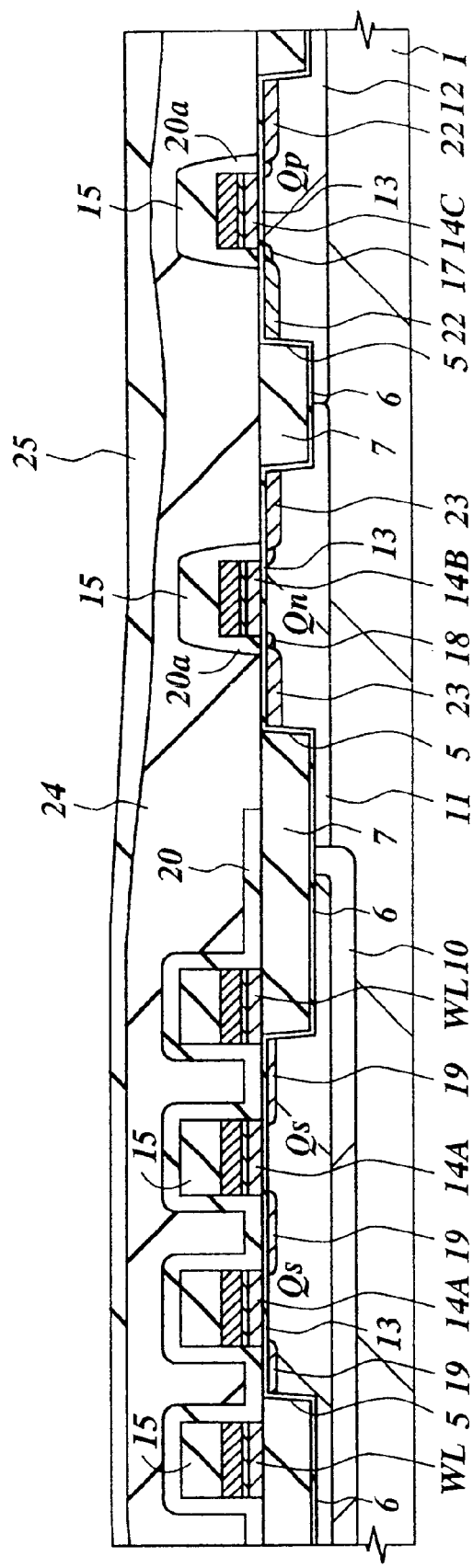
FIG. 17 is a schematic cross sectional view of the embodiment of DRAM of FIG. 1 in a still subsequent step of manufacturing it.

Then, after depositing silicon oxide film 25 on the SOG film 24 to a film thickness of about 600 nm as shown in FIG. 17, the silicon oxide film 25 is polished by a CMP technique for planarization. The silicon oxide film 25 may typically be deposited by plasma CVD using a source gas of ozone ($O_3$) and tetraethoxysilane (TEOS).

As described above, in this embodiment, a highly reflowable SOG film 24 is applied onto the gate electrodes 14A (word lines WL) and then the silicon oxide film 25 deposited thereon is polished by CMP for planarization. As a result, the fine gaps separating the gate electrodes 14A (word lines WL) are satisfactorily filled and the insulator film on the gate electrodes 14A (word lines WL) and the gate electrodes 14B, 14C is sufficiently planarized.

Figure 18:
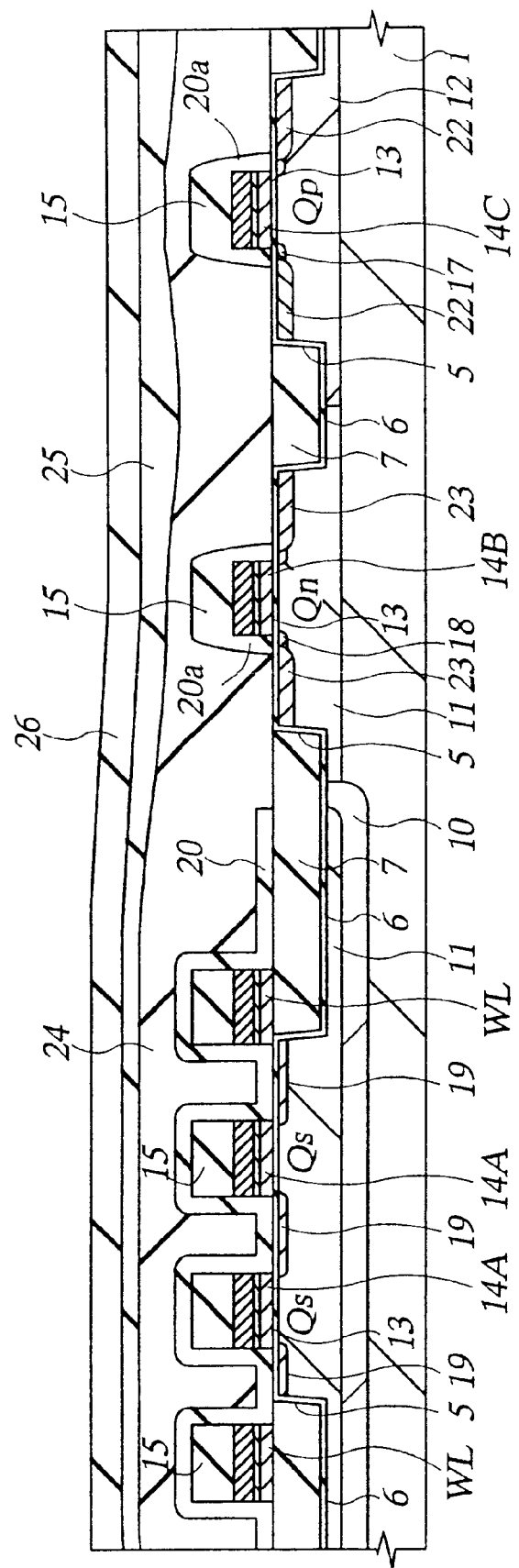
FIG. 18 is a schematic cross sectional view of the embodiment of DRAM of FIG. 1 in a still subsequent step of manufacturing it.

Then, as shown in FIG. 18, another silicon oxide film 26 is deposited on the silicon oxide film 25 to a film thickness of about 100 nm. The silicon oxide film 26 is used to repair the fine damages on the surface of the silicon oxide film 25 that can be given rise to when it is polished by CMP. The silicon oxide film 26 may typically be formed by plasma CVD using a source gas of ozone ($O_3$) and tetraethoxysilane (TEOS). The silicon oxide film 26 on the silicon oxide film 25 may be replaced by a deposited PSG (phosphor-silicate glass) film.

Figure 19:
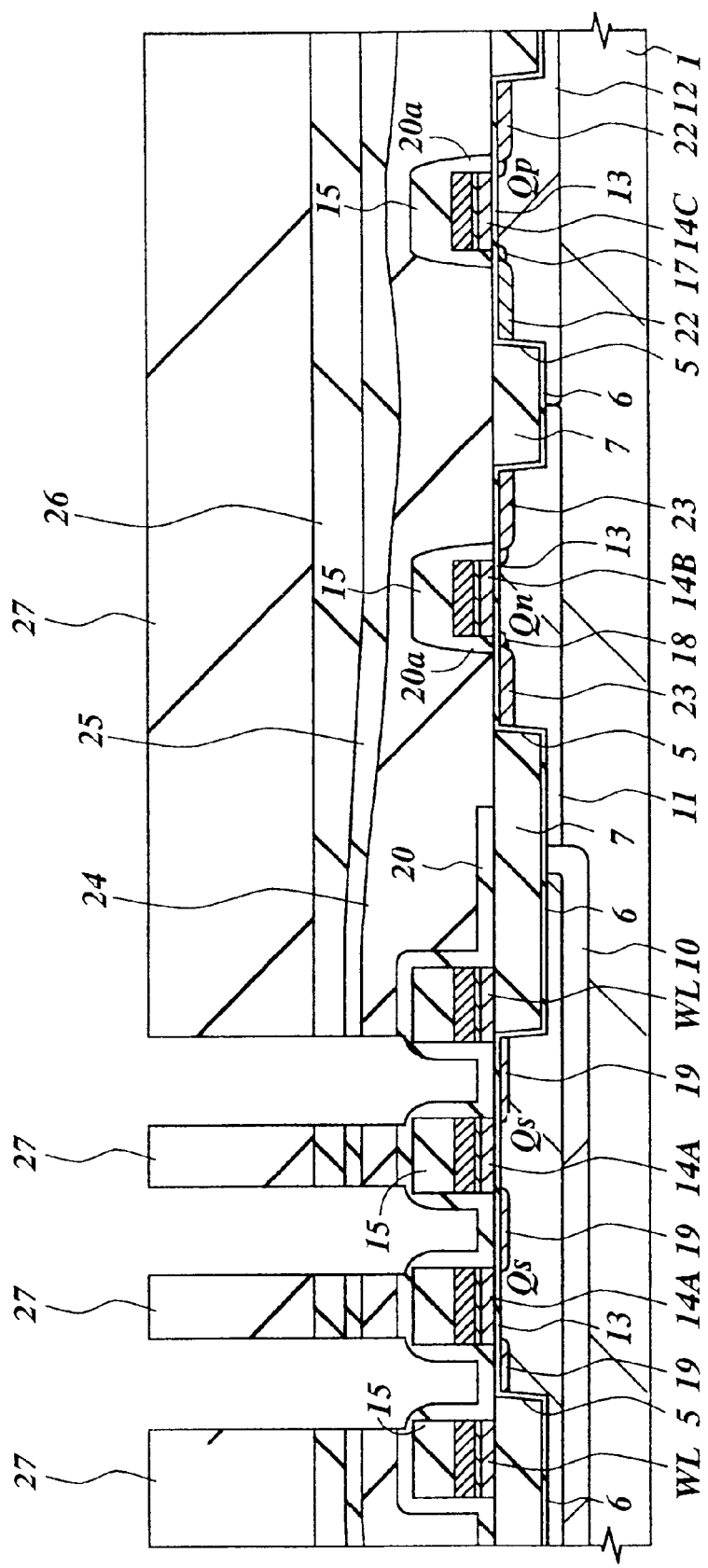
FIG. 19 is a schematic cross sectional view of the embodiment of DRAM of FIG. 1 in a still subsequent step of manufacturing it.

Thereafter, as shown in FIG. 19, the silicon oxide films 26, 25 and the SOG film 24 on the n-type semiconductor regions 19 (source/drain) of the memory cell selecting MISFETs Qs are removed by dry etching using the photoresist film 27 as mask. The etching operation is conducted under a condition that can raise the rate of etching the silicon oxide films 25, 25 and the SOG film 24 relative to the silicon nitride film 20 so that the silicon nitride film 20 covering the n-type semiconductor regions 19 and the device isolation trenches 5 may not be completely removed.

Note that, in FIG. 19, the surface of the silicon oxide film 26 and that of the resist film 27 in reality shows a stepped profile to reflect the surface profile of the silicon oxide film 25 of the peripheral circuit regions as shown in FIG. 18, although the stepped profile is not clearly illustrated in FIG. 19.

Figure 20:
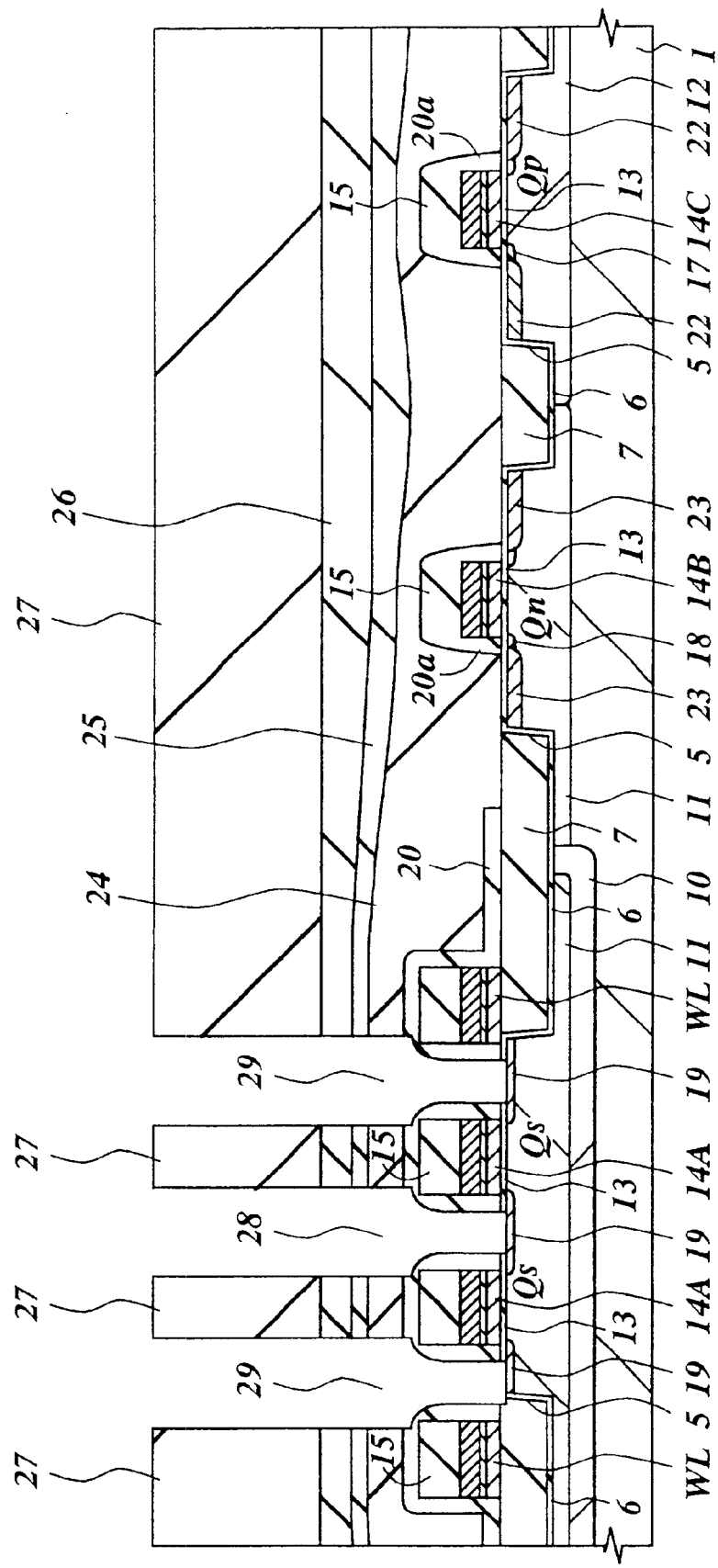
FIG. 20 is a schematic cross sectional view of the embodiment of DRAM of FIG. 1 in a still subsequent step of manufacturing it.

Then, as shown in FIG. 20, contact holes 28 are formed on either the sources or the drains of the n-type semiconductor regions 19 (source/drain) whereas contact holes 29 are formed on the drains or the sources, whichever appropriate, of the regions 19 by removing the silicon nitride film 20 and the gate oxide film 13 from the top of the n-type semiconductor regions 19 (source/drain) of the memory cell selecting MISFETs Qs by dry etching, using the photoresist film 27 as mask.

The etching operation is conducted under a condition that can raise the rate of etching the silicon nitride film 15 relative to the silicon oxide film (the gate oxide film 13 and the silicon oxide film 7 in the device isolation trenches 5) so that the n-type semiconductor regions 19 and the silicon oxide film 7 in the device isolation trenches 5 may not be scraped seriously. Additionally, the etching operation is conducted under a condition where the silicon nitride film 20 is anisotropically etched so that the silicon nitride film 20 may be left on the lateral walls of the gate electrodes 14A (word lines WL) As a result, contact holes 28, 29 having a diameter less than the limit of resolution of the photolithography technique are formed in a self-aligning fashion relative to the gate electrodes 14A (word lines WL). The contact holes 28, 29 can alternatively be produced in a self-aligning manner relative to the gate electrodes 14A (word lines WL) by anisotropically etching the silicon nitride film 20 in advance and forming side wall spacers on the lateral walls of the gate electrodes 14A (word lines WL).

Then, after removing the photoresist film 27, the residue left on the exposed surface areas of the semiconductor substrate on the bottom of the contact holes 28, 29 including the dry etching residue and the photoresist residue is removed by means of etching solution typically containing a mixture of fluoric acid and ammonium fluoride. In the course of this etching operation, the SOG film 24 on the lateral walls of the contact holes 28, 29 may also be exposed to the etching solution but the lateral walls of the contact holes 28, 29 will not be significantly undercut by the wet etching operation because the SOG film 24 shows a reduced etching rate relative to any etching solution that contains fluoric acid because of the above described sintering operation conducted at about 800° C. Thus, any possible occurrence of short-circuited plugs to be buried in the contact holes 28, 29 in the next step can be reliably prevented.

Figure 21:
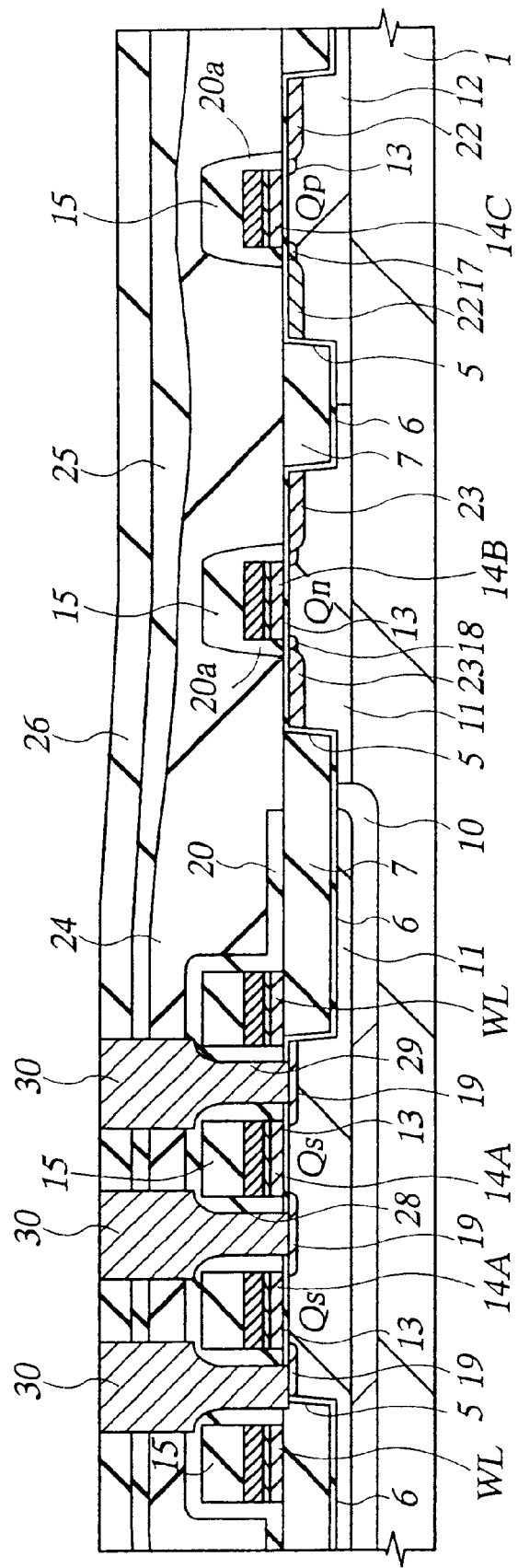
FIG. 21 is a schematic cross sectional view of the embodiment of DRAM of FIG. 1 in a still subsequent step of manufacturing it.

Then, as shown in FIG. 21, plugs 30 are formed inside the contact holes 28, 29. More specifically, the plugs 30 are formed by depositing a poly-crystalline silicon film doped with an n-type impurity substance (e.g., P (phosphor)) on the silicon oxide film 26 by CVD and then removing the poly-crystalline silicon film by CMP so that it may be left only in the contact holes 28, 29.

Figure 22:
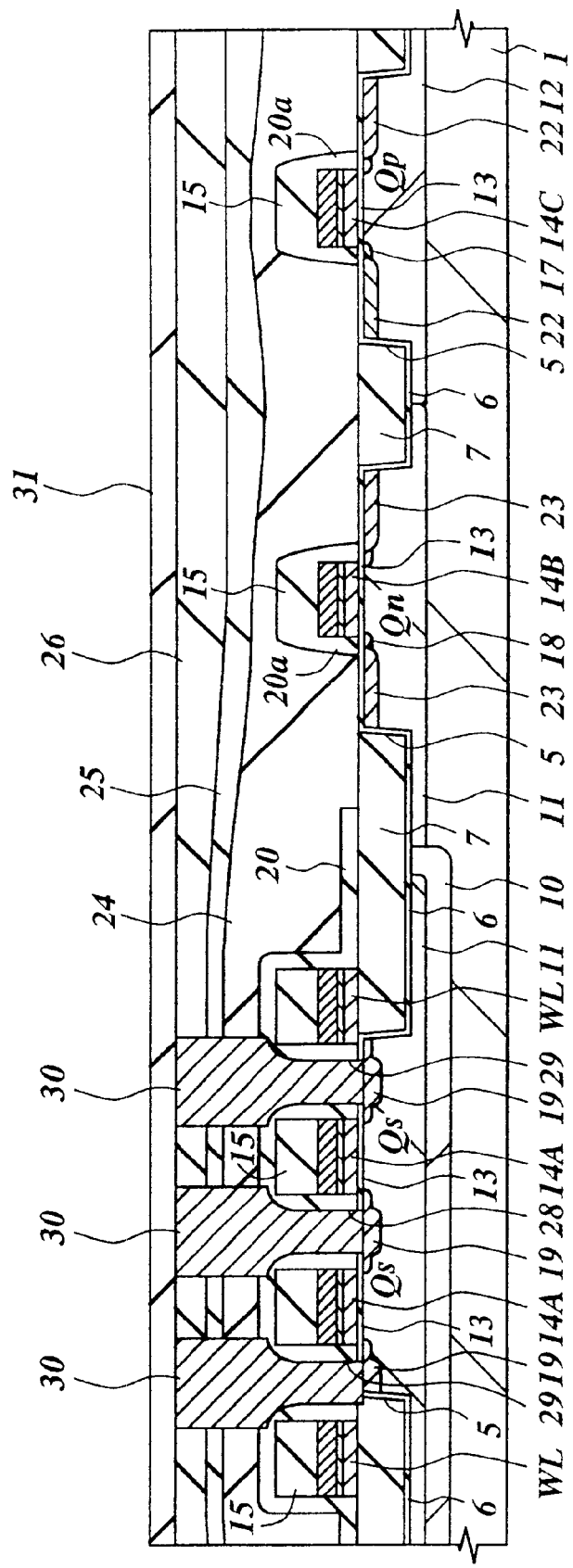
FIG. 22 is a schematic cross sectional view of the embodiment of DRAM of FIG. 1 in a still subsequent step of manufacturing it.

Then, after depositing a silicon oxide film 31 on the silicon oxide film 26 to a film thickness of about 200 nm as shown in FIG. 22, the semiconductor substrate 1 is heat treated at about 800° C. More specifically, the silicon oxide film 31 can be deposited by plasma CVD using a source gas typically containing ozone ($O_3$) and tetraethoxysilane (TEOS). As a result of the heat treatment, the n-type impurity contained in the poly-crystalline silicon film of the plugs 30 is diffused from the bottom of the contact holes 28, 29 to the n-type semiconductor regions 19 (source/drain) of the memory cell selecting MISFETs Qs to reduce the electric resistance of the n-type semiconductor regions 19.

Figure 23:
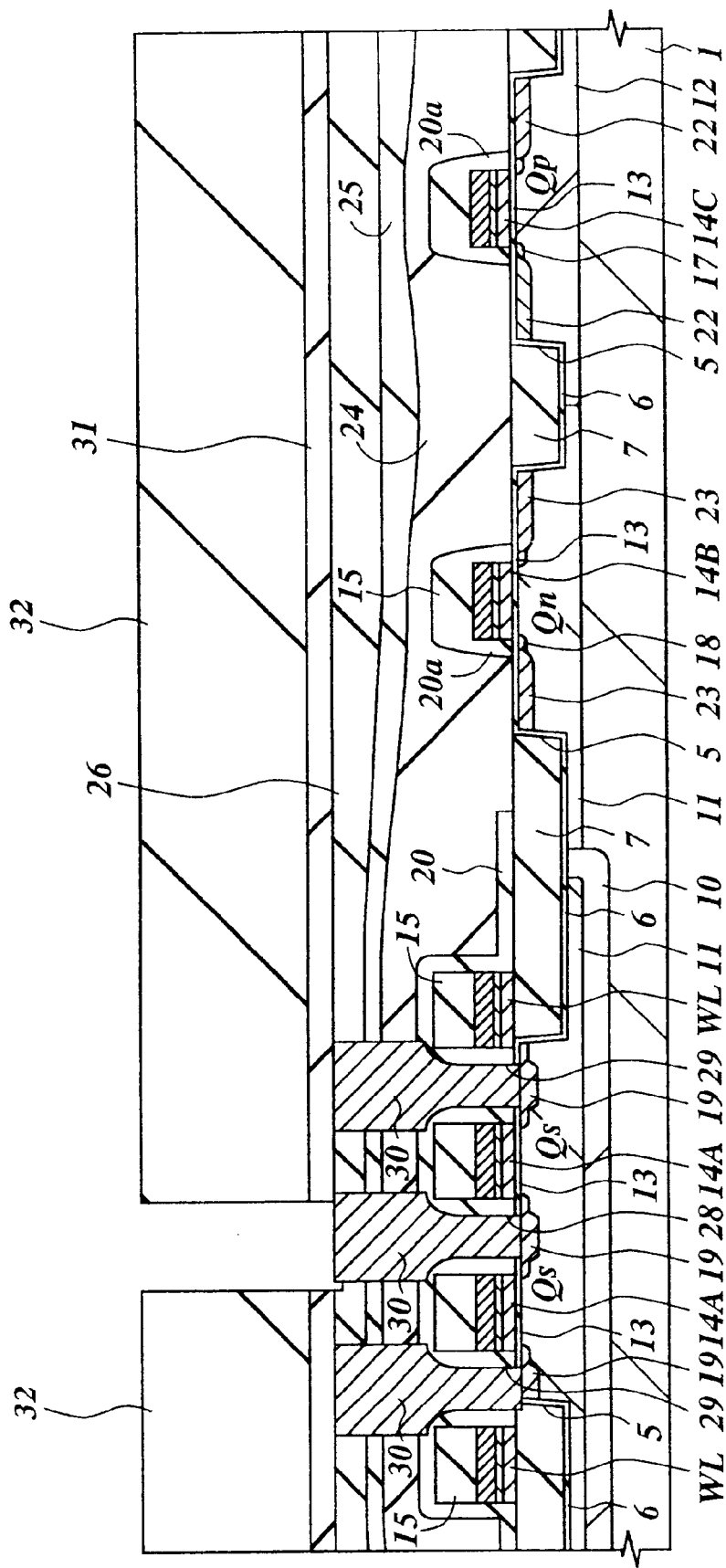
FIG. 23 is a schematic cross sectional view of the embodiment of DRAM of FIG. 1 in a still subsequent step of manufacturing it.
Figure 24:
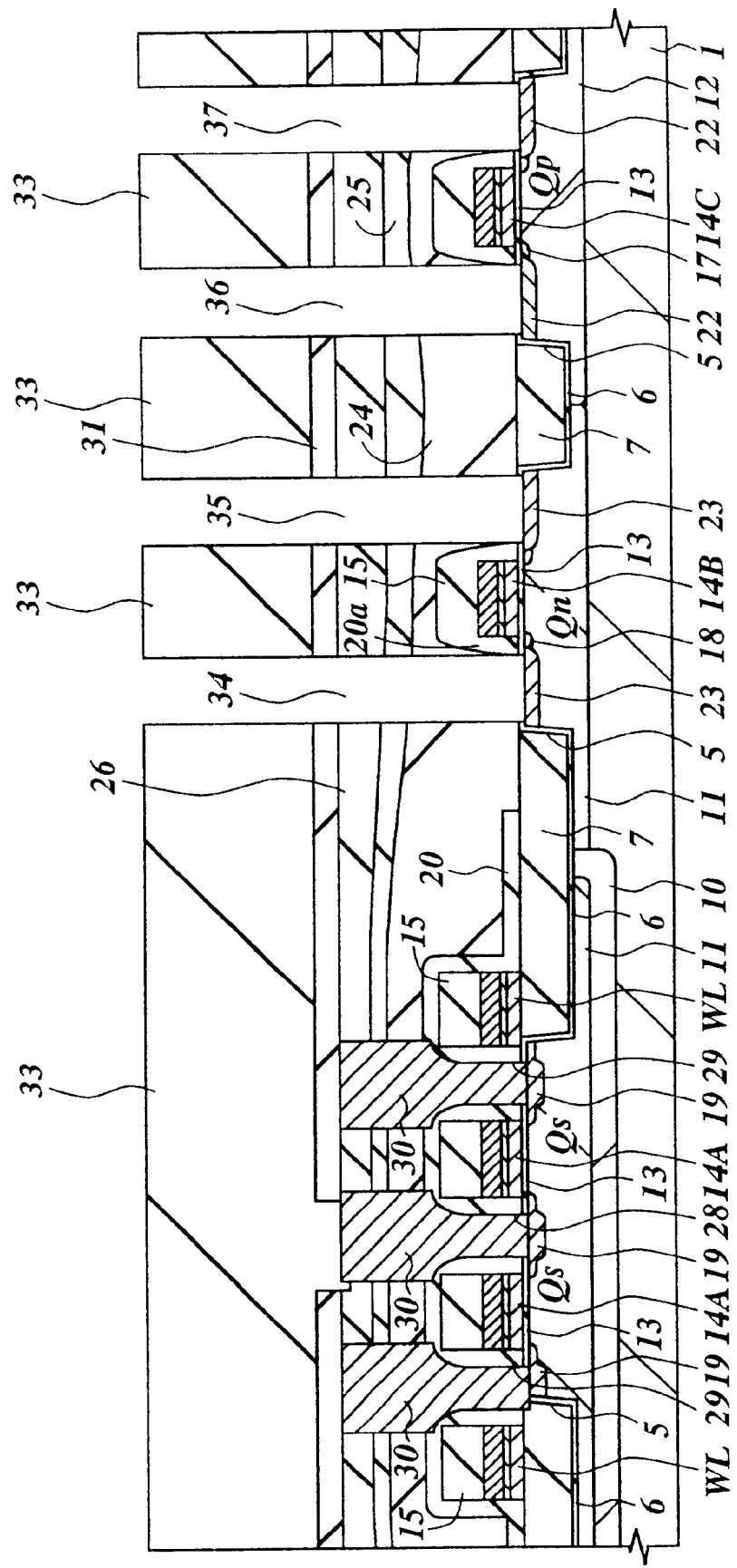
FIG. 24 is a schematic cross sectional view of the embodiment of DRAM of FIG. 1 in a still subsequent step of manufacturing it.

Then, as shown in FIG. 23, the silicon oxide film 31 on the top of the contact holes 28 is removed by dry etching using the photoresist film 32 as mask to expose the surface of the plugs 30. After removing the photoresist film 32, the silicon oxide films 31, 26, 25, the SOG film 24 and the gate oxide film 13 are removed by dry etching using the photoresist film 33 as mask to produce contact holes 34, 35 on the $n^+$-type semiconductor regions 23 (source/drain) of the n-channel type MISFETs Qn and also contact holes 36, 37 on the $p^+$-type semiconductor regions 22 (source/drain) of the p-channel type MISFETs Qp.

Figure 25:
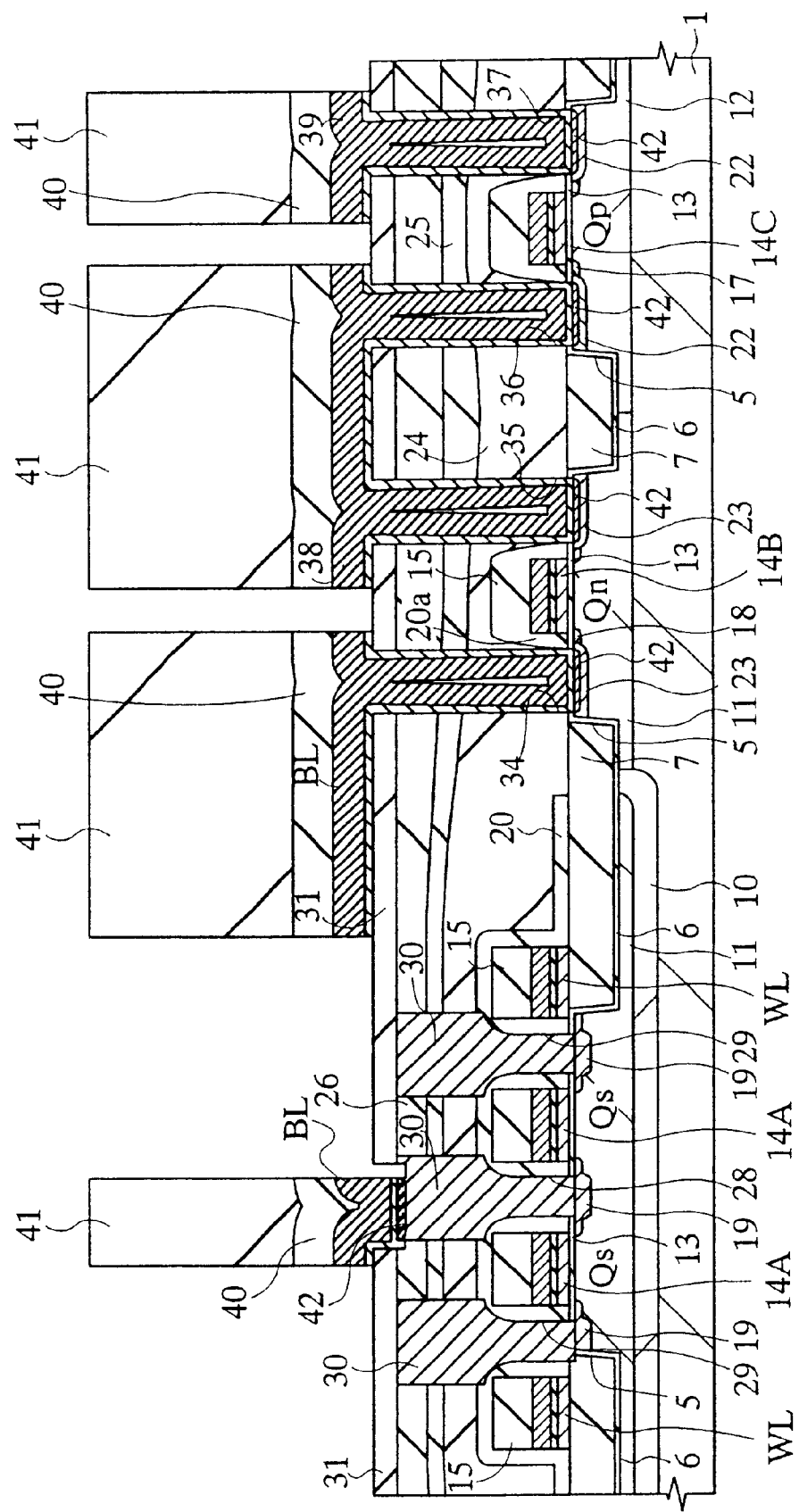
FIG. 25 is a schematic cross sectional view of the embodiment of DRAM of FIG. 1 in a still subsequent step of manufacturing it.
Figure 26:
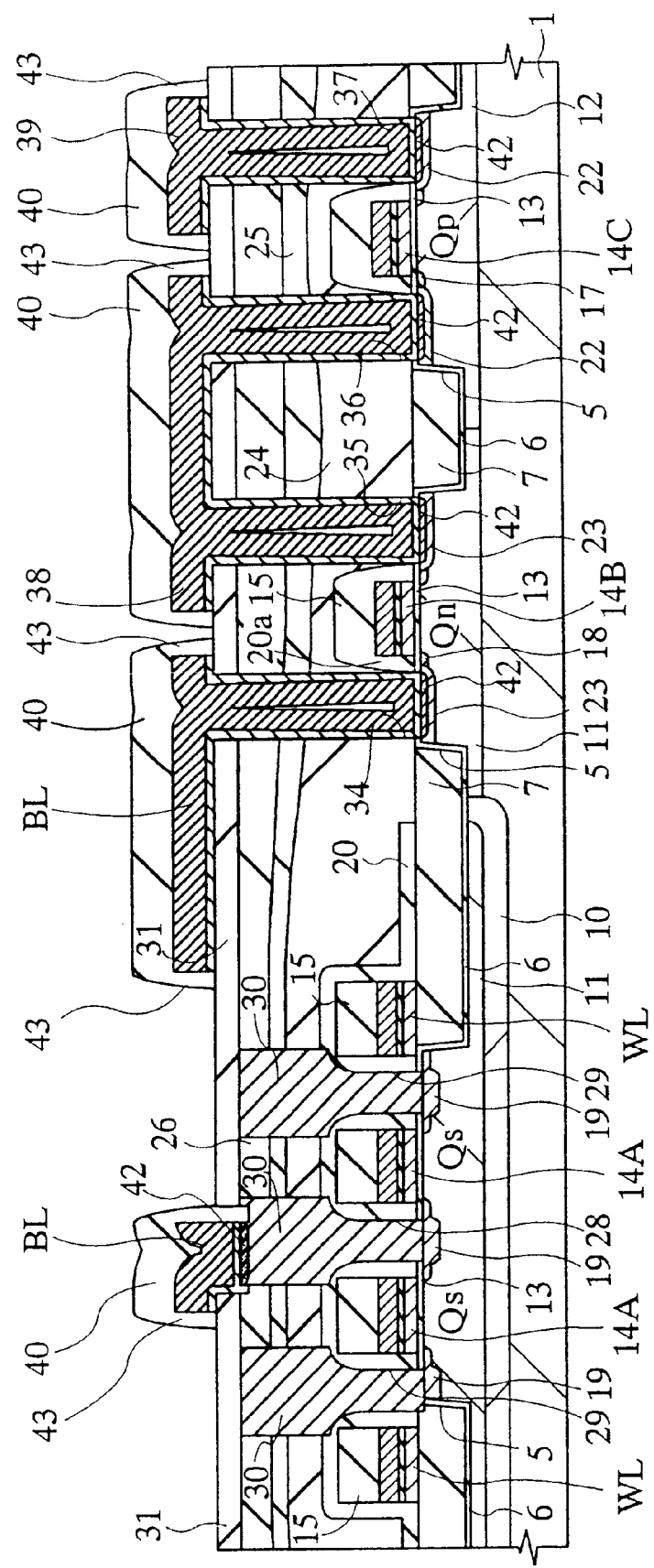
FIG. 26 is a schematic cross sectional view of the embodiment of DRAM of FIG. 1 in a still subsequent step of manufacturing it.

After removing the photoresist film 33, bit lines BL and first layer wires 38, 39 of the peripheral circuits are formed on the silicon oxide film 31 as shown in FIG. 25. More specifically, the bit lines BL and the first layer wires 38, 39 are formed firstly by depositing a Ti film on the silicon oxide film 31 to a film thickness of about 50 nm by sputtering, then heat treating the semiconductor substrate 1 at about 800° C., thereafter depositing a TiN film on the Ti film to a film thickness of about 50 nm and further depositing a W film and a silicon nitride film 40 thereon to respective film thickness of about 150 nm and about 200 nm by CVD before patterning the film deposits, using the photoresist film 41 as mask.

As the Ti film is deposited on the silicon oxide film 31 and the semiconductor substrate 1 is heat treated at about 800° C., the Ti film and the underlying Si substrate react with each other to produce a $TiSi_2$ (titanium silicide) layer 42 on the surface of the $n^+$-type semiconductor regions 23 (source/drain) of the n-channel type MISFETs Qn, the $p^+$-type semiconductor regions 22 (source/drain) of the p-channel type MISFETs Qp and the plugs 30 so that consequently the contact resistance of the wires (bit lines BL, the first layer wires 38, 39) connected to the $n^+$-type semiconductor regions 23, the $p^+$-type semiconductor regions 22 and the plugs 30 is reduced. Additionally, as the bit lines BL are formed to show a multilayer structure of W film /TiN film /TiN film, the sheet resistance can be reduced to a level below 2 Ω/□ to improve the data reading/writing rate. Still additionally, as the bit lines BL and the first layer wires 38, 39 of the peripheral circuits can be produced in a single step, the entire process of manufacturing the DRAM can be curtailed significantly. Finally, when the first layer wire (38, 39) of the peripheral circuits and the bit lines BL are formed from a same wiring layer, the aspect ratio of the contact holes (34 through 37) for connecting the MISFETs of the peripheral circuits (n-channel type MISFETs Qn, p-channel type MISFETs Qp) and the first layer wires can be reduced to improve the interconnection reliability of the first layer wires as compared with the case where the first layer wires are formed of Al wires in an upper layer of the memory cells.

The bit lines BL are so arranged as to make the gap separating any adjacently located bit lines greater than their width in order to minimize the parasitic capacity formed between adjacent bit lines and maximize the data reading/writing rate. The gap separating adjacently located bit lines will be typically about 0.24 μm and the width of each bit line will be about 0.22 μm.

Then, after removing the photoresist film 41, side wall spacers 43 are formed on the lateral walls of the bit lines BL and those of the first layer wires 38, 39. More specifically, the side wall spacers 43 are formed by depositing a silicon nitride film on the bit lines BL and the first layer wires 38, 39 by CVD and thereafter anisotropically etching the silicon nitride film.

Figure 27:
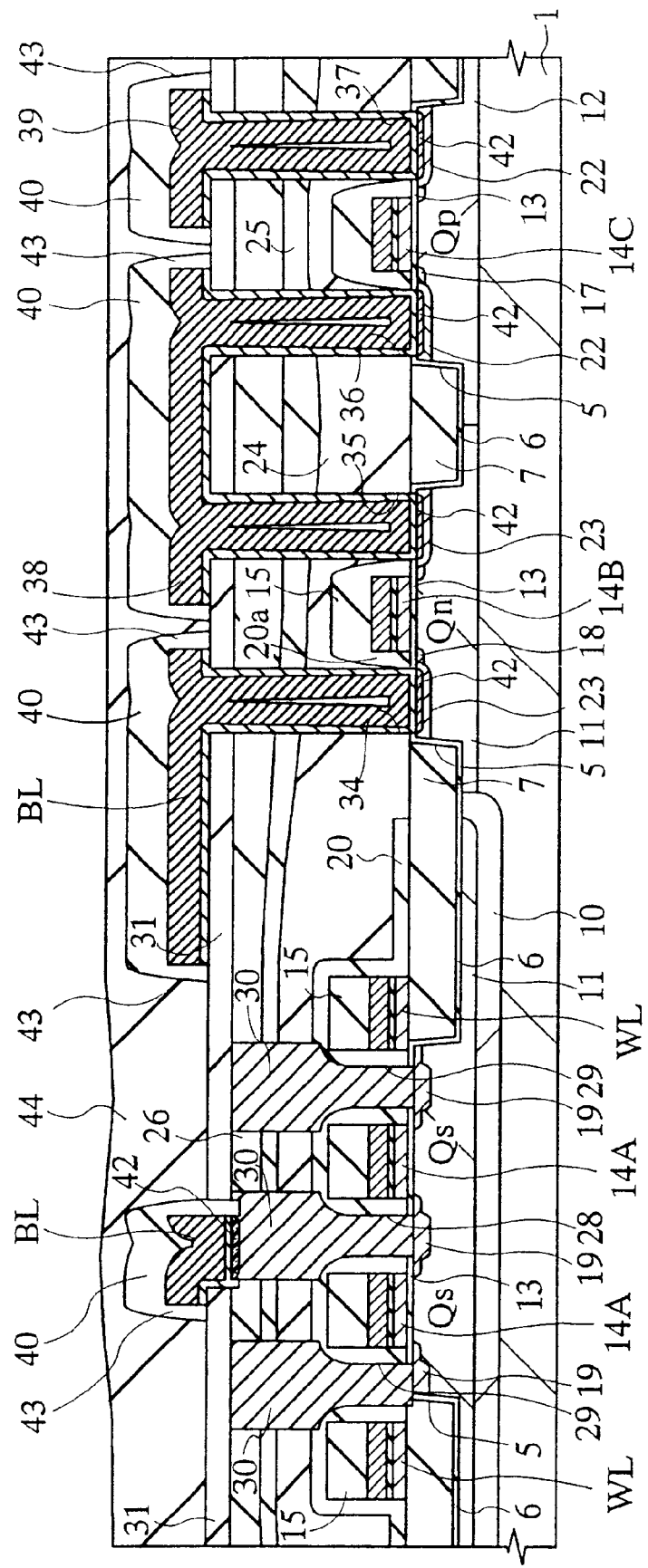
FIG. 27 is a schematic cross sectional view of the embodiment of DRAM of FIG. 1 in a still subsequent step of manufacturing it.

Then, as shown in FIG. 27, an SOG film 44 is formed on the bit lines BL and the first layer wires 38, 39 to a film thickness of about 300 nm by spin coating. Subsequently, the semiconductor substrate 1 is heat treated at 800° C. for about 1 minute to sinter the SOG film 44.

Since an SOG film 44 is more reflowable than a BPSG film and more adapted to filling fine gaps that separate wires, they can advantageously be used to fill the gaps of the bit lines BL of a DRAM according to the invention that are reduced practically to the limit of resolution of the photolithography technique. Additionally, since the SOG film 44 can provide a high reflowability without a long heat treatment at high temperature unlike a BPSG film, it effectively suppresses the thermal diffusion of the impurities contained in the sources/drains of the memory cell selecting MISFETs Qs formed below the bit lines BL, the sources/drains of the MISFETs (n-channel type MISFETs Qn, p-channel type MISFETs Qp) of the peripheral circuits to make it possible to realize shallow junctions. Still additionally, since the SOG film can suppress any possible degradation of the metal film (W film) of the gate electrodes 14A (word lines WL) and the gate electrodes 14B, 14C, it improves the performance of the memory cells of the DRAM and the MISFETs of the peripheral circuits. Finally, it can suppress any possible degradation of the Ti film, the TiN film and the W film of the word lines WL and the first layer wires 38, 39 to maintain their electric resistance to a low level.

Figure 28:
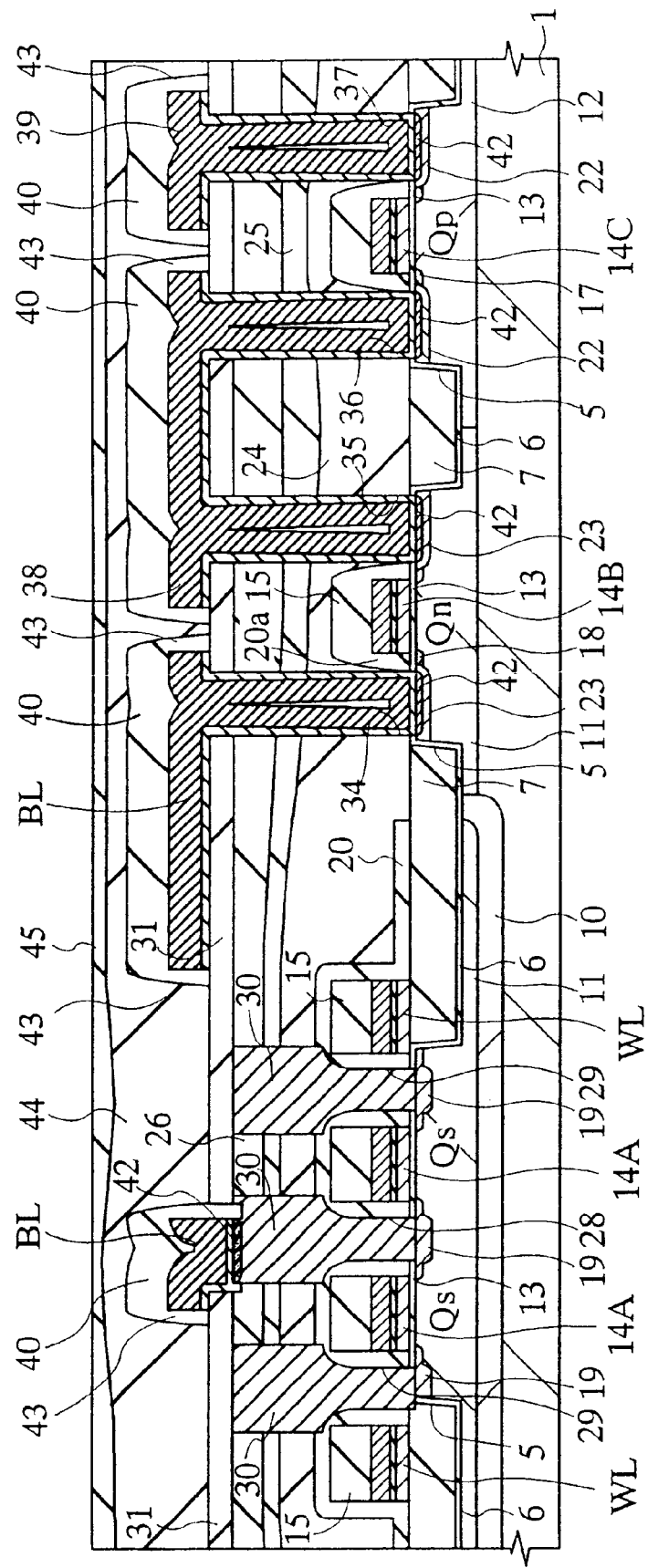
FIG. 28 is a schematic cross sectional view of the embodiment of DRAM of FIG. 1 in a still subsequent step of manufacturing it.

Then, after depositing a silicon oxide film 45 on the SOG film 44 to a film thickness of about 600 nm as shown in FIG. 28, the surface of the deposited silicon oxide film 44 is planarized by polishing it by means of a CMP technique. More specifically, the silicon oxide film 45 is deposited by plasma CVD using a source gas of ozone ($O_3$) and tetraethoxysilane (TEOS).

Thus, with the above described embodiment, an SOG film 44 that can be excellently planarized immediately after the film formation is formed on the bit lines BL and the first layer wires 38, 39 and the silicon oxide film 45 formed thereon is planarized by CMP. As a result, the fine gaps separating the bit lines BL can be satisfactorily filled and the insulator film on the bit lines BL and the first layer wires 38, 39 can be sufficiently planarized. Additionally, since no prolonged high temperature heat treatment is involved in the manufacturing process, the memory cells and the MISFETs of the peripheral circuits are safely protected against degradation of their performance and, at the same time, the electric resistance of the bit lines BL and the first layer wires 38, 39 is held low.

Figure 29:
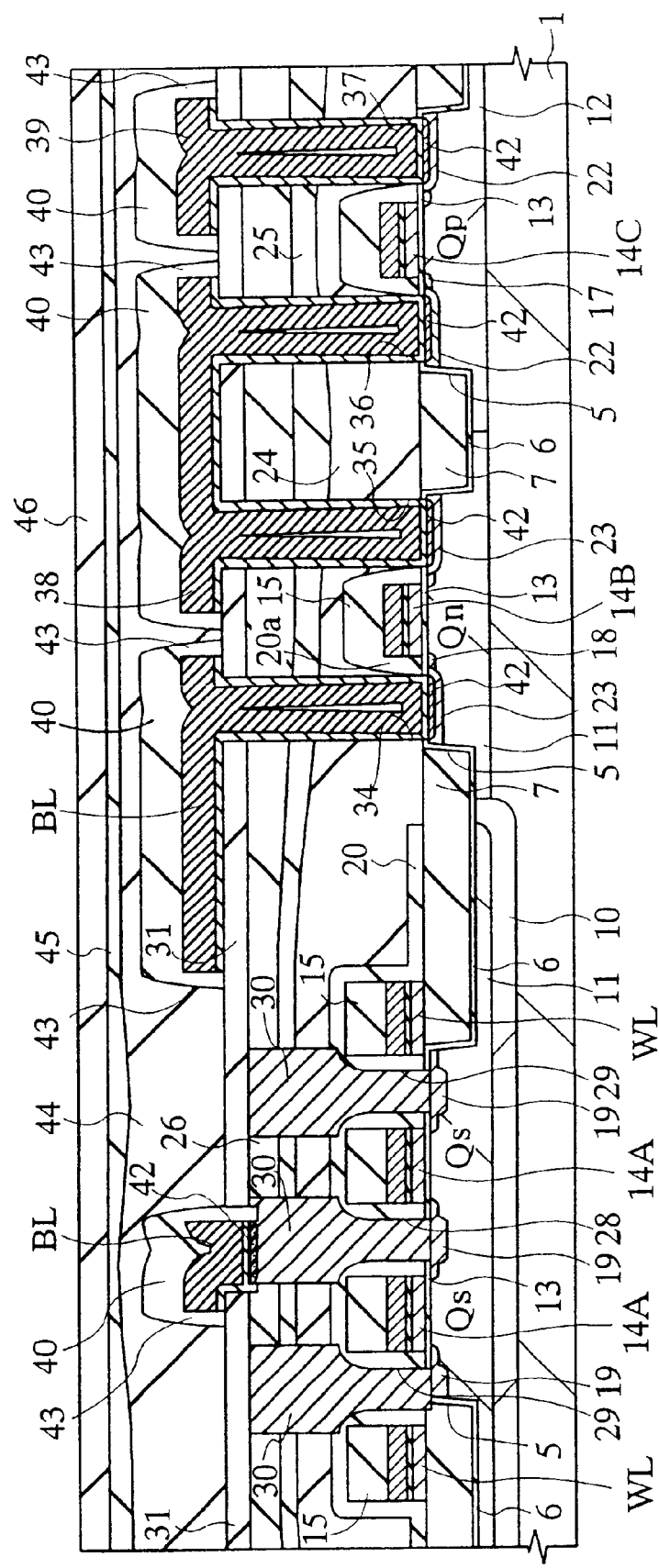
FIG. 29 is a schematic cross sectional view of the embodiment of DRAM of FIG. 1 in a still subsequent step of manufacturing it.

Then, as shown in FIG. 29, another silicon oxide film 46 is deposited on the silicon oxide film 45 to a film thickness of about 100 nm. The silicon oxide film 46 is used to repair the fine damages on the surface of the silicon oxide film 45 that can be given rise to when it is polished by CMP. The silicon oxide film 46 is typically formed by plasma CVD using a source gas of ozone ($O_3$) and tetraethoxysilane (TEOS).

Figure 30:
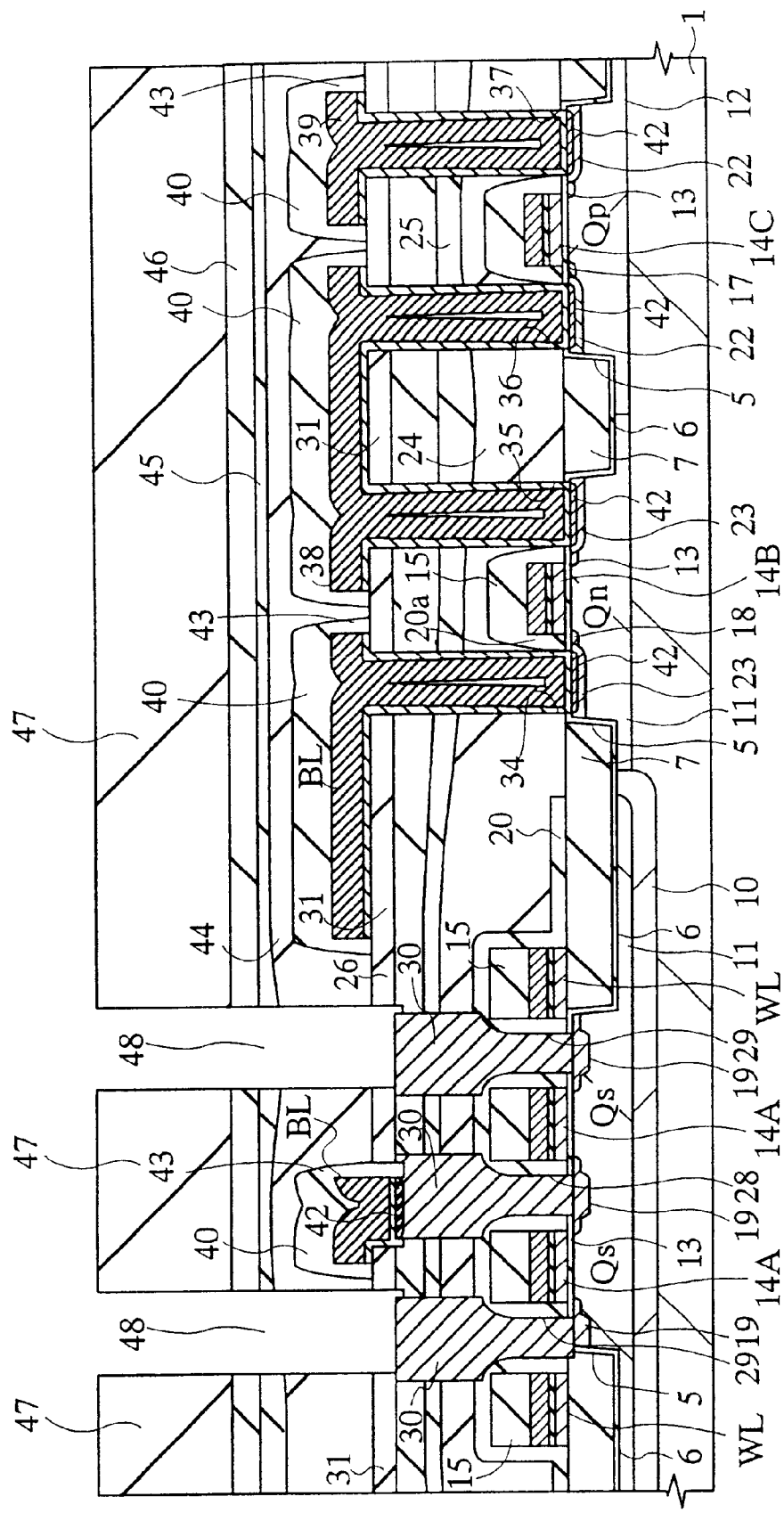
FIG. 30 is a schematic cross sectional view of the embodiment of DRAM of FIG. 1 in a still subsequent step of manufacturing it.

Thereafter, as shown in FIG. 30, the silicon oxide films 46, 45, the SOG film 44 and the silicon oxide film 31 on the contact holes 29 are removed by dry etching using the photoresist film 47 as mask to produce through holes 48 that get to the surface of the respective plugs 30. This etching operation is conducted under a condition that can reduce the rate of etching the silicon nitride film relative to the silicon oxide films 46, 45, 31 and the SOG film 44 so that the silicon nitride film 40 on the bit lines BL and the side wall spacers 43 may not be scraped too much if the through holes 48 and the bit lines BL are miss-aligned. As a result, the through holes 48 are produced in a self-aligning fashion relative to the bit lines BL.

Then, after removing the photoresist film 47, the residue left on the surface areas of the plugs 30 exposed on the bottom of the through holes 48 including the dry etching residue and the photoresist residue is removed by means of etching solution typically containing a mixture of fluoric acid and ammonium fluoride. In the course of this etching operation, the SOG film 44 exposed on the lateral walls of the through holes 48 may also be exposed to the etching solution but the lateral walls of the through holes 48 will not be significantly undercut by the wet etching operation because the SOG film 44 shows a reduced etching rate relative to any etching solution that contains fluoric acid because of the above described sintering operation conducted at about 800° C. Thus, any possible occurrence of short-circuited plugs to be buried in the through holes 48 in the next step and the bit lines BL can be reliably prevented. Additionally, since the plugs and the bit lines BL are separated from each other sufficiently, any possible increase in the parasitic capacity of the bit lines BL can also be effectively suppressed.

Figure 31:
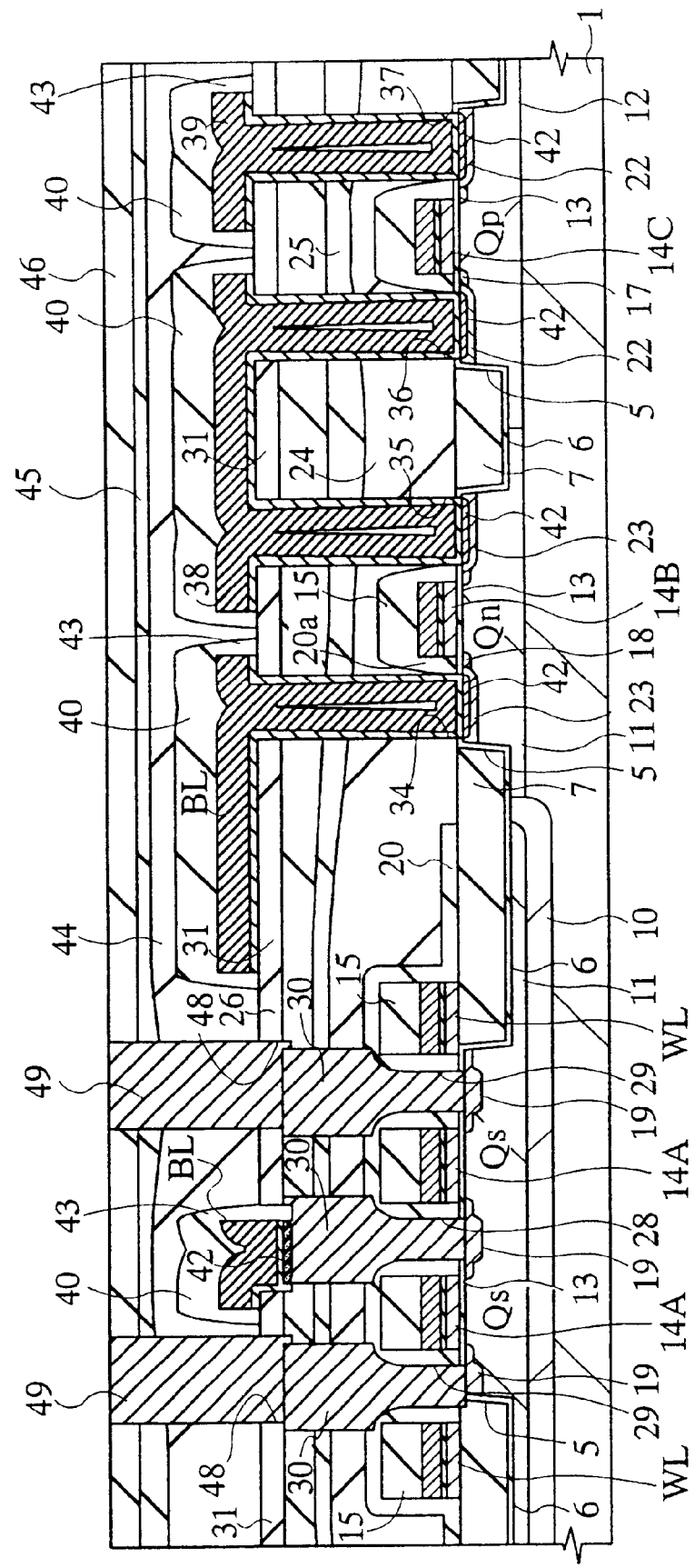
FIG. 31 is a schematic cross sectional view of the embodiment of DRAM of FIG. 1 in a still subsequent step of manufacturing it.

Then, as shown in FIG. 31, plugs 49 are formed inside the contact holes 48. More specifically, the plugs 49 are formed by depositing a poly-crystalline silicon film doped with an n-type impurity substance (e.g., P (phosphor)) on the silicon oxide film 66 by CVD and then removing the poly-crystalline silicon film by etching back so that it may be left only in the contact holes 48.

Figure 32:
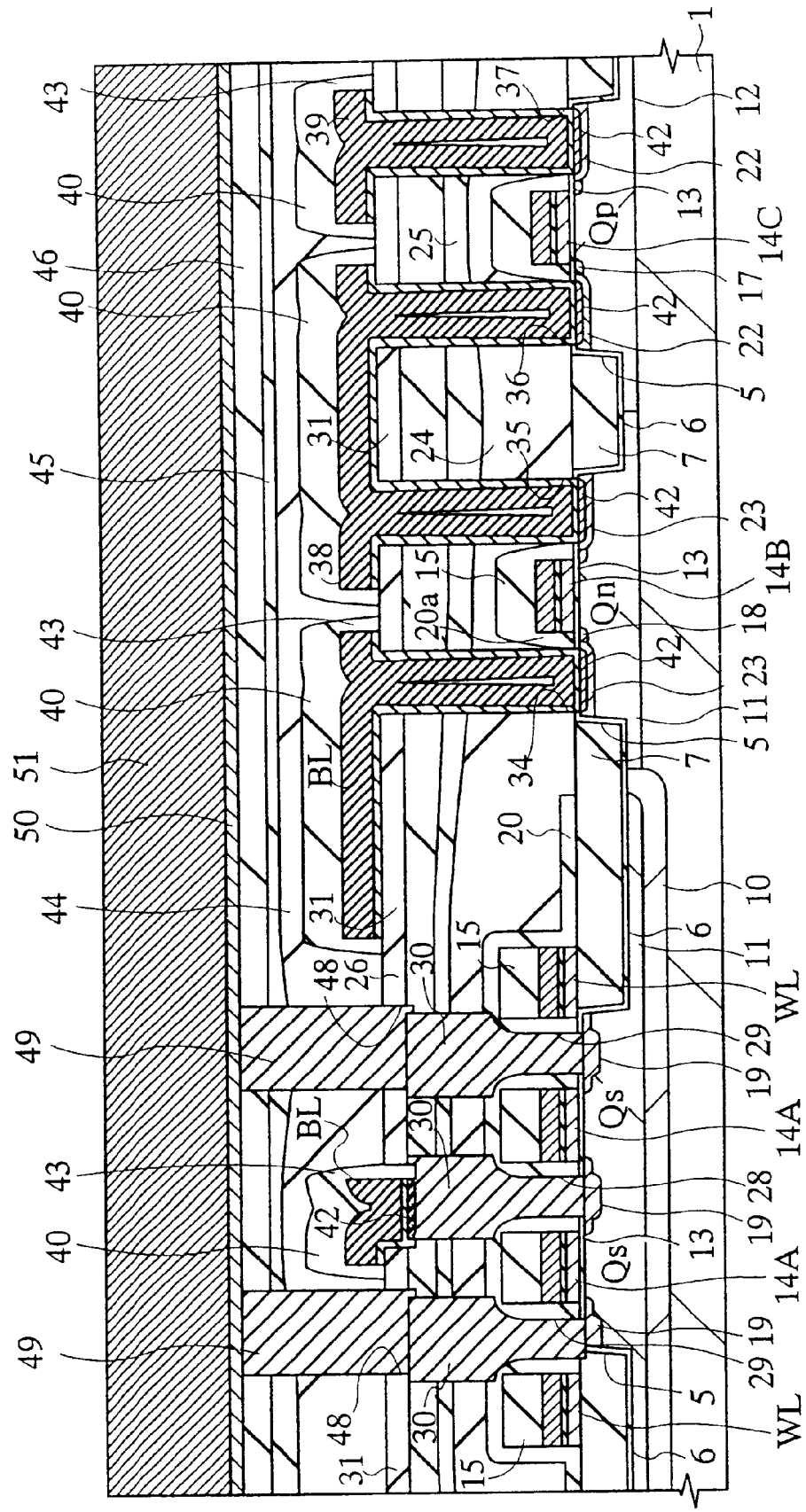
FIG. 32 is a schematic cross sectional view of the embodiment of DRAM of FIG. 1 in a still subsequent step of manufacturing it.

Then, as shown in FIG. 32, a titanium nitride film 50 and a ruthenium dioxide ($RuO_2$) film 51 are deposited on the plugs 49 and silicon oxide film 46. The titanium nitride film 50 and the ruthenium dioxide film 51 are used to produce a blocking layer and lower electrodes in a subsequent step. The titanium nitride film 50 may have a film thickness of about several to 50 nm. On the other hand, the ruthenium dioxide film 51 may typically have a film thickness of 0.5 $\mu$m, although this value is used to define the height of the lower electrodes as will be described hereinafter and therefore can be regulated as a function of the surface area of and hence the capacity to be realized for the lower electrodes.

The titanium nitride film 50 can be formed by sputtering or CVD.

The ruthenium dioxide film 51 can be deposited by sputtering using a target of ruthenium dioxide ($RuO_2$). Unlike a process of depositing a ruthenium (Ru) film using a target of metal ruthenium and subsequently oxidizing the film to produce a ruthenium oxide film, the surface of the ruthenium dioxide film 51 formed by using ruthenium dioxide ($RuO_2$) as starting material can be highly planarized as shown by (b) in FIG. 38. With such a method of producing a ruthenium dioxide film 51, it is possible to realize a surface roughness of less than 1 nm as expressed in terms of center line average roughness (Ra). As a result, it is possible to reduce the surface roughness (Ra) of the lower electrodes and improve the planeness of the surface in order to improve the withstand voltage of the capacitor insulator and also the reliability of the information storage capacitors as will be discussed hereinafter.

FIG. 38 is photographic views of two specimens of ruthenium dioxide film obtained in an experiment conducted by the inventors of the present invention, showing the surface condition as observed through a scanning electronic microscope, of which (a) is a view of the surface of a ruthenium dioxide film obtained by depositing a metal ruthenium film layer and subsequently oxidizing the film layer and (b) is a view of the surface of a ruthenium dioxide film obtained by sputtering, using ruthenium dioxide ($RuO_2$) as starting material, according to the invention. For the process of depositing a ruthenium dioxide film by sputtering as shown in (b), a DC power source of 0.6 kW, a reaction pressure of 0.5 Pa, an oxygen partial pressure of 0.4 Pa and an argon partial pressure of 0.1 Pa are used. It will be appreciated that, the surface of a ruthenium dioxide film obtained by firstly depositing a metal ruthenium film and subsequently oxidizing the film as illustrated in (a) of FIG. 38 shows a surface roughness of 20 nm or above as expressed in terms of center line average roughness (Ra) with remarkable undulations on the surface when compared with the specimen prepared by a method according to the invention.

When depositing a ruthenium dioxide film 51 by sputtering using a target of ruthenium dioxide, the sputtering operation can be conducted in an oxidizing atmosphere such as an oxygen-containing atmosphere to amend oxygen deficiency, if any, of the ruthenium dioxide film 51. When the sputtering operation is conducted in an oxidizing atmosphere, there may arise a problem of producing a byproduct of silicon oxide as an undesired electric insulator if the surface of the plugs 49 of poly-crystalline silicon film is oxidized. However, such oxidation of the plugs 49 will be effectively prevented from taking place in this embodiment of the invention because the titanium nitride film 50 exists there so that the plugs 49 and the lower electrodes of the information storage capacitors will show a reliable electric interconnection at the interface thereof.

The above described sputtering may be DC (direct current) sputtering or RF (radio frequency) sputtering.

Figure 33:
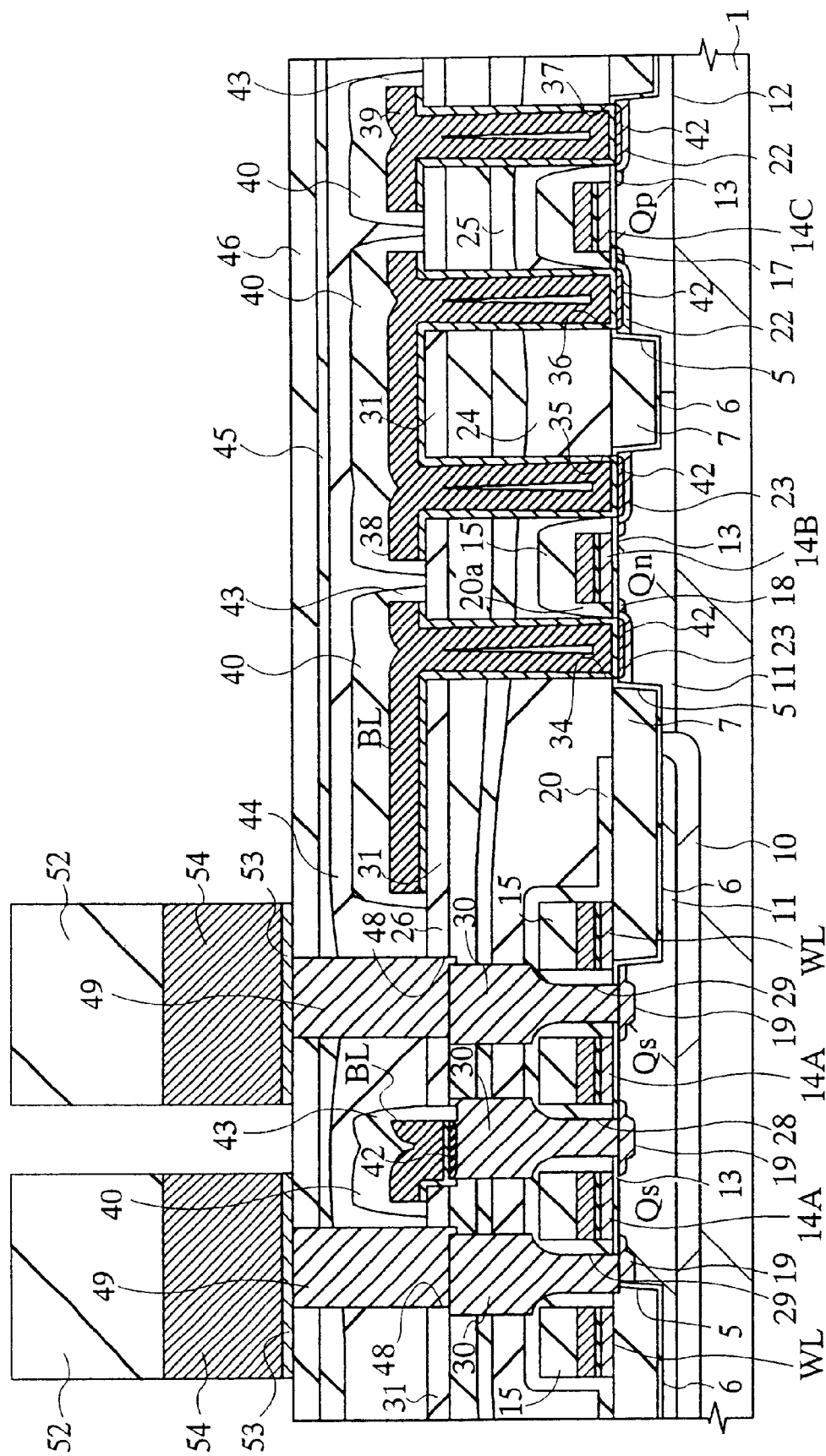
FIG. 33 is a schematic cross sectional view of the embodiment of DRAM of FIG. 1 in a still subsequent step of manufacturing it.
Figure 34:
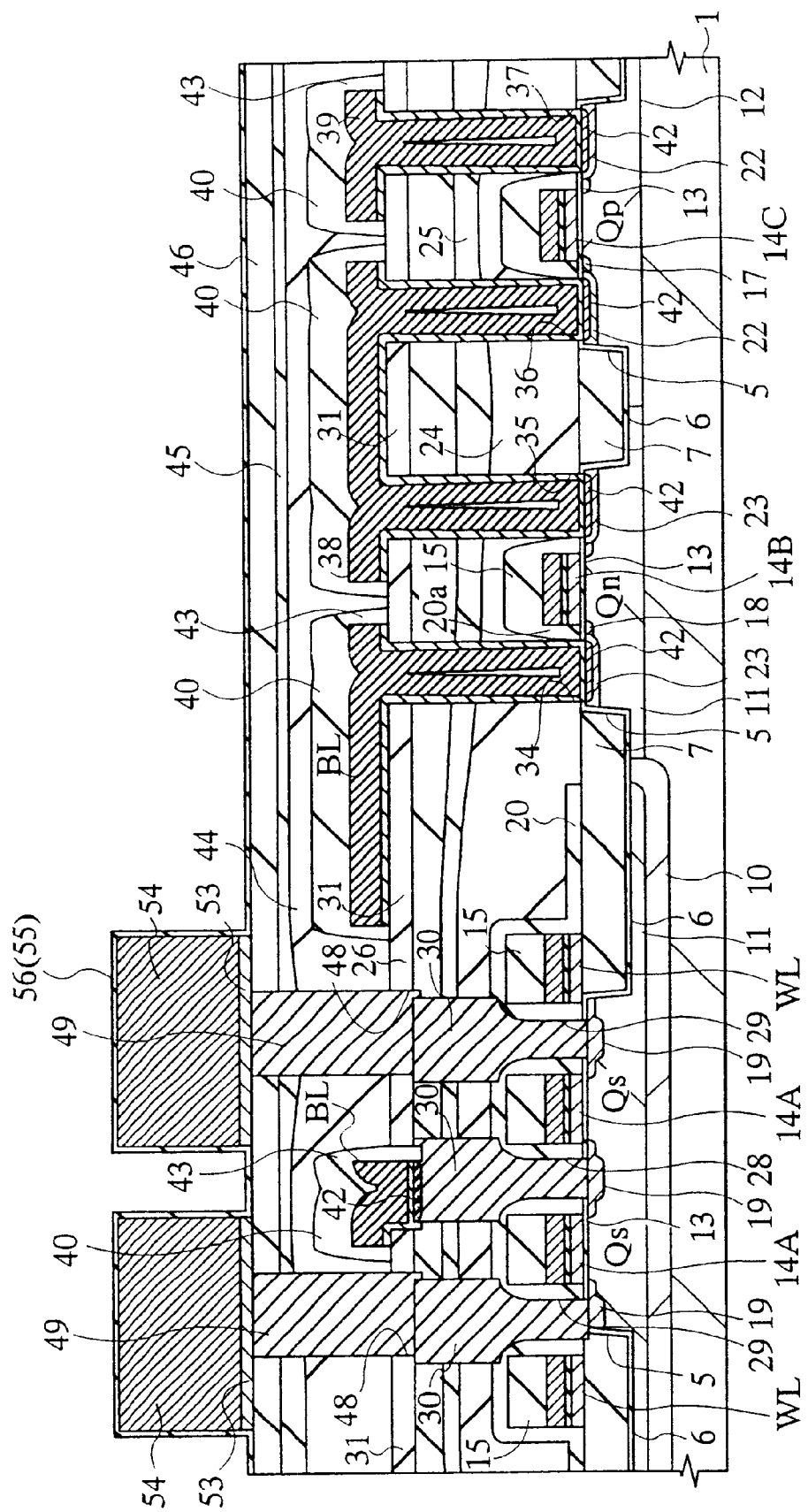
FIG. 34 is a schematic cross sectional view of the embodiment of DRAM of FIG. 1 in a still subsequent step of manufacturing it.

Then, as shown in FIG. 33, a photoresist film 52 is formed on the ruthenium dioxide film 51 and then the ruthenium dioxide film 51 and the titanium nitride film 50 are etched off by means of RIE (reactive ion etching) using the photoresist film 52 as mask. Thus, a blocking layer 53 made of a titanium nitride film 50 and lower electrodes 54 made of a ruthenium dioxide film 51 are produced. The blocking layer 53 operates to prevent oxygen from invading the DRAM in the course of a subsequent step of heat treating the capacitor insulator in an oxidizing atmosphere as will be described hereinafter.

As the lower electrodes 54 are made of ruthenium dioxide film 51, no silicon oxide and other substances having a low dielectric constant will be produced if the lower electrodes 54 are oxidized on the surface in the course of a subsequent step of heat treating the capacitor insulator in an oxidizing atmosphere as will be described hereinafter. Thus, it is now possible to suppress any increase in the effective film thickness of the capacitor insulator and any reduction of the dielectric constant in order to raise the storage capacitance of the information storage capacitors. With such a technology in place, it will be possible to produce information storage capacitors to be feasibly used for manufacturing DRAMs with a storage capacitance of 256 Mbits or more that require extremely fine machining operations.

As described earlier, the lower electrodes 54 of this embodiment of the invention show a profile that is remarkably simple if compared with the crown structure or the fin structure of the lower electrodes of known DRAMs that has to be selected for conventional fine machining. Thus, the process of manufacturing the lower electrodes 54 itself can also be simplified in a manner as described above. As a result of the simplified manufacturing process, the process margin can be improved to raise the manufacturing yield and the reliability of the manufactured DRAMs to a great advantage of the method of manufacturing a semiconductor integrated circuit device according to the invention.

Figure 41:
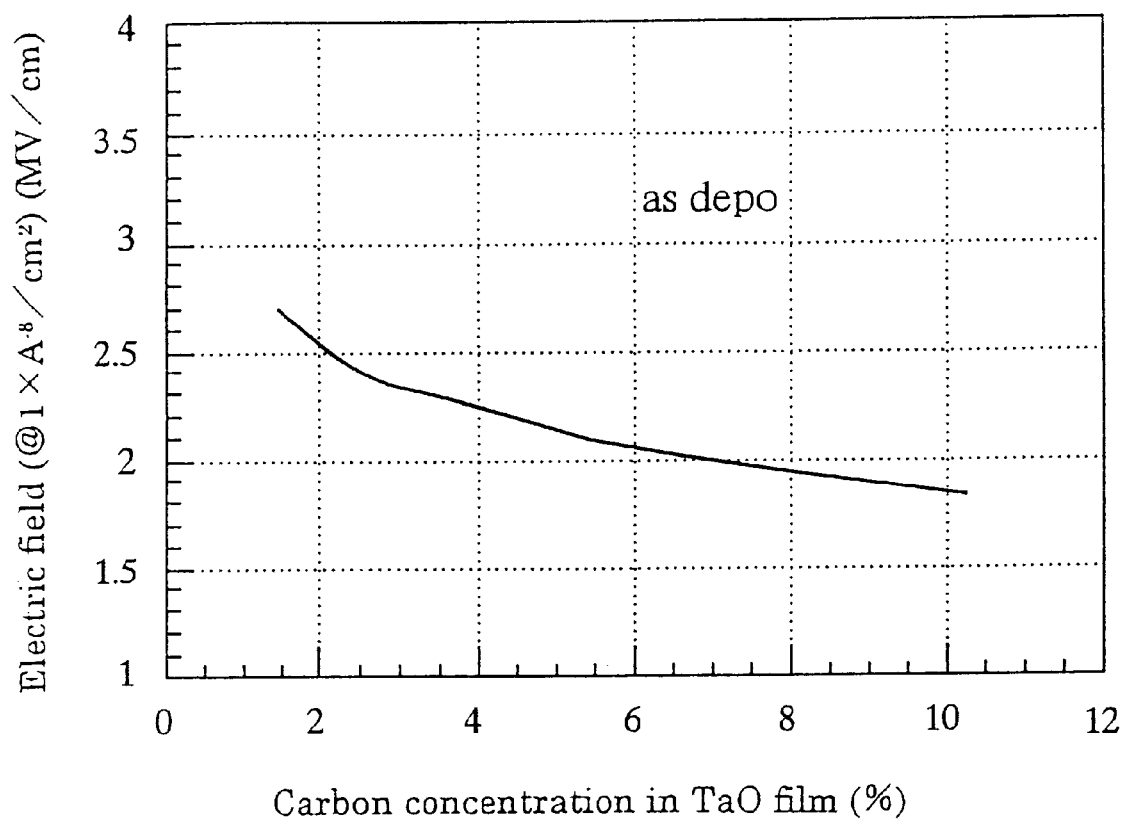
FIG. 41 is a graph showing the relationship between the carbon concentration of tantalum oxide film and the withstand voltage of the film.
Figure 42:
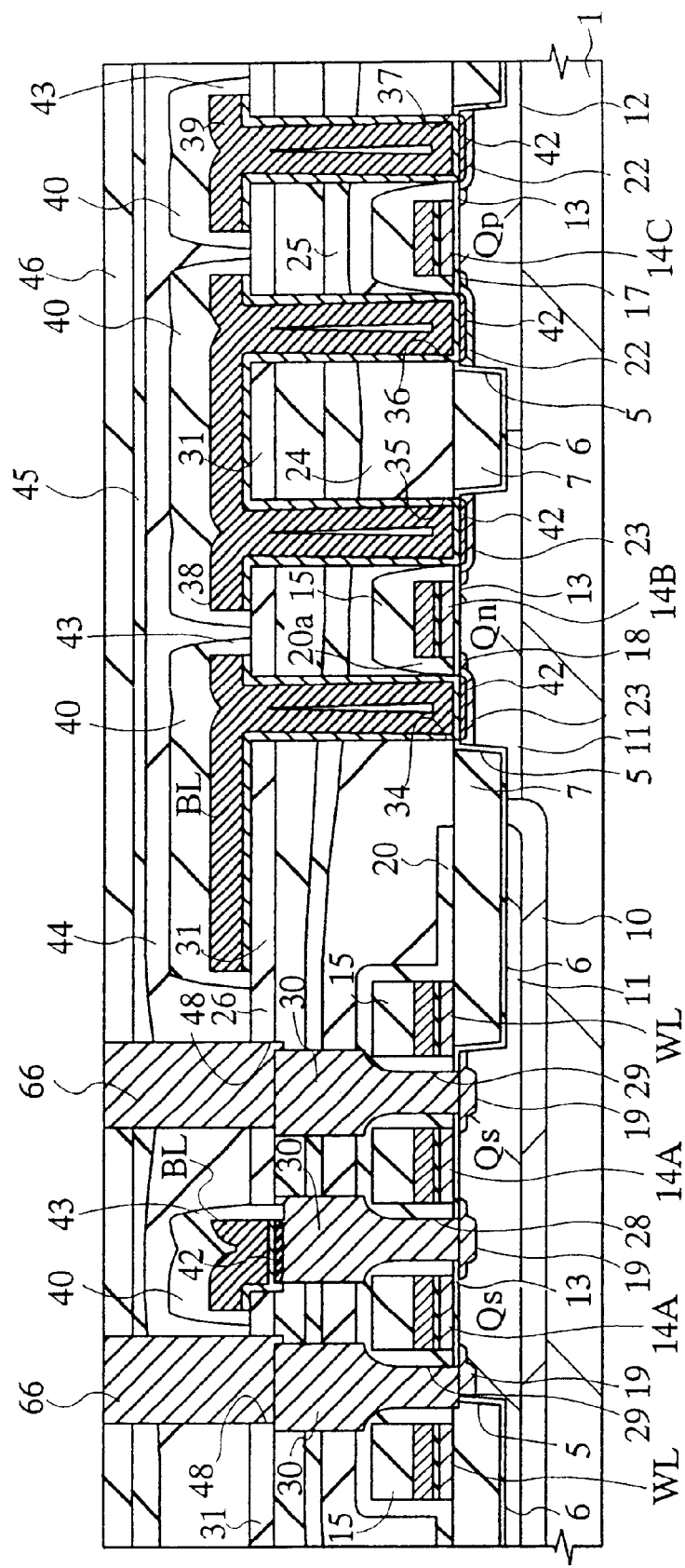
FIG. 42 is a schematic cross sectional view of another embodiment of DRAM according to the invention in a step of manufacturing it.

After removing the photoresist film 52, a tantalum oxide film 55 is formed on the entire surface of the semiconductor substrate 1 to a film thickness of about 10 nm. More specifically, the tantalum oxide film 55 is deposited by thermal CVD under low pressure (e.g., 400 mTorr) at reaction temperature lower than 500° C. (e.g., 450° C.) using a source gas containing pentaalkyltantalum ($Ta(C_nH_{2n+1})_5$) such as $Ta(C_2H_5)_5$ and oxygen ($O_2$). The tantalum oxide film 55 deposited by thermal CVD shows an excellent step coverage effect. Note that the tantalum oxide film 55 is amorphous and hence shows a low dielectric constant in this stage. Additionally, since organic tantalum gas is used for this process, the tantalum oxide film 55 may contain carbon by several %. The existence of carbon can reduce the withstand voltage as shown in FIG. 41 and hence a high carbon concentration is particularly not desirable. From this viewpoint, it is possible to replace $Ta(C_2H_5)_5$ with $Ta(CH_3)_5$ or lower the reaction temperature. Then, the withstand voltage of the capacitor insulator will be improved. Note that the graph of FIG. 41 shows the relationship between the carbon concentration of the tantalum oxide film 55 and the withstand voltage obtained by the inventors of the present invention as a result of a series of experiments and intensive research efforts. Note that the withstand voltage is expressed by using a unit of MV/cm for a leak current of 10 nA/cm$^2$. The graph of FIG. 41 represents the state immediately after the deposition of the tantalum oxide film 55, or the as-deposition state. While the withstand voltage shows an absolute value lower than the level generally required for a device of the type under consideration (e.g., 4 MV/cm), it can be raised by a heat treatment process as will be discussed hereinafter. On the other hand, the effect of a high carbon concentration of lowering the withstand voltage is maintained regardless of heat treatment.

Then, the tantalum oxide film 55 is subjected to a heat treatment process to produce a poly-crystalline tantalum pentoxide ($Ta_2O_5$) film 56. The heat treatment (annealing) of the tantalum oxide film 55 can be conducted in a furnace having an oxygen-containing atmosphere at 750° C. for 10 minutes. With such a heat treatment process, the non-crystalline tantalum oxide is turned into poly-crystalline tantalum pentoxide by a solid state growth. Alternatively, an 800° C. 3-minute heat treatment may be used for the tantalum oxide film 55. The 750° C. 10-minute heat treatment provides an advantage of minimizing the influence on the memory cell selecting MISFETs and other devices, whereas the 800° C. 3-minute heat treatment is advantageous in that the crystals of the tantalum pentoxide film 56 show a small and uniform grain size.

The poly-crystalline tantalum pentoxide film 56 is turned into a capacitor insulator in a subsequent step and the use of poly-crystalline tantalum pentoxide for the capacitor insulator provides the advantage of a large dielectric constant of the capacitor insulator and a large storage capacitance of the information storage capacitors. While a technique of heat treating a tantalum oxide film in an oxidizing atmosphere for oxygen reform has been known, the tantalum oxide film obtained by means of such a technique shows a specific dielectric constant between 20 and 25 and an equivalent film thickness of 2.5 nm or more as expressed in terms of silicon oxide film. To the contrary, the tantalum pentoxide film of this embodiment shows a specific dielectric constant between 40 and 50 and an equivalent film thickness of about 1 nm as expressed in terms of silicon oxide film.

While the above process is conducted in an oxygen-containing atmosphere, or an oxidizing atmosphere, no insulator material having a low dielectric constant such as silicon oxide will be produced if oxygen passes through the tantalum oxide film 55 and gets to the surface of the lower electrodes during the heat treatment process because the lower electrodes 54 are made of ruthenium dioxide. As a result, the effective film thickness of the capacitor insulator does not increase and it is possible to maintain the high dielectric constant of the capacitor insulator.

Additionally, since a blocking layer 53 of titanium nitride film is provided in a manner as described above, no oxygen would pass through the tantalum oxide film 55 and the lower electrodes 54 to get to the plugs 49 during this heat treatment process nor the oxygen of the ruthenium dioxide of the lower electrodes 54 and the silicon of the plugs 49 would react with each other to produce silicon oxide film, which is an insulator material. Thus, the interconnection resistance of the plugs 49 and the lower electrodes 54 can be reduced to improve the performance of the information storage capacitors and also the reliability of the electric connection of the plugs 49 and the lower electrodes 54.

Figure 35:
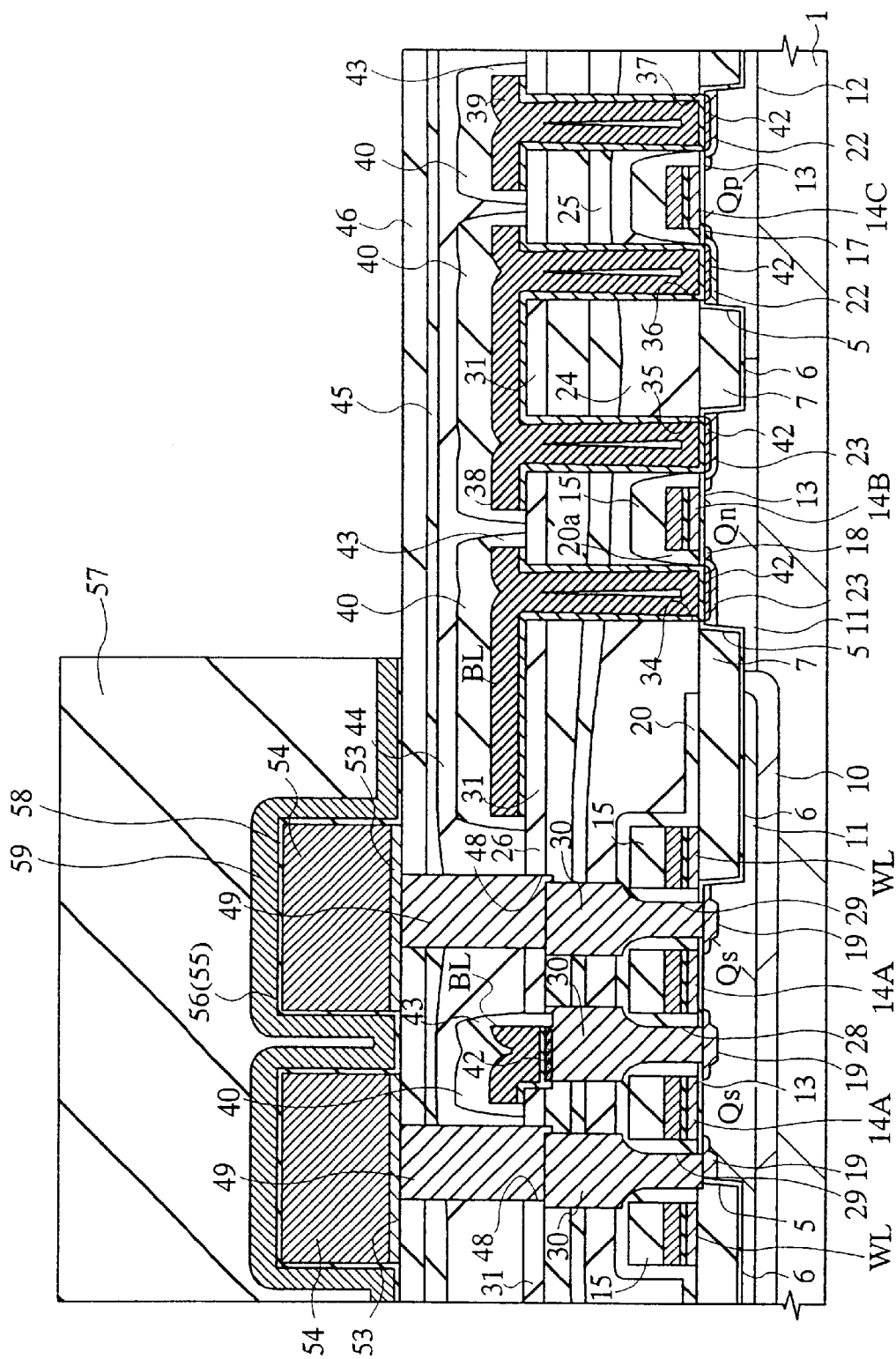
FIG. 35 is a schematic cross sectional view of the embodiment of DRAM of FIG. 1 in a still subsequent step of manufacturing it.

Then, a titanium nitride film is deposited on the tantalum pentoxide film 56 and a photoresist film 57 is formed on the titanium nitride film as shown in FIG. 35. Subsequently, the titanium nitride film and the tantalum pentoxide film 56 are etched, using the photoresist film 57 as mask, to produce capacitor insulator 58 and upper electrodes 59. A CVD technique may be used for depositing the titanium nitride film. Now, information storage capacitors C comprising lower electrodes 54 made of ruthenium dioxide, a capacitor insulator 58 made of poly-crystalline tantalum pentoxide and upper electrodes 59 made of titanium nitride are produced. The memory cells of a DRAM comprising memory cell selecting MISFETs Qs and information storage capacitors C connected to the respective MISFETs in series are now completed.

Figure 36:
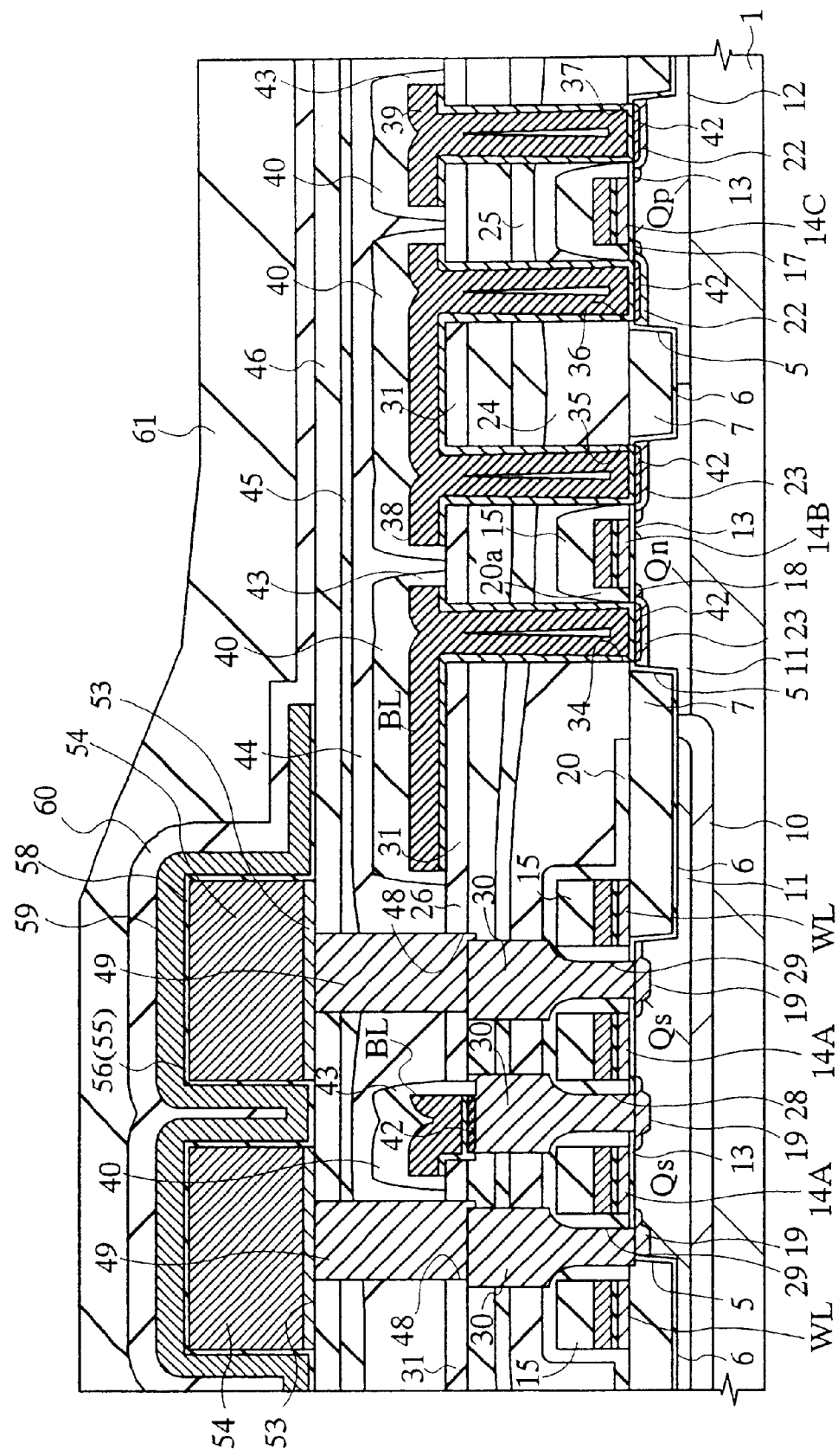
FIG. 36 is a schematic cross sectional view of the embodiment of DRAM of FIG. 1 in a still subsequent step of manufacturing it.

After removing the photoresist film 57, a silicon oxide film 60 is deposited on the information storage capacitors C to a film thickness of about 40 nm as shown in FIG. 36. More specifically, the silicon oxide film 60 is formed by plasma CVD, using a source gas of ozone ($O_3$) and tetraethoxysilane (TEOS). Then, the region where the memory cells are formed is planarized and the step with the peripheral circuit region is reduced by applying SOG to the surface thereof to produce an SOG film 61. Since the capacitor insulator 58 is made of tantalum pentoxide having a high dielectric constant in this embodiment of DRAM, the lower electrodes 54 do not have to have a particularly large height and, therefore, the step between the memory cell region and the peripheral circuit region can be reduced only by means of the SOG film 61. As a result, the entire manufacturing process can be simplified because no complex process is required to eliminate the above step.

Figure 37:
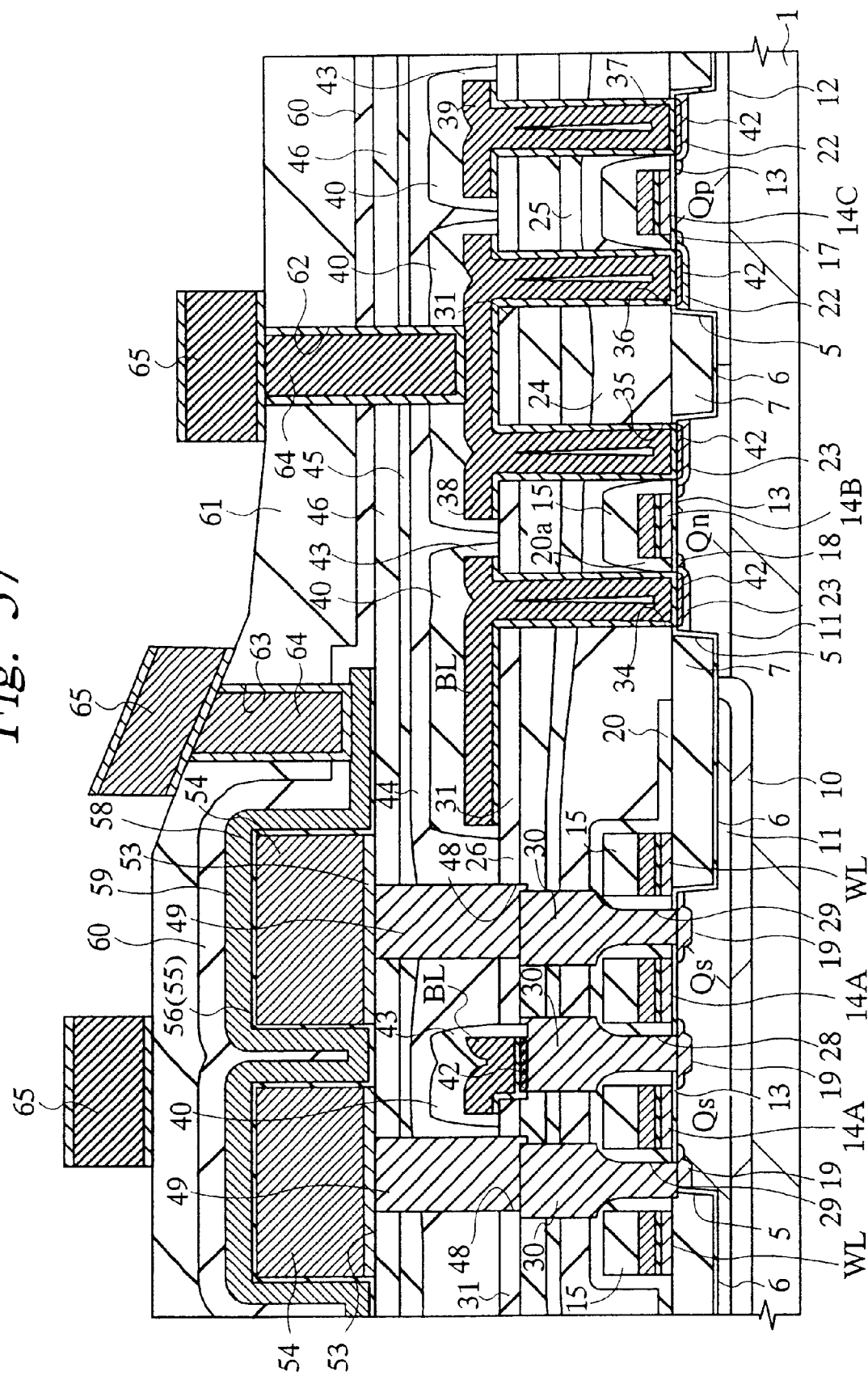
FIG. 37 is a schematic cross sectional view of the embodiment of DRAM of FIG. 1 in a still subsequent step of manufacturing it.

Then, as shown in FIG. 37, the SOG film 61, the silicon oxide film 60, the silicon oxide film 53, the silicon oxide film 46, the silicon oxide film 45, the SOG film 44 and the silicon nitride film 40 on the first layer wires 38 of the peripheral circuits are removed by dry etching, using a photoresist film as mask, to produce through holes 63. Similarly, the SOG film 61 and the silicon oxide film 60 on the upper electrodes 59 are removed to produce through holes 63. Thereafter, plugs 64 are formed in the through holes 62, 63 and subsequently second layer wires 65 are formed on the SOG film 61. More specifically, the plugs 64 are formed by depositing a TiN film on the SOG film 61 to a film thickness of about 100 nm by sputtering and then a W film thereon to a film thickness of about 500 nm by CVD and etching back the films except the inside of the through holes 62, 63. The second layer wires 65 are formed by sequentially depositing an about 50 nm thick TiN film, an about 500 nm thick aluminum film and an about 50 nm thick Ti film on the SOG film 61 by sputtering and subsequently patterning the films, using a photoresist film as mask.

Then, third layer wires are formed with an interlayer insulator disposed thereunder and a passivation film comprising silicon oxide film and silicon nitride film is deposited thereon, although not shown. With the above described steps, the embodiment of DRAM according to the invention is substantially completed.

The third layer wires and the plugs connected thereto may be formed at the same way as in the case of the second layer wires. The interlayer insulator may comprise an about 300 nm thick silicon oxide film, an about 400 nm thick SOG film and an about 300 nm thick silicon oxide film. The silicon oxide films may be formed by plasma CVD, using a source gas of ozone ($O_3$) and tetraethoxysilane (TEOS).

Figure 39:
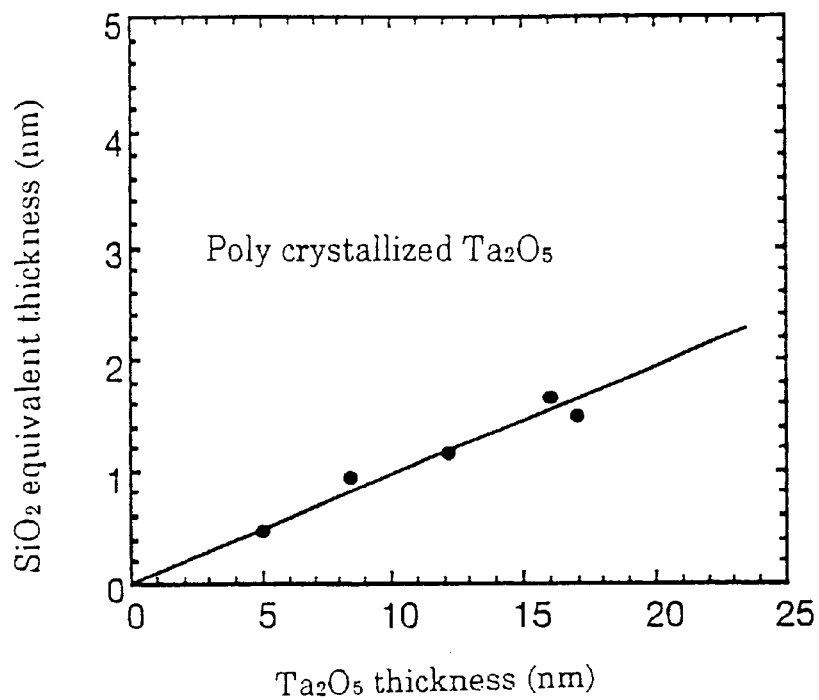
FIG. 39 is a graph showing the relationship between the film thickness of poly-crystalline tantalum pentoxide film and the equivalent thickness of silicon oxide film.
Figure 40:
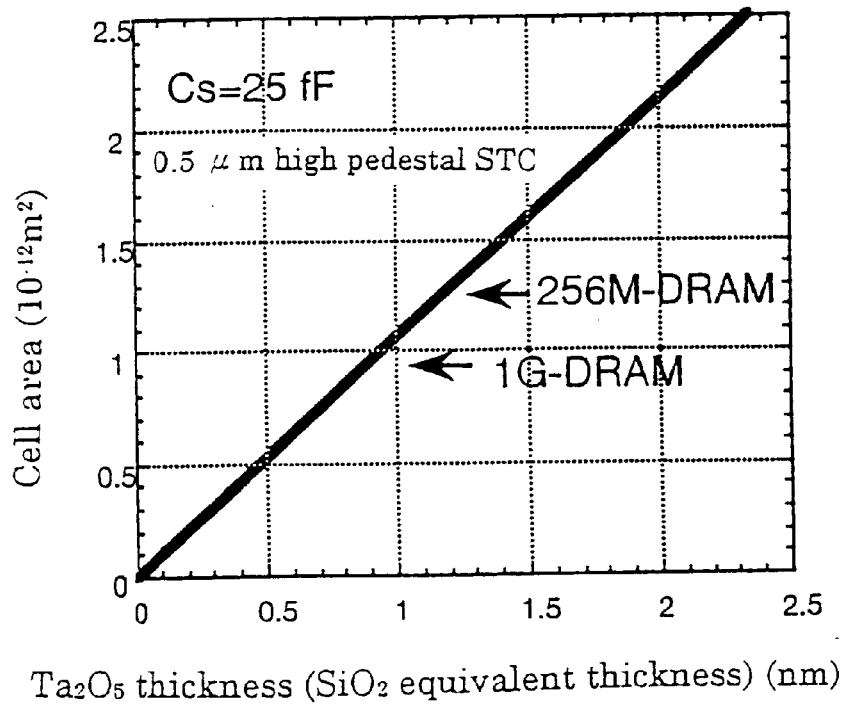
FIG. 40 is a graph showing the relationship between the film thickness of poly-crystalline tantalum pentoxide film and the cell area.

Thus, with this embodiment, the storage capacitance of the information storage capacitors C can be increased and hence a 256 Mbits DRAM or a DRAM of a later generation can be manufactured with ease when the lower electrodes 54 are made of ruthenium dioxide and the capacitor insulator 58 is made of tantalum pentoxide. FIG. 39 is a graph showing the relationship between the film thickness of poly-crystalline film of the capacitor insulator 58 and the equivalent film thickness of silicon oxide film. FIG. 40 is a graph showing the relationship between the film thickness of tantalum pentoxide film and the cell area when the lower electrodes 54 has a height of 0.5 $\mu$m and the storage capacitance (Cs) is 25 fF. As seen from FIG. 40, the equivalent film thickness of silicon oxide film required to a 256 Mbits DRAM under the above condition is about 1.15 nm and the one required to a 1 Gbits DRAM is about 0.85 nm. On the other hand, the corresponding equivalent film thickness of capacitor insulator 58 of this embodiment comprising a poly-crystalline tantalum pentoxide film are 12 nm and 8 nm respectively and hence it is clear that the present invention is well adapted to 256 Mbits DRAMs and DRAMs of later generations. Note that the capacitor insulator 58 can be made to show a film thickness as large as about 15 nm by regulating the height of the lower electrodes 54 and/or optimizing the required storage capacitance, whereas it can be made to show a thickness as small as about 5 nm if it maintains the level of insulation required to it.

While the ruthenium dioxide film 51 of the lower electrodes 54 is deposited by sputtering, using a target of ruthenium dioxide, in the above description, it may alternatively be formed by reactive sputtering, using oxygen and a target of metal ruthenium. If such is the case, a ruthenium dioxide film 51 having a plane surface can be produced as in the case of the above described embodiment.

Still alternatively, the ruthenium dioxide film 51 may be deposited by CVD, using a source gas containing organic ruthenium gas and oxygen gas. The organic ruthenium gas may suitably be trisdipivaloylmethanatoruthenium (Ru(($CH_3$)$_3$CCOCHCOC($CH_3$)$_3$)$_3$). Otherwise, the deposition can be conducted with a reaction temperature of 600° C., a reaction pressure of 10 Torr, an oxygen flow rate of 1 slm and an argon flow rate of 0.3 slm.

While the upper electrodes 59 are made of titanium nitride film in the above embodiment, they may alternatively be made of ruthenium, ruthenium oxide, tungsten or tungsten nitride. Ruthenium and tungsten are less apt to be oxidized than tantalum and hence they would scarcely draw oxygen from the tantalum pentoxide film of the capacitor insulator 58. On the other hand, titanium is more apt to be oxidized than tantalum and can draw more oxygen from the tantalum pentoxide film of the capacitor insulator 58. In other words, a film of ruthenium, ruthenium oxide, tungsten or tungsten nitride arranged in contact with the tantalum pentoxide film will be thermally more stable than a titanium nitride film held in contact with the tantalum pentoxide film. However, in view of the fact that the upper electrodes 59 are arranged on the finely machined lower electrodes 54, the use of titanium nitride film that can be formed by CVD will be advantageous in terms of step coverage. Additionally, the internal stress of the deposited film coat can be regulated by regulating the conditions under which a titanium nitride film is formed by CVD, e.g., the film forming temperature so that the stress of the upper electrodes 59 can be reduced by forming a titanium nitride film by CVD to consequently reduce the stress of the capacitor insulator 58 and also the leak current of the information storage capacitors C. Thus, the upper electrodes 59 may be made of a multilayer film comprising a first film coat layer of ruthenium, ruthenium oxide, tungsten or tungsten nitride arranged in contact with the capacitor insulator 58 of tantalum pentoxide film and a second layer of titanium nitride formed by CVD. Such upper electrodes 59 may be thermally stable and provide an excellent step coverage for the underlying layer having a complex profile. Thus, it is now possible to reduce the stress of the capacitor insulator 58 and the leak current of the information storage capacitors C by reducing the stress of the upper electrodes 59 in order to improve the performance and the reliability of the information storage capacitors C.

2nd Embodiment

FIGS. 42 through 45 are schematic cross sectional views of another embodiment of DRAM according to the invention in different manufacturing steps.

This second embodiment of DRAM has a configuration similar to that of the above described first embodiment of DRAM, the difference being that the plugs 49 of poly-crystalline silicon film of the first embodiment are replaced by plugs 66 of ruthenium oxide. All the other components of the DRAM are identical with their counterparts of the first embodiment and hence will not be described here any further.

The second embodiment of DRAM is manufactured in a manner as described below. Note that the steps from FIG. 1 through FIG. 30 of the process of manufacturing the first embodiment are also applicable to the process of manufacturing the second embodiment.

After forming through holes 48 as shown in FIG. 30 for the first embodiment, plugs 66 of ruthenium oxide are formed inside the through holes 48. More specifically, the plugs 66 are formed by depositing a ruthenium oxide film by sputtering, using ruthenium oxide as starting material, and subsequently etching back the film so that the ruthenium oxide is left only in the through holes 48.

Additionally, a titanium nitride film may be deposited as blocking layer before depositing the ruthenium oxide film.

Figure 43:
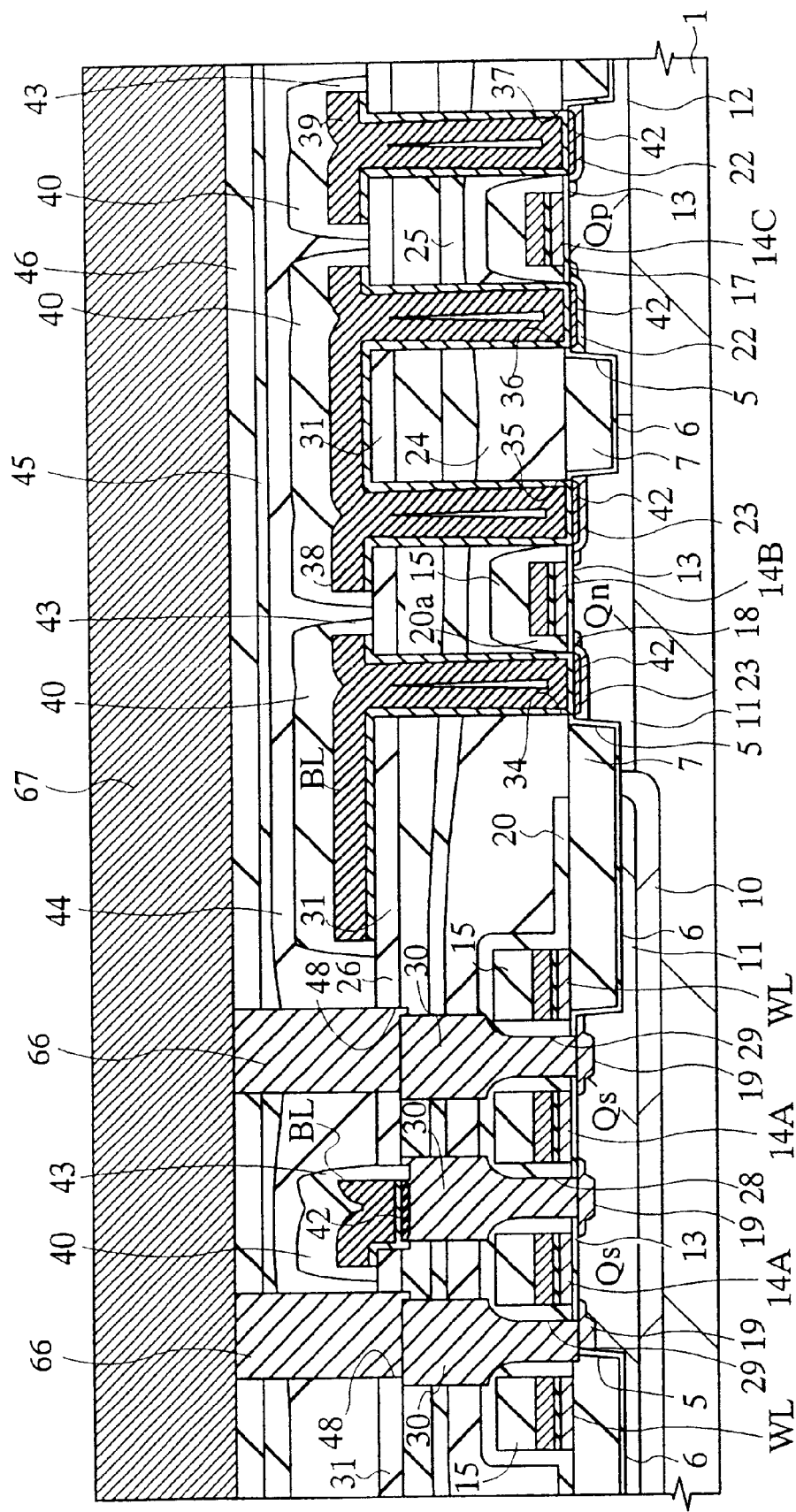
FIG. 43 is a schematic cross sectional view of the embodiment of DRAM of FIG. 42 in a subsequent step of manufacturing it.

Then, as shown in FIG. 43, a ruthenium dioxide (RuO$_2$) film 67 is formed on the silicon oxide film 46 where the plugs 66 are produced. The ruthenium dioxide film 67 may be formed by deposition just like the ruthenium dioxide film 51 of the first embodiment.

It will be appreciated that the use of blocking layer is not necessary because the plugs 66 are made of ruthenium oxide.

Figure 44:
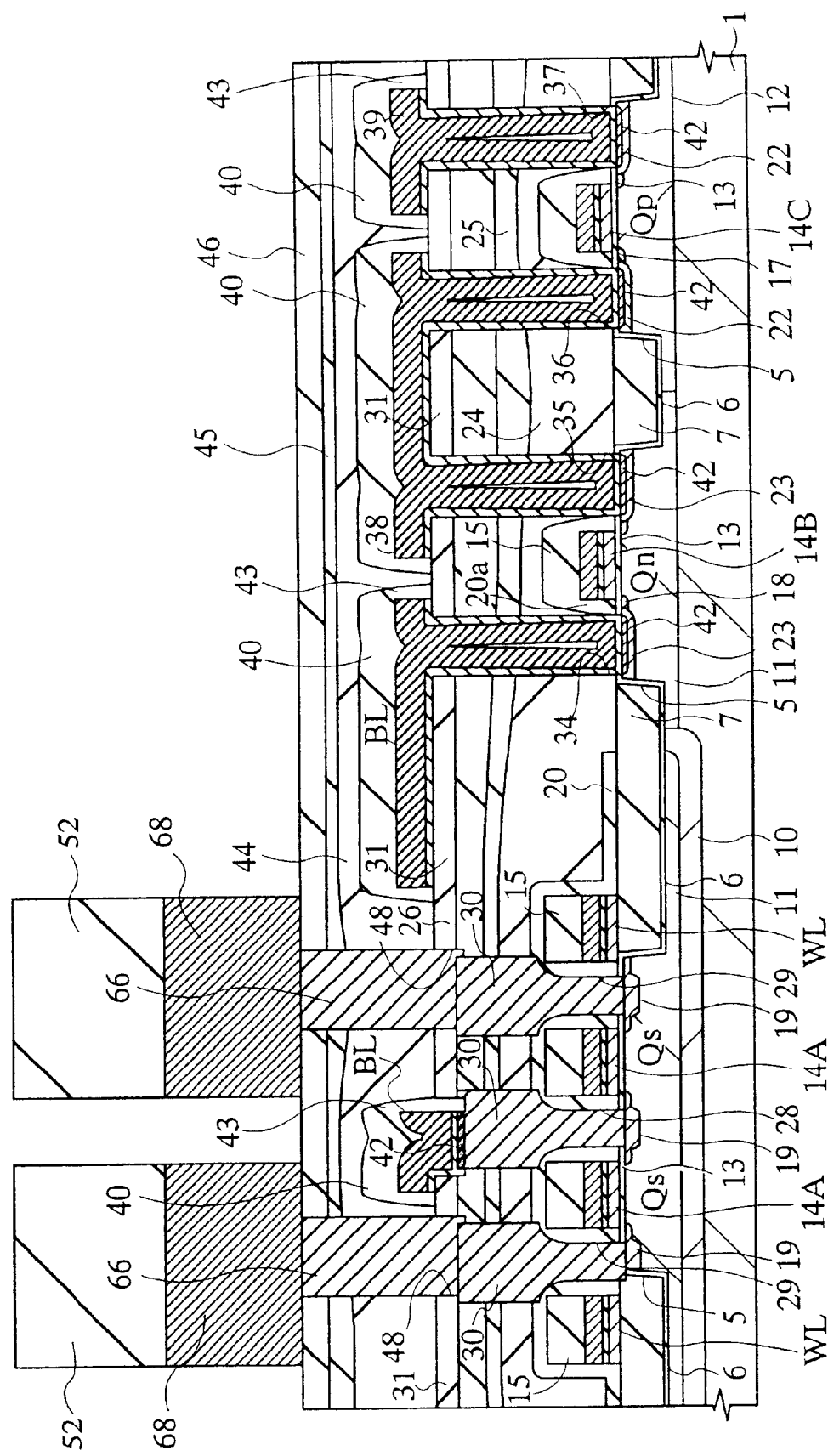
FIG. 44 is a schematic cross sectional view of the embodiment of DRAM of FIG. 42 in a still subsequent step of manufacturing it.

Then, as in the case of the first embodiment, a photoresist film 52 is formed as seen from FIG. 44 and the ruthenium dioxide film 67 is removed by etching it typically by means of RIE (reactive ion etching), using the photoresist film 52 as mask, to produce lower electrodes 68 out of the ruthenium dioxide film 67.

Figure 45:
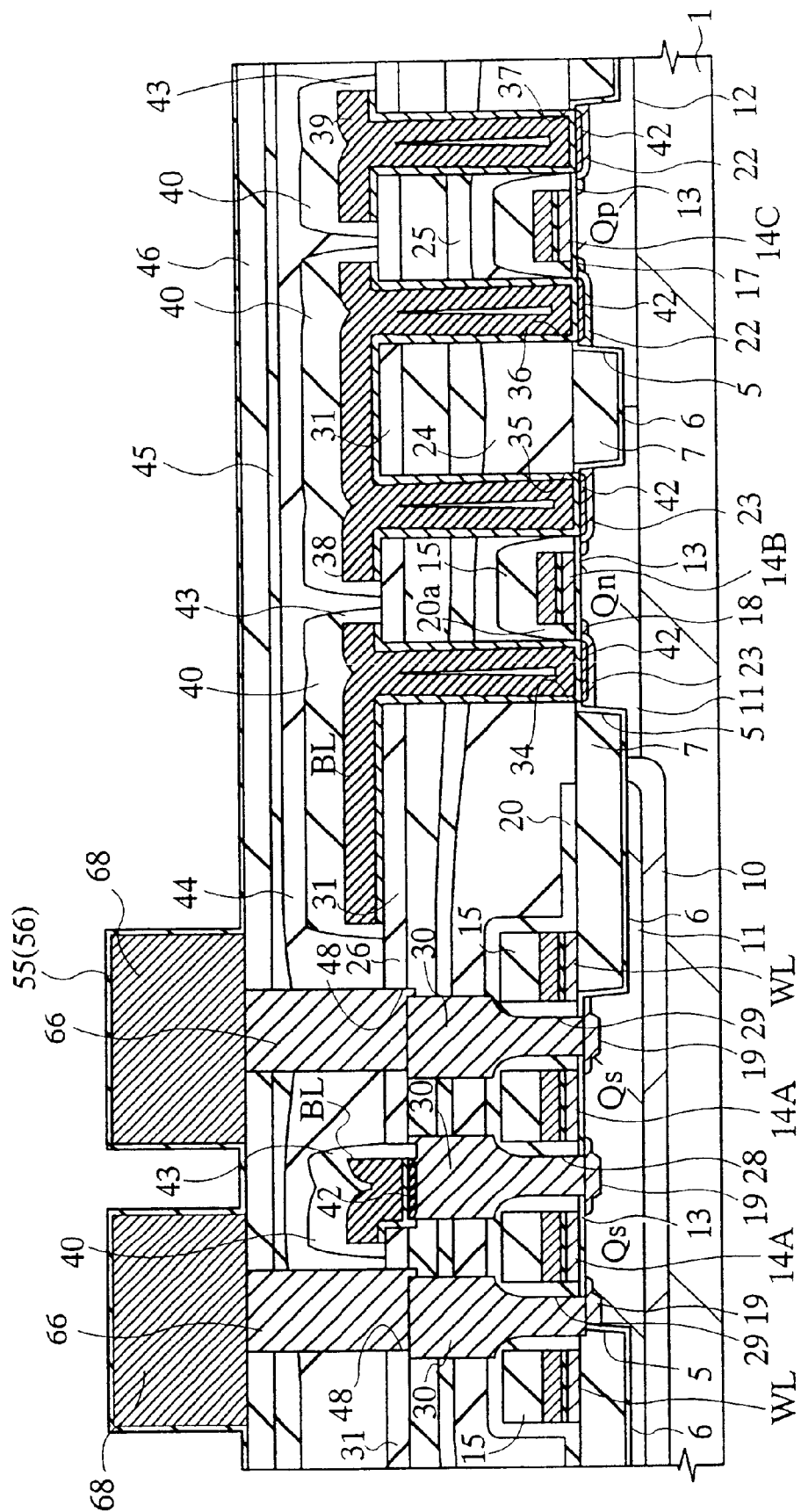
FIG. 45 is a schematic cross sectional view of the embodiment of DRAM of FIG. 42 in a still subsequent step of manufacturing it.

After removing the photoresist film 52 as in the case of the first embodiment, a tantalum oxide film 55 is deposited on the entire surface of the semiconductor substrate 1 to a film thickness of about 10 nm as shown in FIG. 45. Then, the tantalum oxide film 55 is heat treated to produce a poly-crystalline tantalum pentoxide film 56 out of it.

All the subsequent manufacturing steps are identical with their counterparts of the first embodiment and hence will not be described here any further.

Thus, since the plugs 66 of the second embodiment are made of ruthenium oxide, no blocking layer has to be arranged on the interface between the plugs 66 and the lower electrodes 68 so that the information storage capacitors C show a low interconnection resistance and an enhanced level of reliability.

3rd Embodiment

Figure 46:
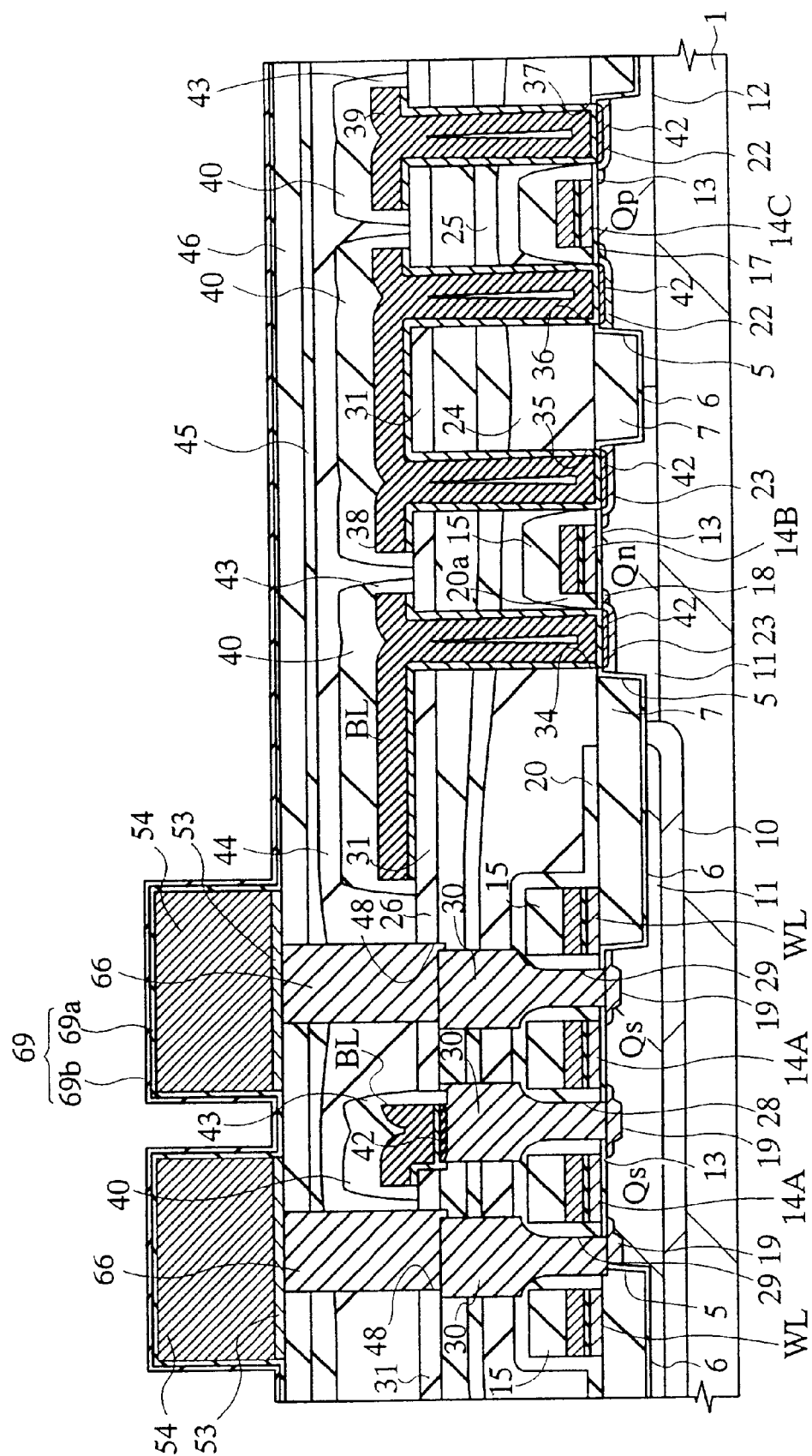
FIG. 46 is a schematic cross sectional view of the still another embodiment of DRAM according to the invention in a step of manufacturing it.
Figure 47:
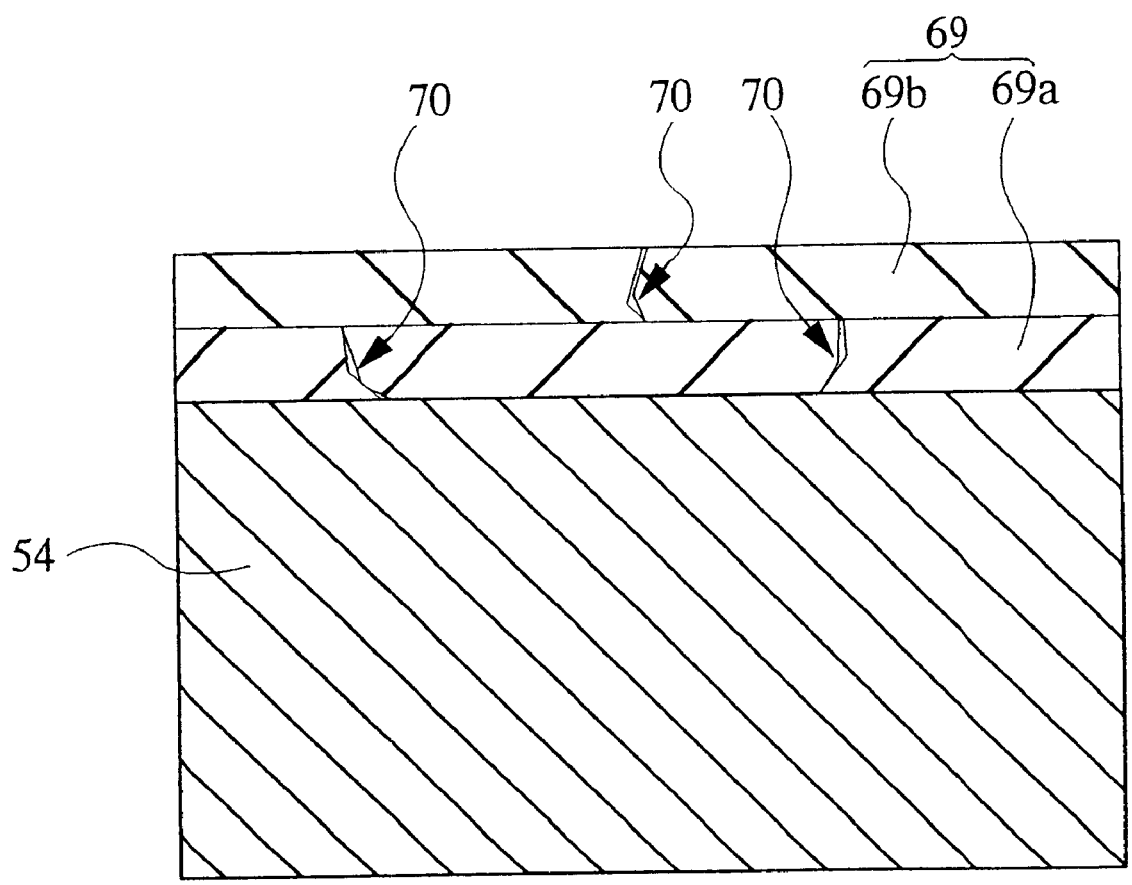
FIG. 47 is a schematic cross sectional view of the embodiment of DRAM of FIG. 46 in a subsequent step of manufacturing it.

FIGS. 46 and 47 are schematic cross sectional views of still another embodiment of DRAM according to the invention in different manufacturing steps.

This third embodiment of DRAM has a configuration similar to that of the above described first embodiment of DRAM, the difference being that the capacitor insulator 69 of the information storage capacitors C have a two-layered structure of a lower insulator film 69a and an upper insulator film 69b. All the other components of the DRAM are identical with their counterparts of the first embodiment and hence will not be described here any further.

The third embodiment of DRAM is manufactured in a manner as described below. Note that the steps from FIG. 1 through FIG. 33 of the process of manufacturing the first embodiment are also applicable to the process of manufacturing the third embodiment.

After forming the lower electrodes 54, the lower insulator film 69a and the upper insulator film 69b are sequentially formed as shown in FIG. 46. The lower insulator film 69a is formed exactly same as the tantalum pentoxide film 56 of the first embodiment. More specifically, an amorphous tantalum oxide film is firstly deposited by CVD and thereafter the film deposit is heat treated in an oxygen-containing atmosphere to turn it into a poly-crystalline film.

Then, also an amorphous tantalum oxide film is deposited by CVD and thereafter the film deposit is heat treated in an oxygen-containing atmosphere to turn it into a poly-crystalline film and produce an upper insulator film 69b of poly-crystalline tantalum pentoxide as in the case of the lower insulator film 69a.

As shown in FIG. 47, the two-layered capacitor insulator film 69 prepared in the above described manner shows grain boundaries 70 in both the lower insulator film 69a and the upper insulator film 69b but the grain boundaries 70 of the lower insulator film 69a are located apart from those of the upper insulator film 69b.

All the subsequent manufacturing steps are identical with their counterparts of the first embodiment and hence will not be described here any further.

A capacitor insulator 69 having the above described configuration can effectively reduce the leak current of the information storage capacitors C. Generally speaking, the dielectric withstand voltage of a poly-crystalline film is most weak at the grain boundaries and hence it may be safe to assume that leak current can occur at the grain boundaries of a capacitor insulator of poly-crystalline tantalum pentoxide film. However, since grain boundaries do not transversally run through the capacitor insulator in this third embodiment, any leak currents that may occur at the grain boundaries of the lower insulator film 69a can be effectively blocked by the upper insulator film 69b. Likewise, any leak currents that may occur at the grain boundaries of the upper insulator film 69b can be effectively blocked by the lower insulator film 69a.

The capacitor insulator 69 may preferably have a total film thickness between 5 nm and 15 nm including the film thickness of the lower insulator film 69a and that of the upper insulator film 69b.

While the present invention is described above in terms of preferred embodiments, the present invention is by no means limited to the described embodiments, which may be modified in various different ways without departing from the spirit and the scope of the invention.

For instance, the materials that can be used for the upper electrodes 59 are not limited to those listed above and poly-crystalline silicon film may also be used for them. Other materials that can be used for the upper electrodes include refractory metals other than titanium, tungsten and ruthenium such as tantalum, niobium, molybdenum, chromium, iridium, nickel, palladium and platinum as well as oxides and nitrides of the above listed metals so long as such oxides and nitrides are electrically conductive.

Some of the most remarkable advantages of the present invention will be summarily listed below.

(1) A storage capacitance required for the capacitors of the memory cells of a 256 Mbits DRAM or a DRAM of a later generation can be provided.

(2) The effective dielectric constant of the capacitor insulator of the information storage capacitors is not reduced nor its effective film thickness is raised if tantalum oxide is used for the capacitor insulator and heat treated in an oxygen-containing atmosphere.

(3) The surface of the lower electrodes of the information storage capacitors can be planarized to improve the reliability of the information storage capacitors.

(4) The lower electrodes can be made to show a simple profile and the process of preparing it can be simplified.

(5) The insulating performance of the capacitor insulator of the information storage capacitors can be improved to reduce the leak current and hence improve the performance and the reliability of the information storage capacitors.

(6) The material of the upper electrodes of the information storage capacitors can be optimized to further improve the reliability of the information storage capacitors.

(7) The storage capacitance of the information storage capacitors can be raised and the refresh margin of the DRAM can be improved to reduce the operating voltage and the power consumption rate of the semiconductor integrated circuit device.

What is claimed is:

1. A method of manufacturing a semiconductor integrated circuit device including a memory cell comprising a memory cell selecting MISFET formed on the main surface of a semiconductor substrate and an information storage capacitor that is connected in series to said memory cell selecting MISFET, said information storage capacitor having a lower electrode, a first and second capacitor insulator and an upper electrode, wherein said method comprises:

(a) forming memory cell selecting MISFETs and bit lines, subsequently depositing ruthenium dioxide ($RuO_2$) on an interlayer insulator covering the bit lines, to form a ruthenium dioxide film layer, and then patterning the ruthenium dioxide film layer to produce the lower electrode;

(b) depositing a first non-crystalline tantalum oxide on the lower electrode, subsequently crystallizing the first non-crystalline tantalum oxide by heat treatment and forming the first capacitor insulator from crystallized tantalum pentoxide ($Ta_2O_5$); and (c) depositing a second non-crystalline tantalum oxide on the first capacitor insulator, subsequently crystallizing the second tantalum oxide by heat treatment and forming the second capacitor insulator from crystallized tantalum pentoxide ($Ta_2O_5$) on the first capacitor insulator.

2. A method of manufacturing a semiconductor integrated circuit device according to claim 1, wherein said deposition of ruthenium dioxide is performed by sputtering, using ruthenium dioxide ($RuO_2$) as target material.

3. A method of manufacturing a semiconductor integrated circuit device according to claim 2, wherein said first and second tantalum oxide is formed by thermal chemical vapor deposition, using a source gas containing pentaalkyltantalum ($Ta(C_nH_{2n+1})_5$) and oxygen ($O_2$) under low pressure at a temperature below 500°.

4. A method of manufacturing a semiconductor integrated circuit device according to claim 2, wherein said heat treatment of the first and second tantalum oxide is performed in an oxidizing atmosphere at 750° C. for 10 minutes.

5. A method of manufacturing a semiconductor integrated circuit device according to claim 2, wherein said heat treatment of the first and second tantalum oxide is performed in an oxidizing atmosphere at 800° C. for 3 minutes.

6. A method of manufacturing a semiconductor integrated circuit device according to claim 1, wherein said deposition of ruthenium dioxide is performed by reactive sputtering, using ruthenium (Ru) as target material and oxygen-containing gas.

7. A method of manufacturing a semiconductor integrated circuit device according to claim 6, wherein said first and second tantalum oxide is formed by thermal chemical vapor deposition, using a source gas containing pentaalkyltantalum ($Ta(C_nH_{2n+1})_5$) and oxygen ($O_2$) under low pressure at a temperature below 500° C.

8. A method of manufacturing a semiconductor integrated circuit device according to claim 6, wherein said heat treatment of the first and second tantalum oxide is performed in an oxidizing atmosphere at 750° C. for 10 minutes.

9. A method of manufacturing a semiconductor integrated circuit device according to claim 6, wherein said heat treatment of the first and second tantalum oxide is performed in an oxidizing atmosphere at 800° C. for 3 minutes.

10. A method of manufacturing a semiconductor integrated circuit device according to claim 1, wherein said deposition of ruthenium dioxide is performed by chemical vapor deposition, using a source gas containing organic ruthenium gas and oxygen.

11. A method of manufacturing a semiconductor integrated circuit device according to claim 10, where said organic ruthenium gas includes trisdipivaloylmethanatoruthenium ($Ru((CH_3)_3CCOCHCOC(CH_3)_3)_3$).

12. A method of manufacturing a semiconductor integrated circuit device according to claim 11, wherein said first and second tantalum oxide is formed by thermal chemical vapor deposition, using a source gas containing pentaalkyltantalum ($Ta(C_nH_{2n+1})_5$) and oxygen ($O_2$), under low pressure at a temperature below 500° C.

13. A method of manufacturing a semiconductor integrated circuit device according to claim 11, wherein said heat treatment of the first and second tantalum oxide is performed in an oxidizing atmosphere at 750° C. for 10 minutes.

14. A method of manufacturing a semiconductor integrated circuit device according to claim 11, wherein said heat treatment of the first and second tantalum oxide is performed in an oxidizing atmosphere at 800° C. for 3 minutes.

15. A method of manufacturing a semiconductor integrated circuit device according to claim 10, wherein said first and second tantalum oxide is formed by thermal chemical vapor deposition, using a source gas containing pentaalkyltantalum ($Ta(C_nH_{2n+1})_5$) and oxygen ($O_2$) under low pressure at a temperature below 500° C.

16. A method of manufacturing a semiconductor integrated circuit device according to claim 10, wherein said heat treatment of the first and second tantalum Oxide is performed in an oxidizing atmosphere at 750° C. for 10 minutes.

17. A method of manufacturing a semiconductor integrated circuit device according to claim 10, wherein said heat treatment of the first and second tantalum oxide is performed in an oxidizing atmosphere at 800° C. for 3 minutes.

18. A method of manufacturing a semiconductor integrated circuit device according to claim 1, wherein said first and second tantalum oxide is formed by thermal chemical vapor deposition, using a source gas containing pentaalkyltantalum ($Ta(C_nH_{2n+1})_5$) and oxygen ($O_2$) under low pressure at a temperature below 500° C.

19. A method of manufacturing a semiconductor integrated circuit device according to claim 18, wherein said heat treatment of the first and second tantalum oxide is performed in an oxidizing atmosphere at 750° C. for 10 minutes.

20. A method of manufacturing a semiconductor integrated circuit device according to claim 18, wherein said heat treatment of the first and second tantalum oxide is performed in an oxidizing atmosphere at 800° C. for 3 minutes.

21. A method of manufacturing a semiconductor integrated circuit device according to claim 1, wherein said heat treatment of the first and second tantalum oxide is performed in an oxidizing atmosphere at 750° C. for 10 minutes.

22. A method of manufacturing a semiconductor integrated circuit device according to claim 1, wherein said heat treatment of the first and second tantalum oxide is performed in an oxidizing atmosphere at 800° C. for 3 minutes.

23. A method of manufacturing a semiconductor integrated circuit device including a memory cell comprising a memory cell selecting MISFET formed on the main surface of a semiconductor substrate and a storage capacitor that is connected in series to said memory cell selecting MISFET, said storage capacitor having a lower electrode, a first and second capacitor insulator and an upper electrode, wherein said method comprises:

(a) forming memory cell selecting MISFETs and bit lines, subsequently forming the lower electrode dioxide (RuO$_2$) on an interlayer insulator covering the bit lines;

(b) depositing a first non-crystalline tantalum oxide on the lower electrode, subsequently crystallizing the first non-crystalline tantalum oxide by heat treatment and forming the first capacitor insulator from crystallized tantalum pentoxide (Ta$_2$O$_5$);

(c) depositing a second non-crystalline tantalum oxide on the first capacitor insulator, subsequently crystallizing the second non-crystalline tantalum oxide by heat treatment and forming the second capacitor insulator from crystallized tantalum pentoxide (Ta$_2$O$_5$) on the first capacitor insulator, and (d) forming a single layer film or a multilayer film of a material selected from the group consisting of titanium nitride (TiN), ruthenium (Ru), ruthenium dioxide (RuO$_2$), tungsten (W) and tungsten nitride (WN) by deposition and patterning the single layer film or the multilayer film to produce the upper electrode.

24. A method of manufacturing a semiconductor integrated circuit device according to claim 23, wherein said upper electrode is formed by depositing tungsten on the second capacitor insulator and subsequently depositing titanium nitride on the tungsten.

25. A method of manufacturing a semiconductor integrated circuit device according to claim 23, wherein said upper electrode is formed by depositing tungsten nitride on the second capacitor insulator and subsequently depositing titanium nitride on the tungsten nitride.

26. A method of manufacturing a semiconductor integrated circuit device according to claim 23, wherein said upper electrode is formed by depositing ruthenium dioxide on the second capacitor insulator and subsequently depositing titanium nitride on the ruthenium dioxide.

27. A method of manufacturing a semiconductor integrated circuit device according to claim 23, wherein said heat treatment of the first and second tantalum oxide is performed in an oxidizing atmosphere at 750° C. for 10 minutes.

28. A method of manufacturing a semiconductor integrated circuit device according to claim 23, wherein said heat treatment of the first and second tantalum oxide is performed in an oxidizing atmosphere at 800° C. for 3 minutes.

29. A method of manufacturing a semiconductor integrated circuit device according to claim 23, wherein said heat treatment of the first tantalum oxide is performed in an oxidizing atmosphere at 800° C. for 3 minutes and heat treatment of the second tantalum oxide is performed in an oxidizing atmosphere at 750° C. for 10 minutes.

30. A method of manufacturing a semiconductor integrated circuit device according to claim 23, wherein said heat treatment of the first tantalum oxide is performed in an oxidizing atmosphere at 750° C. for 10 minutes and heat treatment of the second tantalum oxide is performed in an oxidizing atmosphere at 800° C. for 3 minutes.

* * * * *